(12) United States Patent
Kim et al.

(10) Patent No.: US 12,309,923 B2
(45) Date of Patent: May 20, 2025

(54) PRINTED CIRCUIT BOARD AND METHOD FOR MANUFACTURING THE SAME

(71) Applicant: SAMSUNG ELECTRO-MECHANICS CO., LTD., Suwon-si (KR)

(72) Inventors: Sang Hoon Kim, Suwon-si (KR); Young Kuk Ko, Suwon-si (KR); Gyu Mook Kim, Suwon-si (KR); Hea Sung Kim, Suwon-si (KR); Chi Won Hwang, Suwon-si (KR); Suk Chang Hong, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 405 days.

(21) Appl. No.: 17/740,781

(22) Filed: May 10, 2022

(65) Prior Publication Data

US 2023/0199956 A1  Jun. 22, 2023

(30) Foreign Application Priority Data

Dec. 22, 2021 (KR) ........................ 10-2021-0184734

(51) Int. Cl.
| H05K 1/02 | (2006.01) |
| H05K 1/11 | (2006.01) |
| H05K 1/18 | (2006.01) |
| H05K 3/30 | (2006.01) |

(52) U.S. Cl.
CPC ............ *H05K 1/115* (2013.01); *H05K 1/0298* (2013.01); *H05K 1/188* (2013.01); *H05K 3/30* (2013.01); *H05K 2201/10734* (2013.01)

(58) Field of Classification Search
CPC ....... H05K 1/115; H05K 1/0298; H05K 1/188; H05K 3/30; H05K 2201/10734
See application file for complete search history.

(56) References Cited

U.S. PATENT DOCUMENTS

| 10,849,225 B1 | 11/2020 | Ko et al. | |
| 2018/0076103 A1* | 3/2018 | Jeon | H01L 23/5385 |
| 2019/0013263 A1* | 1/2019 | Kyozuka | H01L 23/49816 |
| 2019/0096839 A1* | 3/2019 | Lin | H01L 24/14 |
| 2021/0125933 A1 | 4/2021 | Chen et al. | |
| 2021/0135159 A1* | 5/2021 | Senoo | H05B 33/02 |
| 2024/0138077 A1* | 4/2024 | Shin | H05K 3/4688 |

FOREIGN PATENT DOCUMENTS

| KR | 10-2020-0144358 A | 12/2020 |
| KR | 10-2021-0053233 A | 5/2021 |

* cited by examiner

*Primary Examiner* — Hoa C Nguyen
(74) *Attorney, Agent, or Firm* — Morgan Lewis & Bockius LLP

(57) ABSTRACT

A printed circuit board includes: an insulating member; a first bump disposed on the insulating member; a second bump disposed adjacently to but spaced apart from the first bump on the insulating member; a first insulating wall covering at least a portion of the first bump; and a second insulating wall covering at least a portion of the second bump and disposed adjacently to but spaced apart from the first insulating wall.

35 Claims, 55 Drawing Sheets

PRINTED CIRCUIT BOARD AND METHOD FOR MANUFACTURING THE SAME

CROSS-REFERENCE TO RELATED APPLICATION(S)

This application claims benefit of priority to Korean Patent Application No. 10-2021-0184734 filed on Dec. 22, 2021 in the Korean Intellectual Property Office, the disclosure of which is incorporated herein by reference in its entirety.

TECHNICAL FIELD

The present disclosure relates to a printed circuit board, for example, a printed circuit board that is usable as an interposer substrate and/or a package substrate of a package structure.

BACKGROUND

A high-performance mobile application processor package may have a structure in which a semiconductor chip is mounted on a package substrate, and interposer substrates are attached to upper and lower sides of the package substrate. Meanwhile, in accordance with the trend for thickness reductions of package structures, substrates have increasingly been thinner. Accordingly, risks in handling the interposer substrate during a substrate manufacturing process and a package assembly process have increased. In addition, the package substrate and the interposer substrate may be connected to each other using solder balls or the like, and a pitch of the solder balls has been increasingly finer. As a distance between the two substrates increases, it is more difficult to achieve a fine pitch.

SUMMARY

An aspect of the present disclosure may provide a printed circuit board for increasing a depth of a cavity to reduce a pitch of connection conductors between substrates.

Another aspect of the present disclosure may provide a printed circuit board for maintaining a pitch of connection conductors even when a thickness of a mounted electronic component increases.

Another aspect of the present disclosure may provide a printed circuit board for reducing a risk of warpage even though a depth of a cavity increases.

Another aspect of the present disclosure may provide a printed circuit board for improving flowability when a molding material is injected between substrates.

One of several solutions suggested through the present disclosure is to introduce a substrate including a plurality of bumps and a plurality of insulating walls covering the plurality of bumps on the uppermost or lowermost side region thereof, the plurality of insulating walls being spaced apart from each other.

According to an aspect of the present disclosure, a printed circuit board may include: an insulating member including a cavity; a first bump disposed on the insulating member; a second bump disposed adjacently to but spaced apart from the first bump on the insulating member; a first insulating wall covering at least a portion of the first bump; and a second insulating wall covering at least a portion of the second bump and disposed adjacently to but spaced apart from the first insulating wall. The printed circuit board may include a center region in which the cavity is disposed and a side region surrounding the center region in plan view. The first and second bumps and the first and second insulating walls may be disposed in the side region.

According to another aspect of the present disclosure, a printed circuit board may include: an insulating member; a plurality of bumps spaced apart from each other on the insulating member; and a plurality of insulating walls spaced apart from each other on the insulating member. Each of the plurality of insulating walls may surround each of the plurality of bumps in a one-to-one manner.

According to another aspect of the present disclosure, a printed circuit board may include: an insulating member; a plurality of bumps spaced apart from each other on the insulating member; and a plurality of insulating walls spaced apart from each other on the insulating member. Each of the plurality of insulating walls may surround at least two of the plurality of bumps.

According to another aspect of the present disclosure, a printed circuit board may include: an insulating member; a plurality of first insulating wall protruding from the insulating member and spaced apart from each other, a space provided between adjacent two of the plurality of first insulating walls and extending from an outer edge of the insulating member towards an inner portion of the insulating member; one or more first bumps disposed in one or more of the plurality of first insulating walls; an electronic component disposed on the inner portion of the insulating member; and a molding material covering at least a portion of the electronic component and disposed in the space provided between the adjacent two of the plurality of first insulating walls.

According to another aspect of the present disclosure, a method for manufacturing a printed circuit board may include: forming a plurality of bumps on an insulating member; forming a plurality of insulating walls spaced apart from each other on the insulating member, one or more of the plurality of bumps being surrounded by a respective one of the plurality of insulating walls; and forming a cavity in an inner portion of the insulating member surrounded by the plurality of insulating walls.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

In the present disclosure, a first direction may refer to a stacking direction or a thickness direction, a second direction may refer to a length direction, and a third direction may refer to a width direction.

Electronic Device

Figure 1:
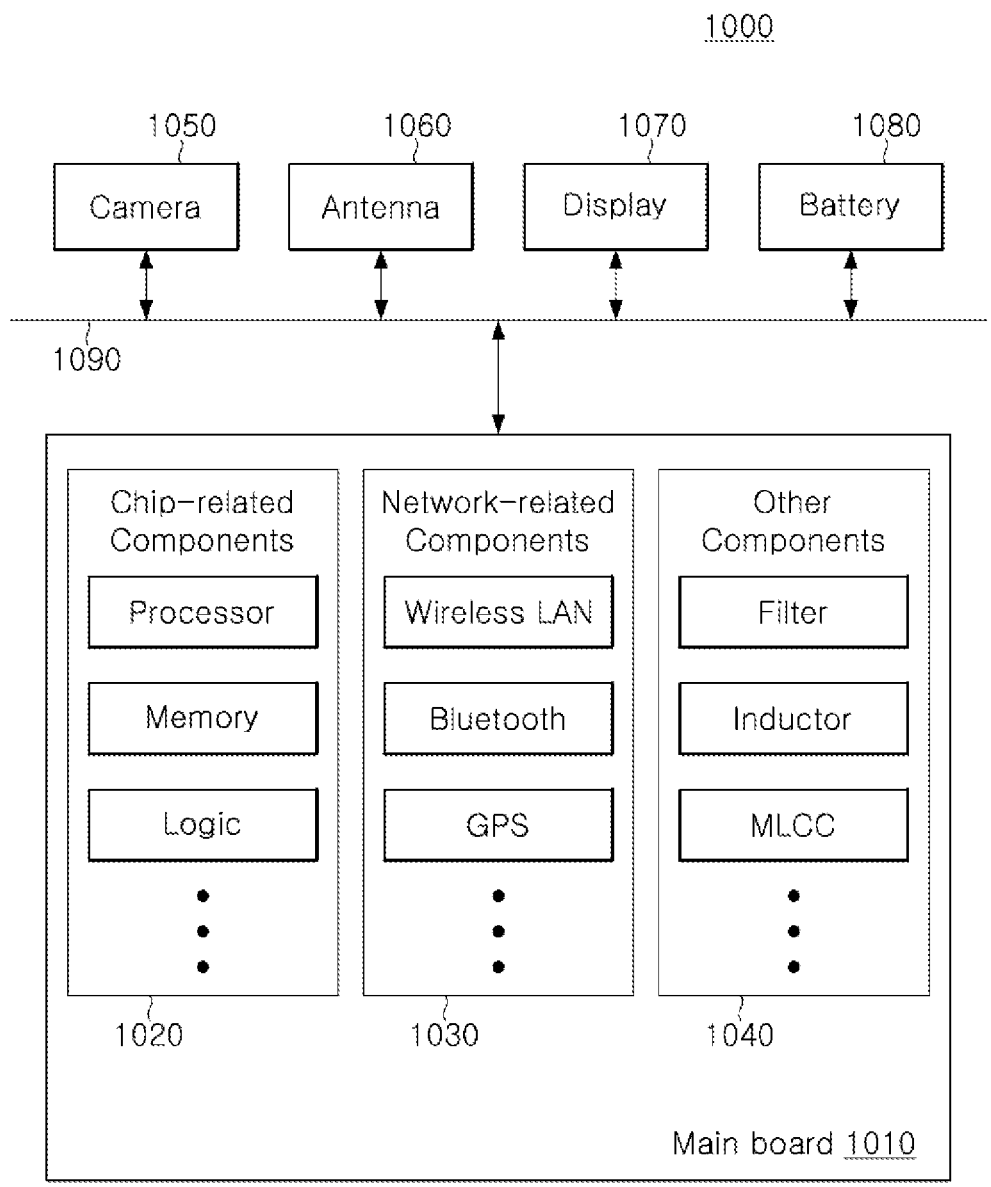
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, the chip-related components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related components 1020 and/or the network-related components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
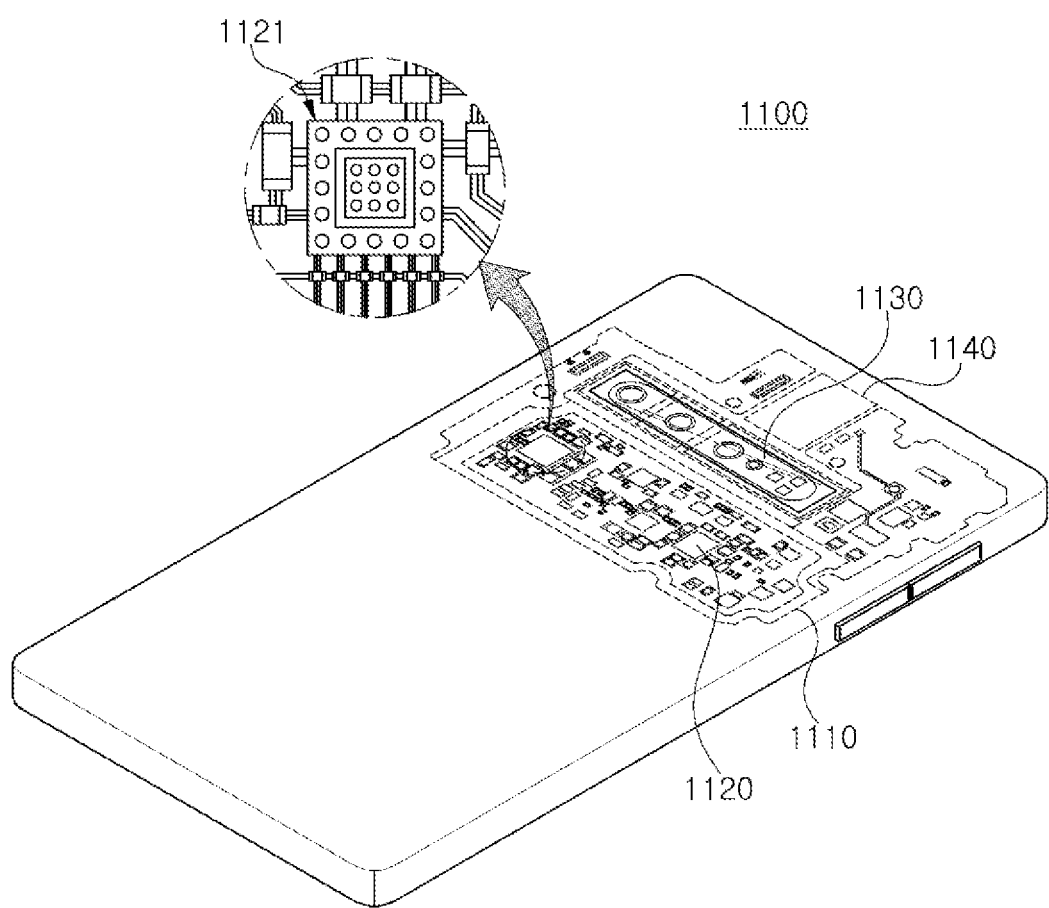
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A motherboard 1110 may be accommodated in the smartphone 1100, and various components 1120 may be physically and/or electrically connected to the motherboard 1110. Also, other components that may or may not be physically and/or electrically connected to the motherboard 1110, such as a camera module 1130 and/or a speaker 1140, may be accommodated in the smartphone 1100. Some of the components 1120 may be the above-described chip-related components, e.g., a component package 1121, but are not limited thereto. The component package 1121 may be in the form of a printed circuit board on which electronic components including active components and/or passive components are surface-mounted. Alternatively, the component package 1121 may be in the form of a printed circuit board in which active components and/or passive components are embedded. Meanwhile, the electronic device is not necessarily limited to the smartphone 1100, but may be any other electronic device as described above.

Printed Circuit Board

Figure 3:
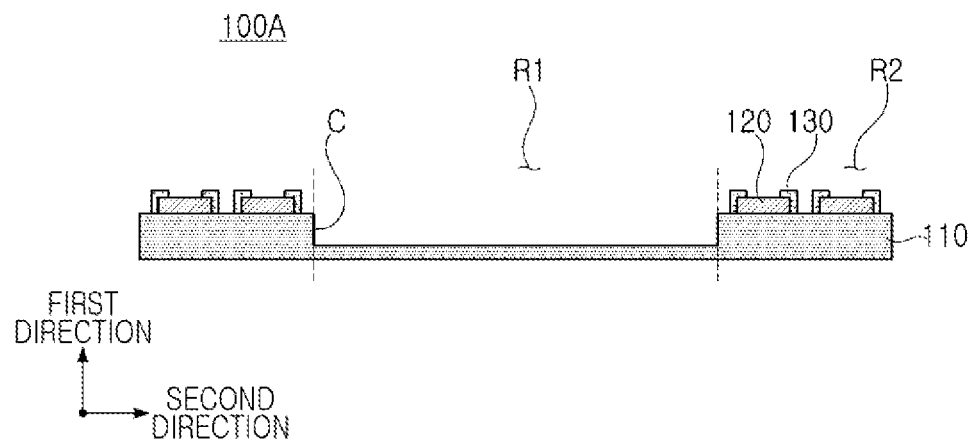
FIG. 3 is a schematic cross-sectional view illustrating an example of a printed circuit board.

FIG. 3 is a schematic cross-sectional view illustrating an example of a printed circuit board.

Figure 4:
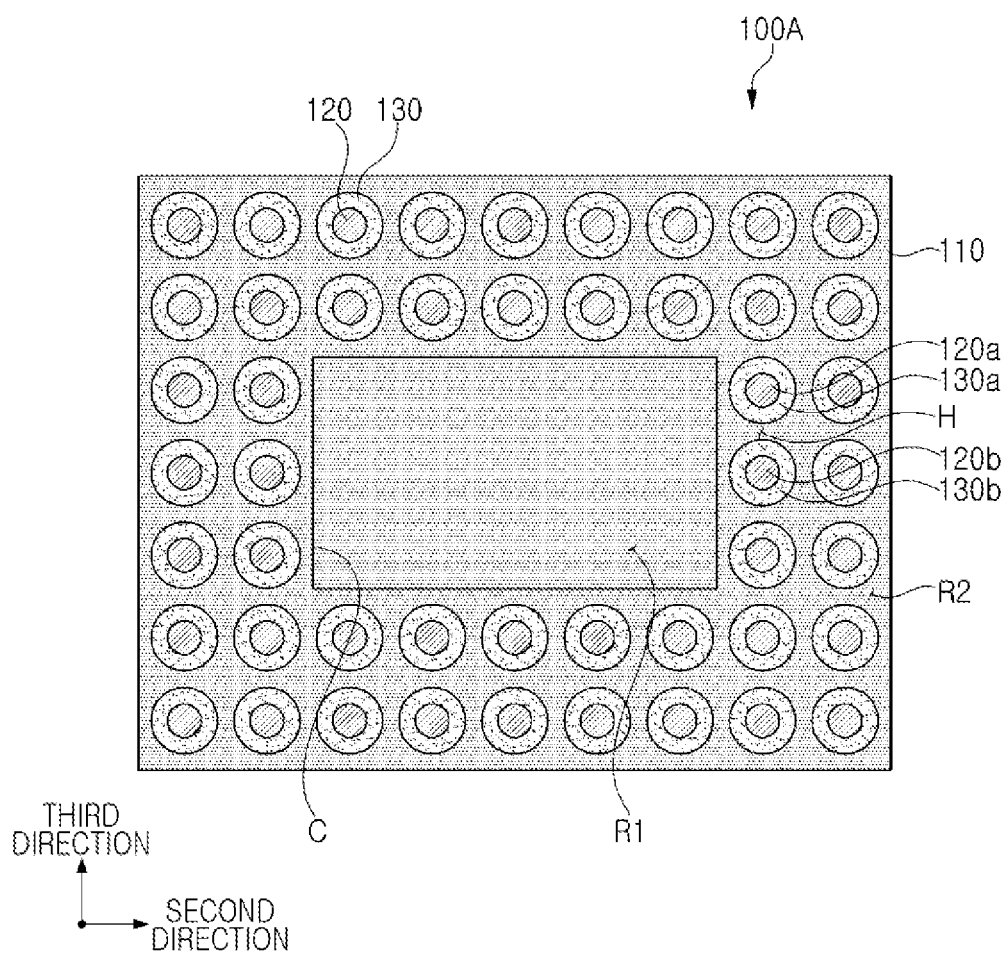
FIG. 4 is a schematic plan view of the printed circuit board of FIG. 3 when viewed from above.

FIG. 4 is a schematic plan view of the printed circuit board of FIG. 3 when viewed from above.

Referring to FIGS. 3 and 4, a printed circuit board 100A according to an exemplary embodiment may include an insulating member 110 including a cavity C, a plurality of bumps 120 spaced apart from each other on the insulating member 110, and a plurality of insulating walls 130 spaced apart from each other on the insulating member 110 and surrounding the plurality of bumps 120, respectively. The printed circuit board 100A according to an exemplary embodiment may be used as an interposer substrate including a cavity, but is not limited thereto.

Meanwhile, in the interposer substrate including a cavity, the cavity may be formed in a region where an electronic component is to be disposed. As a result, an overall thickness of a package can be reduced, and therefore, a margin can be increased in a substrate manufacturing process and in a package assembly process. In addition, a distance between the interposer substrate and a package substrate disposed below the interposer substrate can be reduced at a portion where they are connected to each other by solder balls or the like, which is advantageous in spacing balls at a very small interval. Furthermore, a thickness of an electronic component can be increased, while maintaining the distance between the substrates. The expansion in thickness of the electronic component makes it easy to handle the electronic component in the package assembly process, and may be effective in diffusing heat while a product is operating.

However, a decrease in thickness of the interposer substrate having the cavity may cause a high risk of warpage in the manufacturing process, depending on a shape of the cavity, a difference in area between upper and lower resist layers, and how many different types of insulating materials are used for the board. The risk of warpage may be higher as the cavity is deeper.

In contrast, since the printed circuit board 100A according to an exemplary embodiment includes a plurality of bumps 120 protruding from the insulating member 110, the risk of warpage can be suppressed, and at the same time, it is possible to further increase a depth of the cavity C substantially as much as a height and/or a thickness of the plurality of bumps 120. In this case, it is also possible to reduce a pitch of connection conductors to be disposed between the printed circuit board 100A and another substrate such as a package substrate, and the pitch can be maintained even when a thickness of an electronic component increases.

In addition, in the printed circuit board 100A according to an exemplary embodiment, since the plurality of bumps 120 are surrounded by the plurality of insulating walls 130, connection conductors such as solder balls can be easily attached to the plurality of bumps 120. Therefore, a package assembly process can be more easily performed. For example, each of the plurality of insulating walls 130 may surround a side surface of each of the plurality of bumps 120 and cover at least a portion of an upper surface of each of the plurality of bumps 120. Accordingly, in the cross-sectional view, an upper surface of each of the plurality of insulating walls 130 may be further spaced apart from an upper surface of the insulating member 110 than the upper surface of each of the plurality of bumps 120. For example, the plurality of bumps 120 may be surrounded in a solder mask defined (SMD) type.

In addition, in the printed circuit board 100A according to an exemplary embodiment, in the plan view, when a region in which the cavity C of the insulating member 110 exists is defined as a center region R1, and a region surrounding the center region R1 is defined as a side region R2, the plurality of bumps 120 and the plurality of insulating walls 130 may be disposed in the side region R2. For example, a first bump 120a, a second bump 120b, a first insulating wall 130a, and a second insulating wall 130b may be disposed in the side region R2. Thus, the plurality of bumps 120 and the plurality of insulating walls 130 can be easily used for connection between substrates to be applied to a package structure.

In addition, in the printed circuit board 100A according to an exemplary embodiment, the plurality of insulating walls 130 may be spaced apart from each other on the insulating member 110, and a space between the plurality of insulating walls 130 may extend to the cavity C, and preferably further to an outer edge of the insulating member 110. Thus, flowability can be improved when a molding material is injected between substrates to be applied to a package structure later, even if a depth of the cavity C increases.

For example, the plurality of bumps 120 may include a first bump 120a and a second bump 120b disposed adjacently to but spaced apart from each other on the insulating member 110, and the plurality of insulating walls 130 may include a first insulating wall 130a and a second insulating wall 130b disposed adjacently to but spaced apart from each other on the insulating member 110 and at least partially covering the first bump 120a and the second bump 120b, respectively. In this case, a space H between the first insulating wall 130a and the second insulating wall 130b adjacent to each other may further extend to the cavity C and/or the outer edge of the insulating member 110.

For example, the side region R2 may include a space that extends continuously from the outer edge of the insulating member 110 to a wall surface of the cavity C without being blocked by the plurality of insulating walls 130, e.g., the first and second insulating walls 130a and 130b, and the continuously extending space of the side region R2 may include a space between the plurality of insulating walls 130 spaced apart from each other, e.g., the space H between the first and second insulating walls 130a and 130b.

In addition, in the printed circuit board 100A according to an exemplary embodiment, each of the plurality of insulating walls 130 may surround each of the plurality of bumps 120 in a one-to-one manner. For example, one first insulating wall 130a may surround only one first bump 120a, and one second insulating wall 130b may surround only one second bump 120b. For example, in the plan view, each of the first insulating wall 130a and the second insulating wall 130b may have a substantially circular shape. More specifically, each of the first insulating wall 130a and the second insulating wall 130b may have a substantially circular ring shape, but is not limited thereto. In this case, the plurality of insulating walls 130 may be disposed locally and independently from each other, thereby minimizing obstruction when the molding material flows later.

Hereinafter, the components of the printed circuit board 100A according to an exemplary embodiment will be described in more detail with reference to FIGS. 3 and 4.

The insulating member 110 may include an insulating material. The insulating material may include a thermosetting resin such as an epoxy resin, a thermoplastic resin such as a polyimide resin, or a material containing an inorganic filler, an organic filler, and/or a glass fiber, glass cloth and/or glass fabric together with the thermosetting or thermoplastic resin. The insulating material may be a photosensitive material and/or a non-photosensitive material. For example, the applicable insulating material may be solder resist (SR), Ajinomoto build-up film (ABF), prepreg (PPG), resin coated copper (RCC), or the like, but is not limited thereto. As an insulating material, another type of polymer material is applicable.

The cavity C may penetrate through at least a portion of the insulating member 110 in the first direction. The cavity C may be formed in the center region R1 of the insulating member 110. The depth of the cavity C may be variously adjusted.

Each of the plurality of bumps 120 may include a metal material. The metal material may include copper (Cu), aluminum (Al), silver (Ag), tin (Sn), gold (Au), nickel (Ni), lead (Pb), titanium (Ti), and/or an alloy thereof. Each of the plurality of bumps 120 may perform various functions depending on design. For example, the plurality of bumps 120 may include ground bumps, power bumps, signal bumps, or the like. Here, the signal bumps may include bumps for connecting various signals, e.g., data signals, other than ground bumps, power bumps, and the like. Each of the plurality of bumps 120 may have a thickness of 10 μm or more in the first direction, but is not limited thereto. If necessary, a surface treatment layer including a nickel (Ni) layer and/or a gold (Au) layer may be formed on each of surfaces of the plurality of bumps 120 exposed from the plurality of insulating walls 130. Each of the plurality of bumps 120 may include an electroless plating layer (or chemical copper) and an electrolytic plating layer (or electrical copper), but is not limited thereto.

Each of the plurality of insulating walls 130 may include an insulating material. The insulating material may include a photosensitive insulating material, e.g., photosensitive solder resist. However, the insulating material is not particularly limited thereto, and another type of polymer material such as thermosetting solder resist may be used as an insulating material. In one example, the insulating material of the plurality of insulating walls 130 may be different from the insulating material of the insulating member 110, although the present disclosure is not limited thereto. The plurality of insulating walls 130 may be formed from the same single layer, and thus may include the same insulating material. Each of the plurality of insulating walls 130 may be 10 μm or more thicker than each of the plurality of bumps 120 in the first direction, but is not limited thereto.

Figure 5:
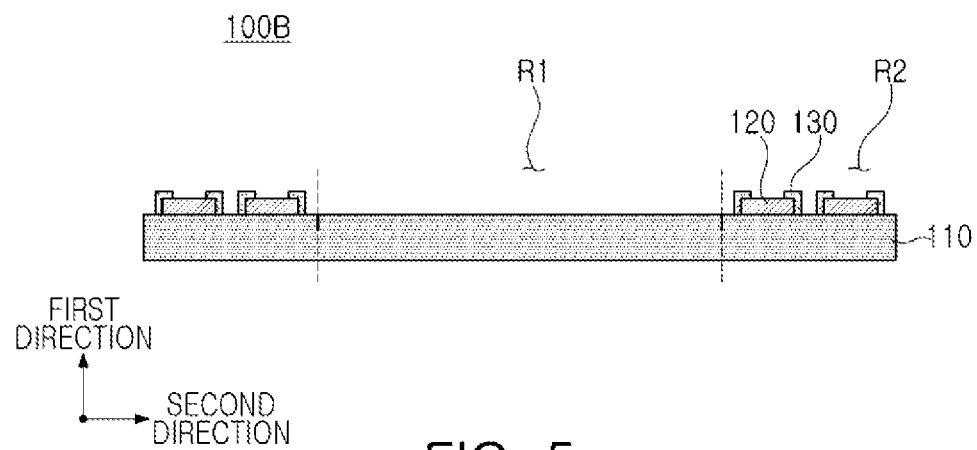
FIG. 5 is a schematic cross-sectional view illustrating another example of a printed circuit board.

FIG. 5 is a schematic cross-sectional view illustrating another example of a printed circuit board.

Figure 6:
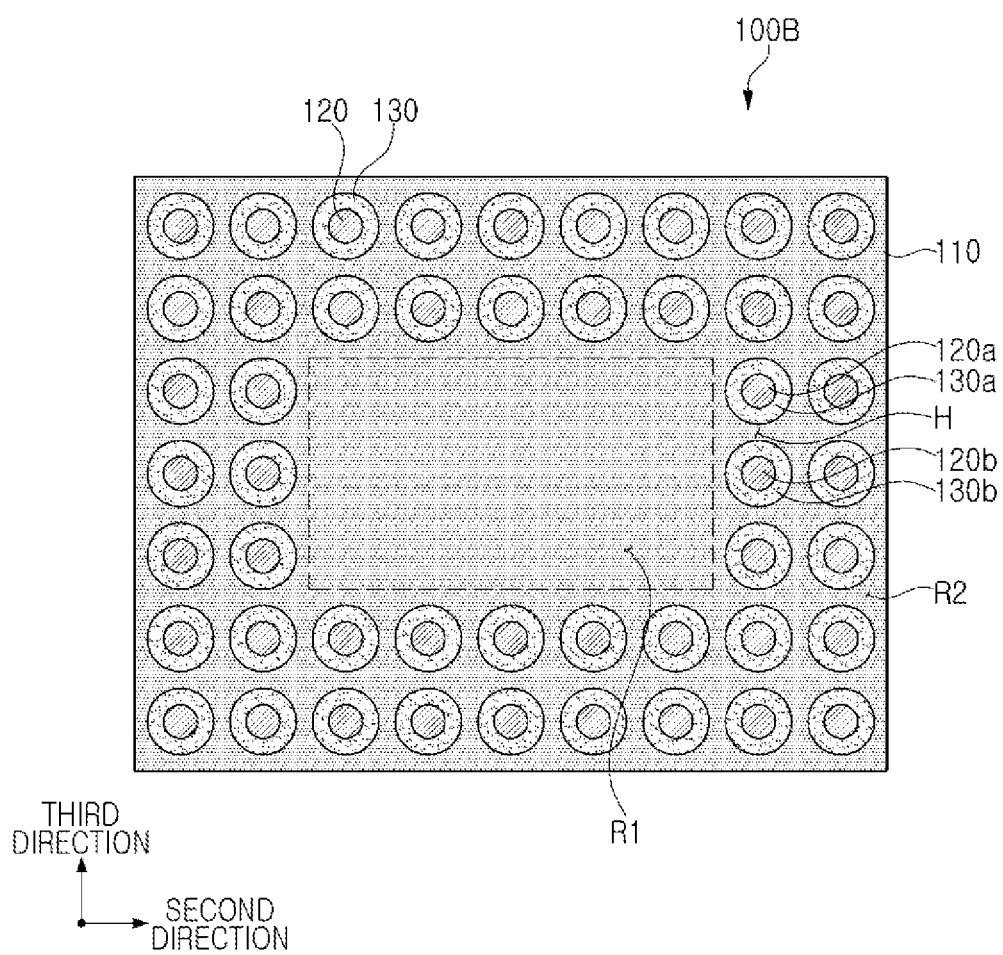
FIG. 6 is a schematic plan view of the printed circuit board of FIG. 5 when viewed from above.

FIG. 6 is a schematic plan view of the printed circuit board of FIG. 5 when viewed from above.

Referring to FIGS. 5 and 6, a printed circuit board 100B according to another exemplary embodiment may include an insulating member 110, a plurality of bumps 120 spaced apart from each other on the insulating member 110, and a plurality of insulating walls 130 spaced apart from each other on the insulating member 110 and surrounding the plurality of bumps 120, respectively. The printed circuit board 100B according to another exemplary embodiment may be used as a package substrate on which electronic components are mounted, but is not limited thereto.

Meanwhile, since the printed circuit board 100B according to another exemplary embodiment includes a plurality of bumps 120 protruding from the insulating member 110, the risk of warpage can be suppressed. In this case, it is also possible to reduce a pitch of connection conductors to be disposed between the printed circuit board 100B and another substrate such as an interposer substrate, and the pitch can be maintained even when a thickness of an electronic component increases.

In addition, in the printed circuit board 100B according to another exemplary embodiment, the plurality of bumps 120 and the plurality of insulating walls 130 may be disposed in a side region R2, in the plan view. For example, a first bump 120a, a second bump 120b, a first insulating wall 130a, and a second insulating wall 130b may be disposed in the side region R2. Thus, the plurality of bumps 120 and the plurality of insulating walls 130 can be easily used for connection between substrates to be applied to a package structure. Here, the side region may be an outer region in which a connection conductor such as a solder ball joint for substrate-on-substrate connection or the like is disposed. Here, the inner side and the outer side may be determined in the plan view.

In addition, in the printed circuit board 100B according to another exemplary embodiment, the plurality of insulating walls 130 may be spaced apart from each other on the insulating member 110, and a space between the plurality of insulating walls 130 may extend to a center region R1 of the insulating member 110, and preferably further to an outer edge of the insulating member 110. Thus, flowability can be improved when a molding material is injected between substrates to be applied to a package structure later. Here, the center region R1 may be an inner region in which an electronic component, e.g., a semiconductor chip, is mounted. Here, the inner side and the outer side may be determined in the plan view.

For example, the plurality of bumps 120 may include a first bump 120a and a second bump 120b disposed adjacently to but spaced apart from each other on the insulating member 110, and the plurality of insulating walls 130 may include a first insulating wall 130a and a second insulating wall 130b disposed adjacently to but spaced apart from each other on the insulating member 110 and at least partially covering the first bump 120a and the second bump 120b, respectively. In this case, a space H between the first insulating wall 130a and the second insulating wall 130b adjacent to each other may further extend to the center region R1 and/or the outer edge of the insulating member 110.

For example, the side region R2 may include a space that extends continuously from the outer edge to the center region R1 of the insulating member 110 without being blocked by the plurality of insulating walls 130, e.g., the first and second insulating walls 130a and 130b, and the continuously extending space of the side region R2 may include a space between the plurality of insulating walls 130 spaced apart from each other, e.g., the space H between the first and second insulating walls 130a and 130b.

Concerning the other details, the details described above for the printed circuit board 100A may also be applicable to the printed circuit board 100B according to another exemplary embodiment unless contradictory, and the overlapping description will not be repeated.

Figure 7:
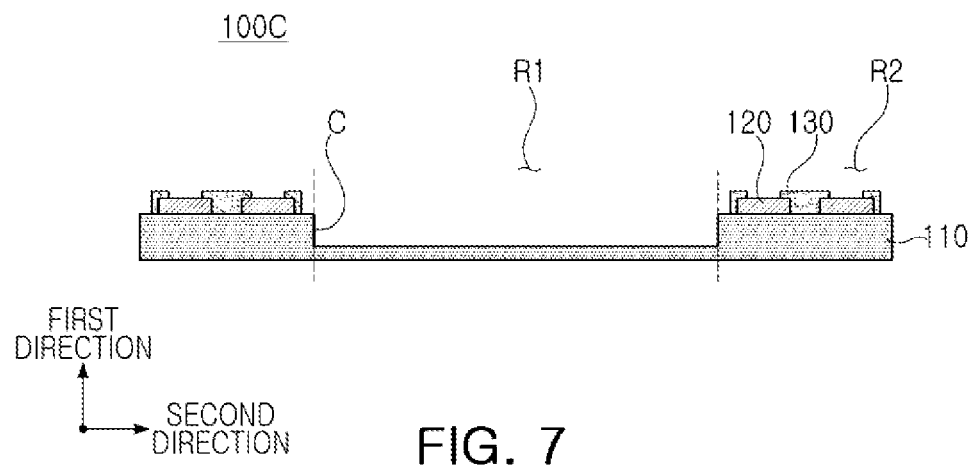
FIG. 7 is a schematic cross-sectional view illustrating another example of a printed circuit board.

FIG. 7 is a schematic cross-sectional view illustrating another example of a printed circuit board.

Figure 8:
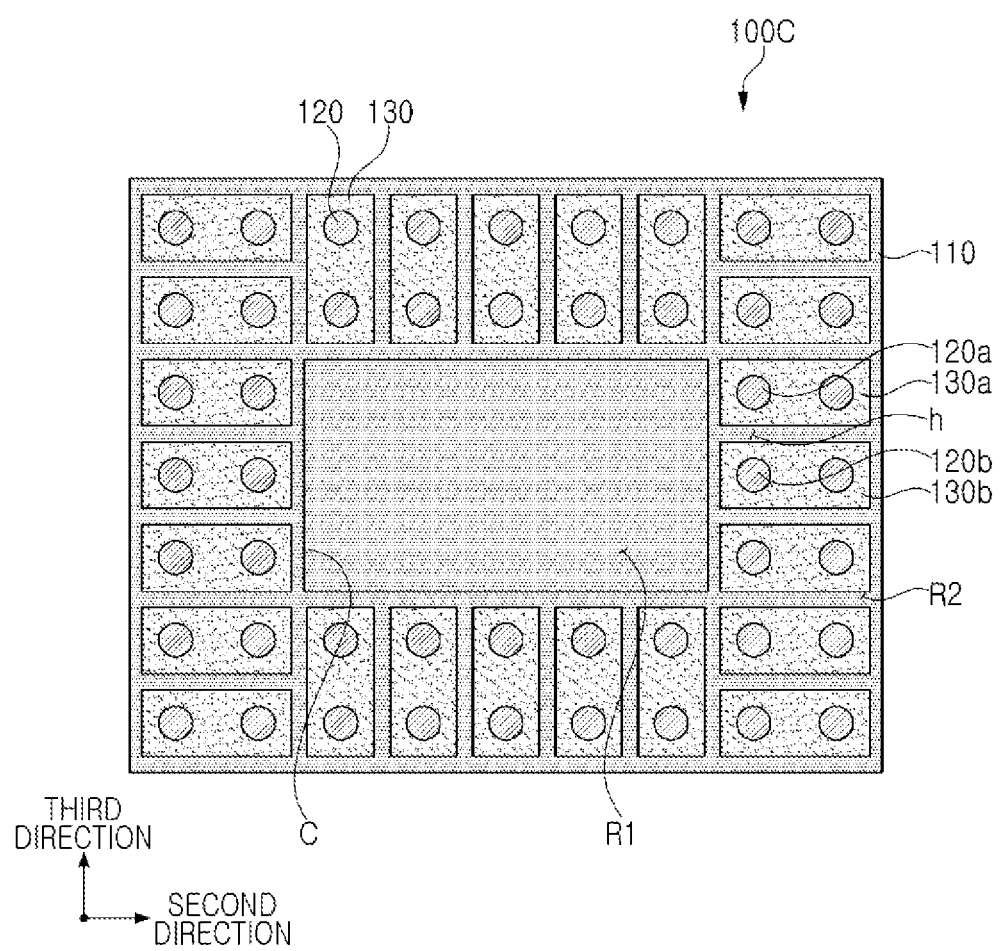
FIG. 8 is a schematic plan view of the printed circuit board of FIG. 7 when viewed from above.

FIG. 8 is a schematic plan view of the printed circuit board of FIG. 7 when viewed from above.

Referring to FIGS. 7 and 8, a printed circuit board 100C according to another exemplary embodiment may include an insulating member 110 including a cavity C, a plurality of bumps 120 spaced apart from each other on the insulating member 110, and a plurality of insulating walls 130 spaced apart from each other on the insulating member 110 and surrounding the plurality of bumps 120. The printed circuit board 100C according to another exemplary embodiment may be used as an interposer substrate including a cavity, but is not limited thereto.

Meanwhile, in the printed circuit board 100C according to another exemplary embodiment, each of the plurality of insulating walls 130 may surround at least two of the plurality of bumps 120. For example, one first insulating wall 130a may surround a plurality of first bumps 120a, and one second insulating wall 130b may surround a plurality of second bumps 120b. For example, in the plan view, each of the first insulating wall 130a and the second insulating wall 130b may have a substantially rectangular shape. More specifically, each of the first insulating wall 130a and the second insulating wall 130b may have a substantially rectangular block shape, but is not limited thereto. In the plan view, each space h between the plurality of insulating walls 130 may have a trench shape in a direction toward the cavity C from an outer edge of the insulating member 110. A side region R2 may include a space that extends continuously from the outer edge of the insulating member 110 to a wall surface of the cavity C without being blocked by the plurality of insulating walls 130, e.g., the first and second insulating walls 130a and 130b, and the continuously extending space of the side region R2 may include a space between the plurality of insulating walls 130 spaced apart from each other, e.g., the space h between the first and second insulating walls 130a and 130b. Therefore, it is possible to minimize obstruction when a molding material flows later.

In addition, in the printed circuit board 100C according to another exemplary embodiment, for example, each of the plurality of insulating walls 130 may surround side surfaces of at least two of the plurality of bumps 120 and at least partially cover upper surfaces of the at least two of the plurality of bumps 120. Accordingly, in the cross-sectional view, an upper surface of each of the plurality of insulating walls 130 may be further spaced apart from an upper surface of the insulating member 110 than the upper surface of each of the plurality of bumps 120. For example, the plurality of bumps 120 may be surrounded in an SMD type. Therefore, connection conductors can be easily attached to the plurality of bumps 120, and a package assembly process can be easily performed.

Meanwhile, if necessary, the above-described form of the plurality of insulating walls 130 and the plurality of bumps 120 in the printed circuit board 100A may be applied to the above-described printed circuit board 100C in a mixed manner. For example, while one first insulating wall 130a surrounds only one first bump 120a, one second insulating wall 130b may surround a plurality of second bumps 120b. For example, the first insulating wall 130a may have a substantially circular ring shape, and the second insulating wall 130b may have a substantially rectangular block shape. In addition, the other details may also be applied in a mixed manner unless contradictory.

Concerning the other details, the details described above for the printed circuit boards 100A and 100B may also be applicable to the printed circuit board 100C according to another exemplary embodiment unless contradictory, and the overlapping description will not be repeated.

Figure 9:
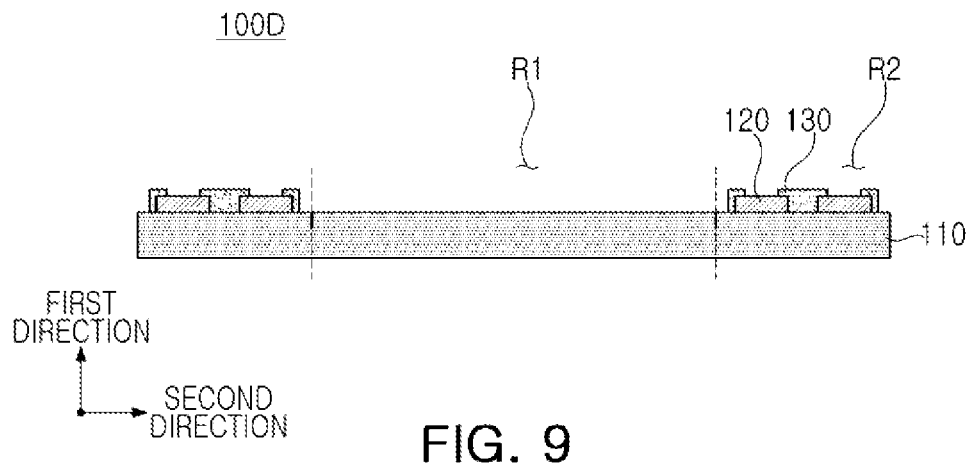
FIG. 9 is a schematic cross-sectional view illustrating another example of a printed circuit board.

FIG. 9 is a schematic cross-sectional view illustrating another example of a printed circuit board.

Figure 10:
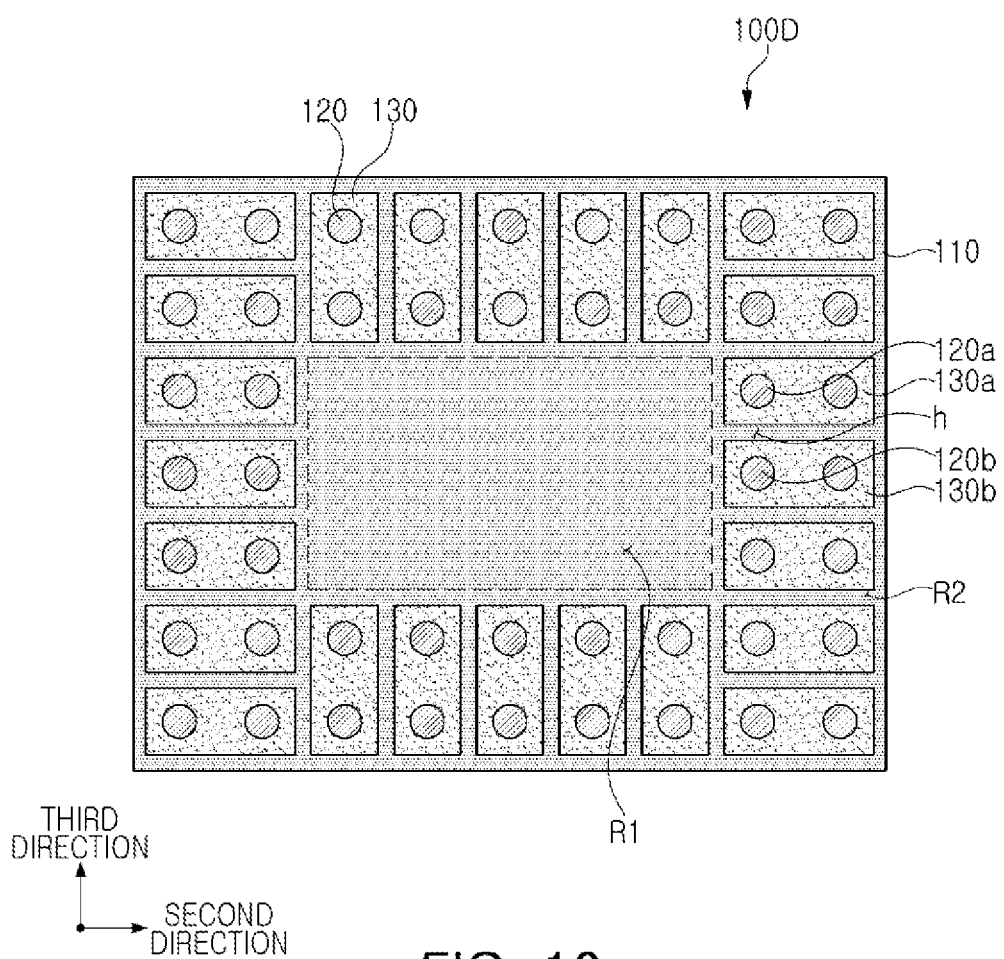
FIG. 10 is a schematic plan view of the printed circuit board of FIG. 9 when viewed from above.

FIG. 10 is a schematic plan view of the printed circuit board of FIG. 9 when viewed from above.

Referring to FIGS. 9 and 10, a printed circuit board 100D according to another exemplary embodiment may include an insulating member 110, a plurality of bumps 120 spaced apart from each other on the insulating member 110, and a plurality of insulating walls 130 spaced apart from each other on the insulating member 110 and surrounding the plurality of bumps 120. The printed circuit board 100D according to another exemplary embodiment may be used as a package substrate on which electronic components are mounted, but is not limited thereto.

Meanwhile, in the plan view, in the printed circuit board 100D according to another exemplary embodiment, each space h between the plurality of insulating walls 130 may have a trench shape in a direction toward a center region R1 from an outer edge of the insulating member 110. A side region R2 may include a space that extends continuously from the outer edge of the insulating member 110 to the center region R1 without being blocked by the plurality of insulating walls 130, e.g., first and second insulating walls 130a and 130b, and the continuously extending space of the side region R2 may include a space between the plurality of insulating walls 130 spaced apart from each other, e.g., the space h between the first and second insulating walls 130a and 130b. Therefore, it is possible to minimize obstruction when a molding material flows later.

Meanwhile, if necessary, the above-described form of the plurality of insulating walls 130 and the plurality of bumps 120 in the printed circuit board 100B may be applied to the above-described printed circuit board 100D in a mixed manner. For example, while one first insulating wall 130a surrounds only one first bump 120a, one second insulating wall 130b may surround a plurality of second bumps 120b. For example, the first insulating wall 130a may have a substantially circular ring shape, and the second insulating wall 130b may have a substantially rectangular block shape. In addition, the other details may also be applied in a mixed manner unless contradictory.

Concerning the other details, the details described above for the printed circuit boards 100A, 100B, and 100C may also be applicable to the printed circuit board 100D according to another exemplary embodiment unless contradictory, and the overlapping description will not be repeated.

Figure 11:
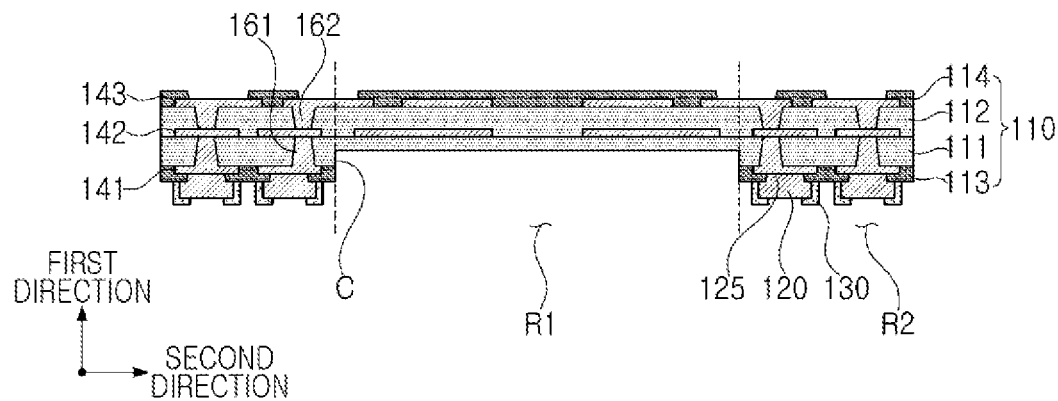
FIG. 11 is a schematic cross-sectional view illustrating another example of a printed circuit board.

FIG. 11 is a schematic cross-sectional view illustrating another example of a printed circuit board.

Figure 12:
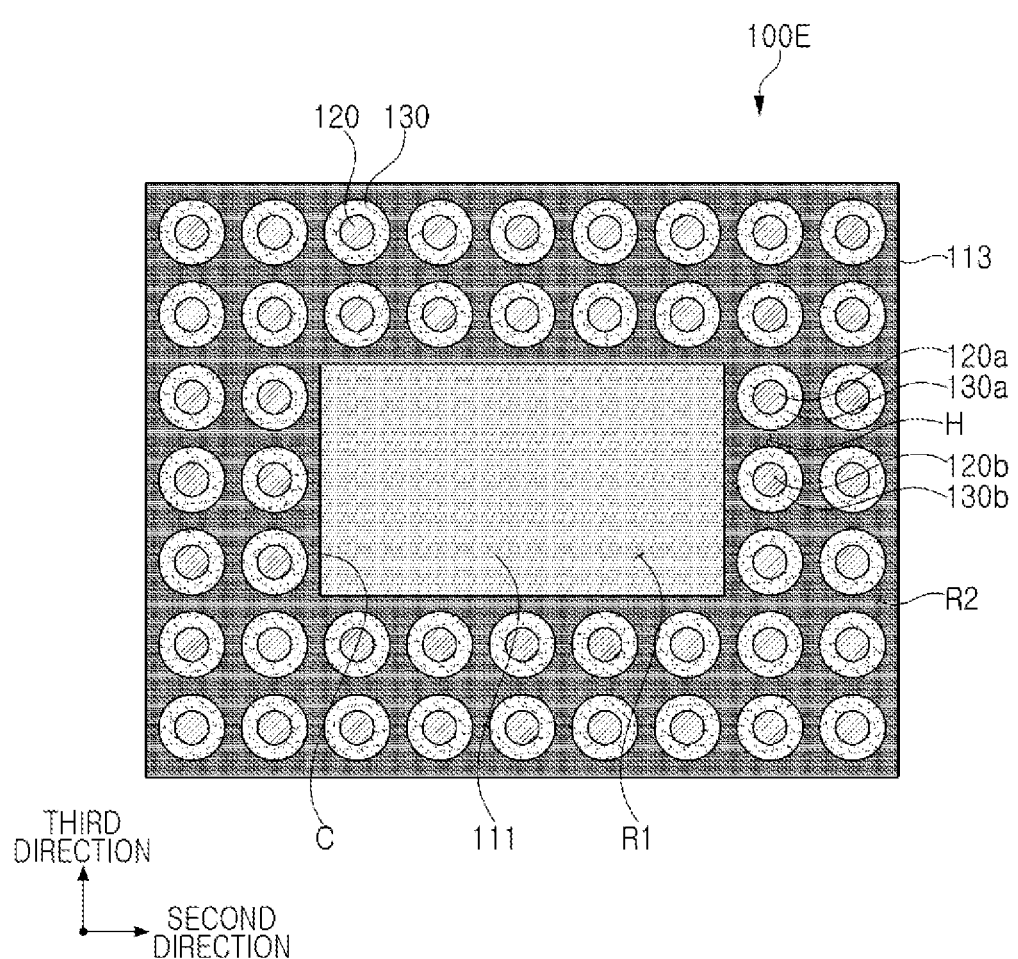
FIG. 12 is a schematic plan view of the printed circuit board of FIG. 11 when viewed from below.

FIG. 12 is a schematic plan view of the printed circuit board of FIG. 11 when viewed from below.

Referring to FIGS. 11 and 12, a printed circuit board 100E according to another exemplary embodiment may include a first insulating layer 111, a first resist layer 113 disposed on a lower surface of the first insulating layer 111, a second insulating layer 112 disposed on an upper surface of the first insulating layer 111, a second resist layer 114 disposed on an upper surface of the second insulating layer 112, a plurality of bumps 120 disposed on a lower surface of the first resist layer 113, a plurality of insulating walls 130 disposed on the lower surface of the first resist layer 113 and surrounding the plurality of bumps 120 respectively, a first wiring layer 141 disposed on the lower surface of the first insulating layer 111 and at least partially covered by the first resist layer 113, a plurality of bump vias 125 penetrating through the first resist layer 113 and connecting the plurality of bumps 120 to the first wiring layer 141 respectively, a second wiring layer 142 disposed on the upper surface of the first insulating layer 111 and embedded in the second insulating layer 112 so that a lower surface of the second wiring layer 142 is exposed to a lower surface of the second insulating layer 112, a first via layer 161 penetrating through the first insulating layer 111 and connecting the first and second wiring layers 141 and 142 to each other, a third wiring layer 143 disposed on the upper surface of the second insulating layer 112 and at least partially covered by the second resist layer 114, and a second via layer 162 penetrating through the second insulating layer 112 and connecting the second and third wiring layers 142 and 143 to each other. An insulating member 110 may include the first and second insulating layers 111 and 112 and the first and second resist layers 113 and 114, and have a cavity C. The cavity C may penetrate through the first resist layer 113 and further penetrate through at least a portion of the first insulating layer 111. The printed circuit board 100E according to another exemplary embodiment may be used as an interposer substrate including a cavity, but is not limited thereto.

Meanwhile, since the printed circuit board 100E according to another exemplary embodiment includes a plurality of bumps 120 protruding from the insulating member 110, the risk of warpage can be suppressed, and at the same time, it is possible to further increase a depth of the cavity C substantially as much as a height and/or a thickness of the plurality of bumps 120. Also, it is possible to reduce a pitch of connection conductors to be disposed between the printed circuit board 100E and another substrate such as a package substrate, and the pitch can be maintained even when a thickness of an electronic component increases.

In addition, in the printed circuit board 100E according to another exemplary embodiment, since the plurality of bumps 120 are surrounded by the plurality of insulating walls 130, connection conductors such as solder balls can be easily attached to the plurality of bumps 120. Therefore, a package assembly process can be more easily performed. For example, each of the plurality of insulating walls 130 may surround a side surface of each of the plurality of bumps 120 and cover at least a portion of a lower surface of each of the plurality of bumps 120. Accordingly, in the cross-sectional view, a lower surface of each of the plurality of insulating walls 130 may be further spaced apart from a lower surface of the insulating member 110 than the lower surface of each of the plurality of bumps 120. For example, the plurality of bumps 120 may be surrounded in an SMD type.

In addition, in the printed circuit board 100E according to another exemplary embodiment, in the plan view, when a region in which the cavity C of the insulating member 110 exists is defined as a center region R1, and a region surrounding the center region R1 is defined as a side region R2, the plurality of bumps 120 and the plurality of insulating walls 130 may be disposed in the side region R2. For example, a first bump 120a, a second bump 120b, a first insulating wall 130a, and a second insulating wall 130b may be disposed in the side region R2. Thus, the plurality of bumps 120 and the plurality of insulating walls 130 can be easily used for connection between substrates to be applied to a package structure.

In addition, in the printed circuit board 100E according to another exemplary embodiment, the plurality of insulating walls 130 may be spaced apart from each other on the insulating member 110, and a space between the plurality of insulating walls 130 may extend to the cavity C, and preferably further to an outer edge of the insulating member 110. Thus, flowability can be improved when a molding material is injected between substrates to be applied to a package structure later, even if a depth of the cavity C increases.

For example, the plurality of bumps 120 may include a first bump 120a and a second bump 120b disposed adjacently to but spaced apart from each other on the insulating member 110, and the plurality of insulating walls 130 may include a first insulating wall 130a and a second insulating wall 130b disposed adjacently to but spaced apart from each other on the insulating member 110 and at least partially covering the first bump 120a and the second bump 120b, respectively. In this case, a space H between the first insulating wall 130a and the second insulating wall 130b adjacent to each other may further extend to the cavity C and/or the outer edge of the insulating member 110.

For example, the side region R2 may include a space that extends continuously from the outer edge of the insulating member 110 to a wall surface of the cavity C without being blocked by the plurality of insulating walls 130, e.g., the first and second insulating walls 130a and 130b, and the continuously extending space of the side region R2 may include a space between the plurality of insulating walls 130 spaced apart from each other, e.g., the space H between the first and second insulating walls 130a and 130b.

In addition, in the printed circuit board 100E according to another exemplary embodiment, each of the plurality of insulating walls 130 may surround each of the plurality of bumps 120 in a one-to-one manner. For example, one first insulating wall 130a may surround only one first bump 120a, and one second insulating wall 130b may surround only one second bump 120b. For example, in the plan view, each of the first insulating wall 130a and the second insulating wall 130b may have a substantially circular shape. More specifically, each of the first insulating wall 130a and the second insulating wall 130b may have a substantially circular ring shape, but is not limited thereto. In this case, the plurality of insulating walls 130 may be disposed locally and independently from each other, thereby minimizing obstruction when the molding material flows later.

Hereinafter, the components of the printed circuit board 100E according to another exemplary embodiment will be described in more detail with reference to FIGS. 11 and 12.

Each of the first and second insulating layers 111 and 112 may include an insulating material. The insulating material may include a thermosetting resin such as an epoxy resin, a thermoplastic resin such as a polyimide resin, or a material containing an inorganic filler, an organic filler, and/or a glass fiber together with the thermosetting or thermoplastic resin. The insulating material may be a photosensitive material and/or a non-photosensitive material. For example, the applicable insulating material may be photoimagable dielectric (PID), ABF, PPG, RCC, or the like, but is not limited thereto. As an insulating material, another type of polymer material is applicable. The first and second insulating layers 111 and 112 may include the same type of insulating material, but are not limited thereto, and may include different types of insulating materials. For example, the first insulating layer 111, in which the cavity C is formed, may include an insulating material containing no glass fiber, e.g., ABF, and the second insulating layer 112, in which the cavity C is not formed, may include an insulating material containing a glass fiber, e.g., PPG. However, the insulating materials of the first and second insulating layers 111 and 112 are not limited thereto. The second insulating layer 112 may include a single layer as illustrated, but may include a plurality of layers differently from what is illustrated, and the specific number of layers is not particularly limited.

The first and second resist layers 113 and 114 may include known solder resist layers, but are not limited thereto. For example, the first and second resist layers 113 and 114 may include ABF, which contains a thermosetting resin and an inorganic filler. The first and second resist layers 113 and 114 may be disposed on the outermost sides of the printed circuit board 100E, respectively, to protect patterns and the like inside the printed circuit board 100E from the outside. Each of the first and second resist layers 113 and 114 may have a plurality of openings. For example, the first resist layer 113 may have a plurality of openings at least partially exposing the first wiring layer 141. Also, the second resist layer 114 may have a plurality of openings at least partially exposing the third wiring layer 143. If necessary, a surface treatment layer including a nickel (Ni) layer and/or a gold (Au) layer may be formed on a surface of the third wiring layer 143 exposed through the openings.

The cavity C may penetrate through at least a portion of the insulating member 110 in the first direction. For example, the cavity C may penetrate through the first resist layer 113 and a portion of the first insulating layer 111 in the first direction. If necessary, the cavity C may penetrate through all of the first insulating layer 111. The cavity C may be formed in the center region R1 of the insulating member 110. The depth of the cavity C may be variously adjusted.

Each of the plurality of bumps 120 may include a metal material. The metal material may include copper (Cu), aluminum (Al), silver (Ag), tin (Sn), gold (Au), nickel (Ni), lead (Pb), titanium (Ti), and/or an alloy thereof. Each of the plurality of bumps 120 may perform various functions depending on design. For example, the plurality of bumps 120 may include ground bumps, power bumps, signal bumps, or the like. Here, the signal bumps may include bumps for connecting various signals, e.g., data signals, other than ground bumps, power bumps, and the like. Each of the plurality of bumps 120 may have a thickness of 10 µm or more in the first direction, but is not limited thereto. If necessary, a surface treatment layer including a nickel (Ni) layer and/or a gold (Au) layer may be formed on each of surfaces of the plurality of bumps 120 exposed from the plurality of insulating walls 130. Each of the plurality of bumps 120 may include an electroless plating layer (or chemical copper) and an electrolytic plating layer (or electrical copper), but is not limited thereto.

Each of the plurality of bump vias 125 may include a metal material. The metal material may include copper (Cu), aluminum (Al), silver (Ag), tin (Sn), gold (Au), nickel (Ni), lead (Pb), titanium (Ti), and/or an alloy thereof. The plurality of bump vias 125 may perform various functions depending on design. For example, the plurality of bump vias 125 may include bump vias for signal connection, bump vias for ground connection, bump vias for power connection, or the like. Each of the plurality of bump vias 125 may have a tapered shape in which a surface contacting each of the plurality of bumps 120 has a larger diameter than a surface contacting the first wiring layer 141. The plurality of bump vias 125 may be formed by filling via holes with the metal material. The plurality of bump vias 125 may be formed by the same plating process as the plurality of bump 120, such that each of the plurality of bump vias 125 is integrated with each of the plurality of bump 120 without a boundary therebetween. For example, the plurality of bump vias 125 and the plurality of bumps 120 may be integrated with each other in a one-to-one manner. Each of the plurality of bump vias 125 may include an electroless plating layer (or chemical copper) and an electrolytic plating layer (or electrical copper), but is not limited thereto.

Each of the plurality of insulating walls 130 may include an insulating material. The insulating material may include a photosensitive insulating material, e.g., photosensitive solder resist. However, the insulating material is not particularly limited thereto, and another type of polymer material such as thermosetting solder resist may be used as an insulating material. In one example, the insulating material of the plurality of insulating walls 130 may be different from the insulating material of the first and second insulating layers 111 and 112 and the insulating material of the first and second resist layers 113 and 114, although the present disclosure is not limited thereto. The plurality of insulating walls 130 may be formed from the same single layer, and thus may include the same insulating material. Each of the plurality of insulating walls 130 may be 10 μm or more thicker than each of the plurality of bumps 120 in the first direction, but is not limited thereto.

Each of the first to third wiring layers 141 to 143 may include a metal material. The metal material may include copper (Cu), aluminum (Al), silver (Ag), tin (Sn), gold (Au), nickel (Ni), lead (Pb), titanium (Ti), and/or an alloy thereof. The first to third wiring layers 141 to 143 may perform various functions depending on how the wiring layers are designed. For example, the first to third wiring layers 141 to 143 may include ground patterns, power patterns, signal patterns, or the like. Here, the signal patterns may include various signals, e.g., data signals, other than ground patterns, power patterns, and the like. Each of these patterns may include a line pattern, a plane pattern, and/or a pad pattern. Like the second insulating layer 112, the second wiring layer 142 may include a single layer as illustrated, but may include a plurality of layers differently from what is illustrated, and the specific number of layers is not particularly limited. Each of the first to third wiring layers 141 to 143 may include an electroless plating layer (or chemical copper) and an electrolytic plating layer (or electrical copper), but is not limited thereto.

Each of the first and second via layers 161 and 162 may include a metal material. The metal material may include copper (Cu), aluminum (Al), silver (Ag), tin (Sn), gold (Au), nickel (Ni), lead (Pb), titanium (Ti), and/or an alloy thereof. The first and second via layers 161 and 162 may perform various functions depending on how the via layers are designed. For example, the first and second via layers 161 and 162 may include connection vias for signal connection, connection vias for ground connection, connection vias for power connection, or the like. The first and second via layers 161 and 162 may be tapered in different directions. For example, the first via layer 161 may be tapered upwardly, and the second via layer 162 may be tapered downwardly. Each of the first and second via layers 161 and 162 may be formed by filling via holes with the metal material or by applying the metal material along wall surfaces of via holes. The respective connection vias of the first and second via layers 161 and 162 may have a stack via relationship or a staggered via relationship. Like the second insulating layer 112 and the second wiring layer 142, the second via layer 162 may include a single layer as illustrated, but may include a plurality of layers differently from what is illustrated, and the specific number of layers is not particularly limited. Each of the first and second via layers 161 and 162 may include an electroless plating layer (or chemical copper) and an electrolytic plating layer (or electrical copper), but is not limited thereto. The first via layer 161 may be formed by the same plating process as the first wiring layer 141, such that the first via layer 161 and the first wiring layer 141 are integrated with each other without a boundary therebetween. The second via layer 162 may be formed by the same plating process as the third wiring layer 143, such that the second via layer 162 and the third wiring layer 143 are integrated with each other without a boundary therebetween.

Concerning the other details, the details described above for the printed circuit boards 100A, 100B, 100C, and 100D may also be applicable to the printed circuit board 100E according to another exemplary embodiment unless contradictory, and the overlapping description will not be repeated.

FIGS. 13A through 13I are schematic views illustrating examples of processes for manufacturing the printed circuit board of FIG. 11.

Figure 13A:
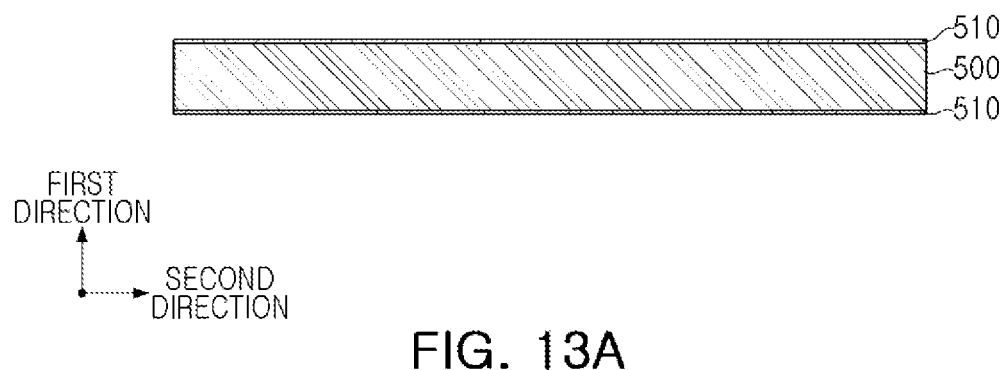
FIGS. 13A through 13I are schematic views illustrating examples of processes for manufacturing the printed circuit board of FIG. 11.

Referring to FIG. 13A, a carrier substrate 500 with a metal layer 510 formed on one or both surfaces thereof may be prepared. The carrier substrate 500 may be a copper clad laminate (CCL) or the like, but is not limited thereto, and any other kind of carrier substrate may be used, not particularly limited, as long as it is used as a detachable carrier. The metal layer 510 may include a copper (Cu) layer such as a copper foil, but is not limited thereto, and may further include another metal layer. A release layer for easy detachment may be disposed between the metal layer 510 and the carrier substrate 500.

Figure 13B:
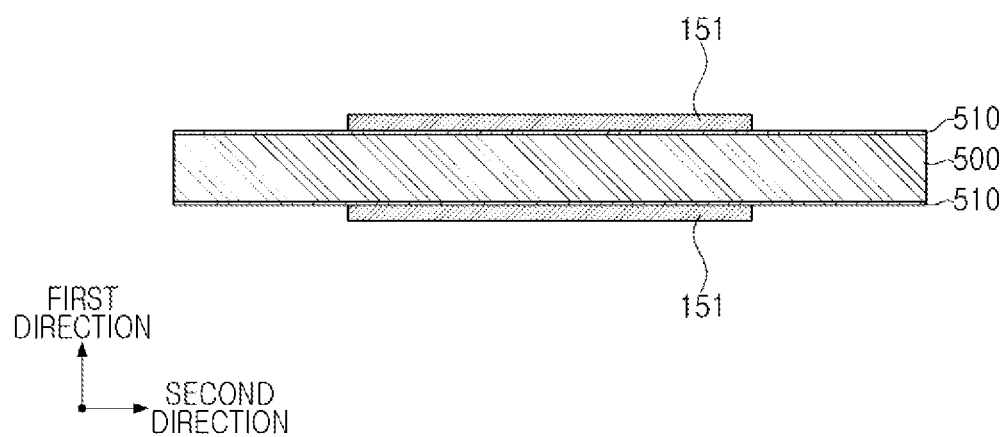

Referring to FIG. 13B, a first plating layer 151 may be formed on the metal layer 510 of the carrier substrate 500. The first plating layer 151 may be formed by a plating process such as an additive process (AP), a semi AP (SAP), a modified SAP (MSAP), or tenting (TT). In the plating process, the metal layer 510 of the carrier substrate 500 may be used as a seed layer.

Figure 13C:
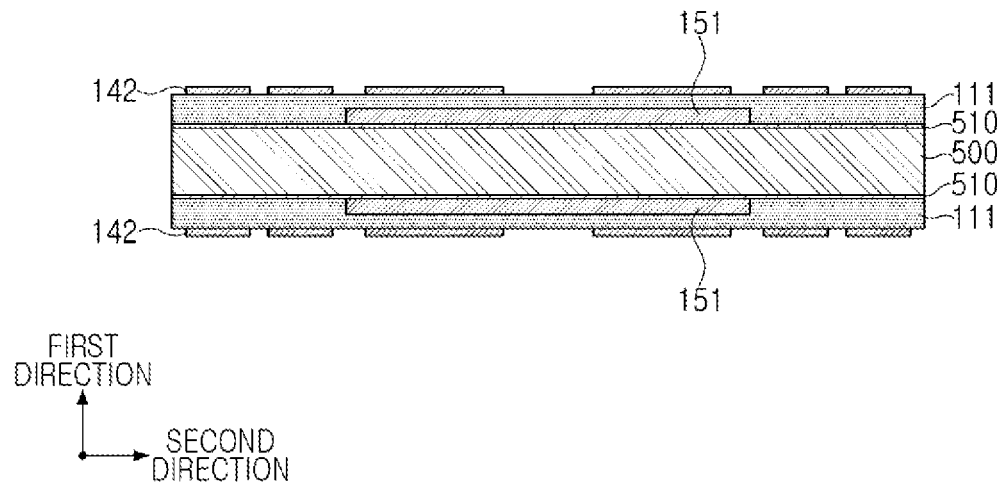

Referring to FIG. 13C, a first insulating layer 111 embedding the first plating layer 151 may be formed on the metal layer 510 of the carrier substrate 500. The first insulating layer 111 may be formed by laminating and then curing an uncured layer including an insulating material. Alternatively, the first insulating layer 111 may be formed by applying and then curing an insulating material. Thereafter, a second wiring layer 142 may be formed on the first insulating layer 111 by performing a plating process such as AP, SAP, MSAP, or TT.

Figure 13D:
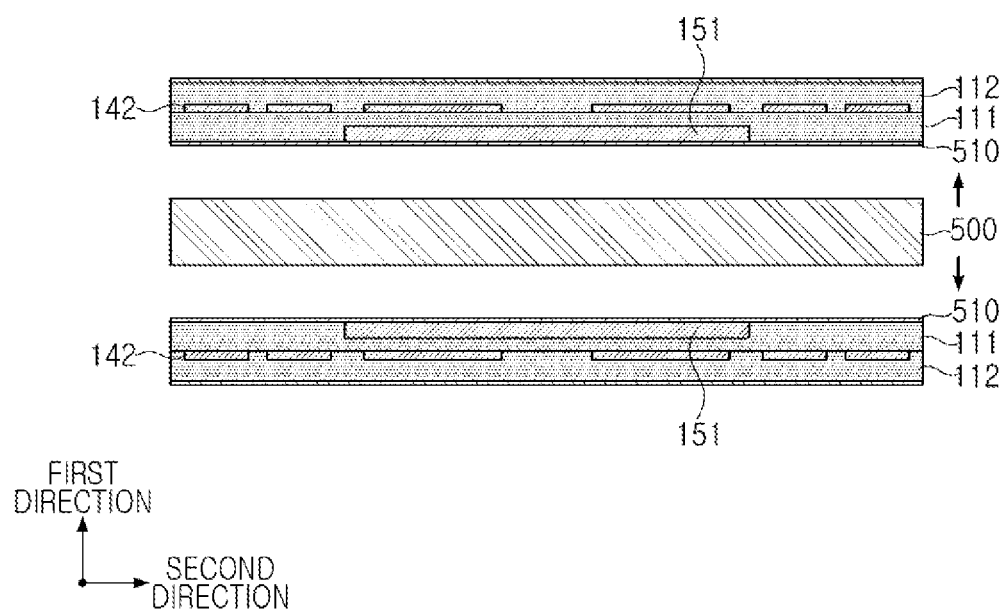

Referring to FIG. 13D, a second insulating layer 112 embedding the second wiring layer 142 may be formed on the first insulating layer 111. The second insulating layer 112 may be formed by laminating and then curing an uncured layer including an insulating material. Alternatively, the second insulating layer 112 may be formed by applying and then curing an insulating material. Thereafter, the carrier substrate 500 may be removed. For example, the carrier substrate 500 and the metal layer 510 may be separated from each other. The release layer may be used to separate the carrier substrate 500 and the metal layer 510 from each other, but the separation method is not limited thereto.

Figure 13E:
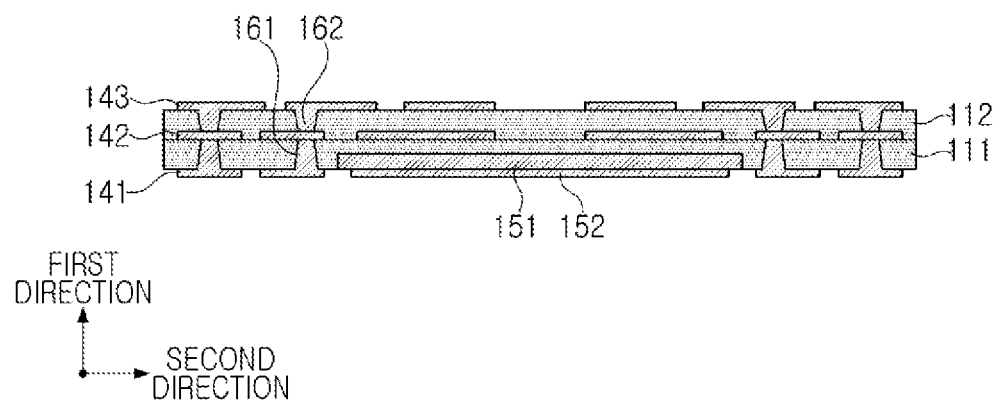

Referring to FIG. 13E, via holes may be formed in each of the first and second insulating layers 111 and 112 using a laser drill or the like, and then first and second via layers 161 and 162 may be formed in the first and second insulating layers 111 and 112, respectively, through a plating process. In addition, first and third wiring layers 141 and 143 may be formed on the first and second insulating layers 111 and 112, respectively, through the plating process. In addition, a second plating layer 152 may be formed on the first plating layer 151 through the plating process. The first and second via layers 161 and 162, the first and third wiring layers 141 and 143, and the second plating layer 152 may be formed through a single plating process such as AP, SAP, MSAP, TT.

Figure 13F:
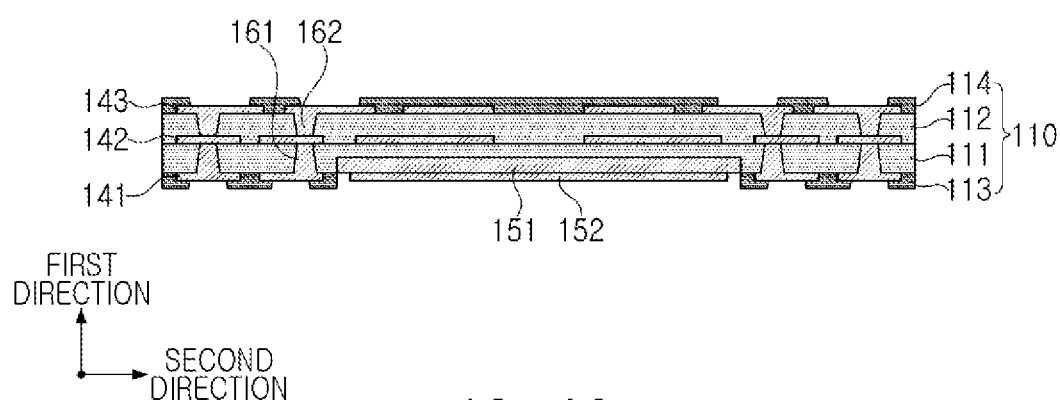

Referring to FIG. 13F, first and second resist layers 113 and 114 may be formed. In addition, each of the first and second resist layers 113 and 114 may be patterned to form a plurality of openings. One of the plurality of openings in the first resist layer 113 may expose the second plating layer 152, and may be included in a cavity C later. Each of the first and second resist layers 113 and 114 may be formed by, for example, forming a solder resist layer and then patterning the solder resist layer to have a plurality of openings using a photolithography process or the like. Thereafter, if necessary, a surface of the first resist layer 113 may be modified through plasma treatment or the like.

Figure 13G:
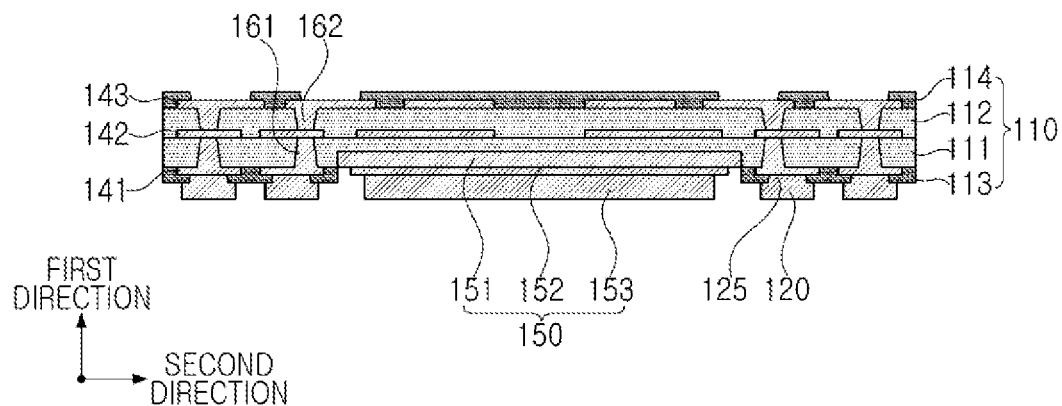

Referring to FIG. 13G, a plurality of bumps 120 may be formed on the first resist layer 113. Also, a plurality of bump vias 125 may be formed in the plurality of openings of the first resist layer 113, respectively. In addition, a third plating layer 153 may be formed on the second plating layer 152. At this time, a plating structure 150 may be formed. The plurality of bumps 120, the plurality of bump vias 125, and the third plating layer 153 may be formed by a plating process such as AP, SAP, MSAP, or TT.

Figure 13H:
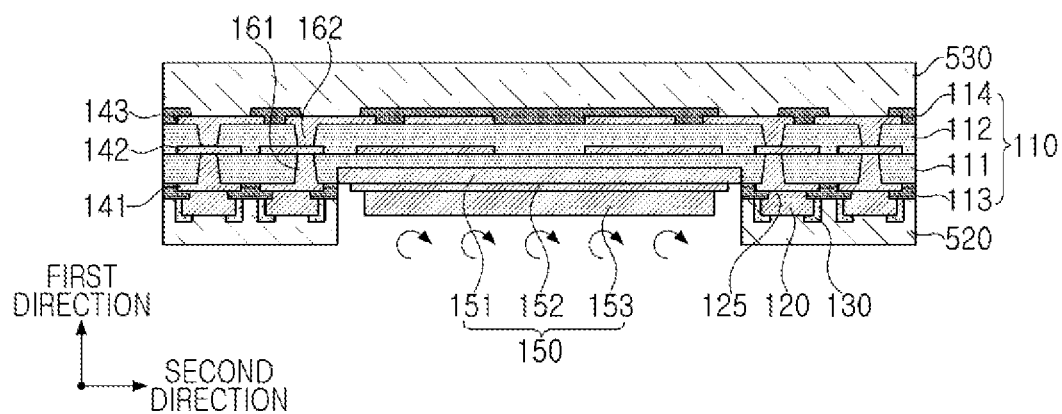

Referring to FIG. 13H, a plurality of insulating walls 130 surrounding the plurality of bumps 120, respectively, may be formed on the first resist layer 113. The plurality of insulating walls 130 may be formed by forming a solder resist layer and then patterning the solder resist layer using a photolithography process or the like. Thereafter, all the regions except the plating structure 150 may be covered with dry films 520 and 530, and an etching process may be performed on the plating structure 150.

Figure 13I:
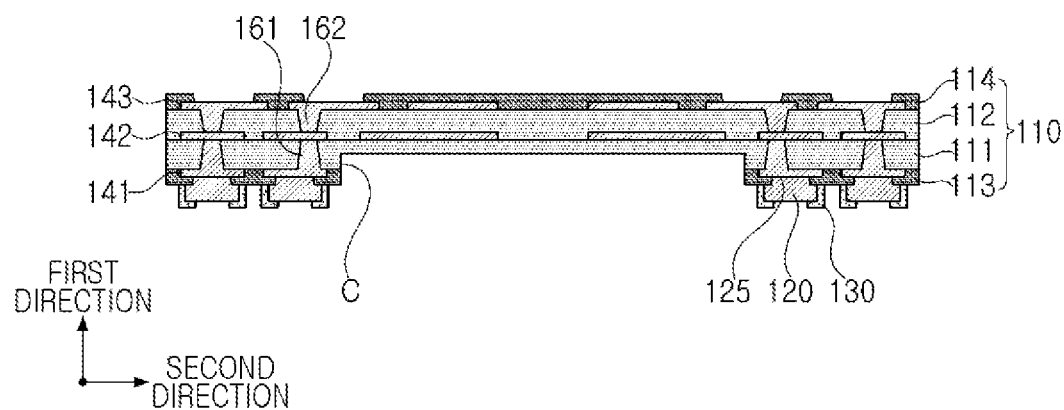

Referring to FIG. 13I, the cavity C may be formed in a region where the plating structure 150 is removed. Thereafter, the dry films 520 and 530 may be removed. Then, the above-described printed circuit board 100E according to another exemplary embodiment may be manufactured. However, this is merely an example of a manufacturing method, and the above-described printed circuit board 100E according to another exemplary embodiment may be manufactured through different processes.

Concerning the other details, the details described above for the printed circuit boards 100A, 100B, 100C, 100D, and 100E may also be applicable to the method for manufacturing the printed circuit board 100E according to another exemplary embodiment unless contradictory, and the overlapping description will not be repeated.

Figure 14:
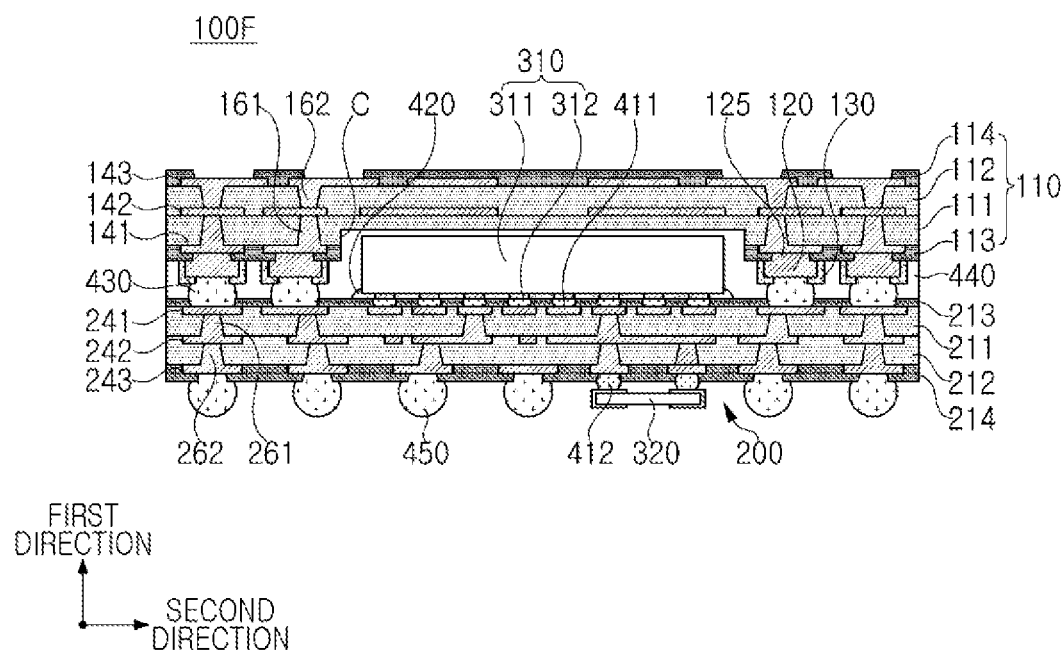
FIG. 14 is a schematic cross-sectional view illustrating a modified example of the printed circuit board of FIG. 11.

FIG. 14 is a schematic cross-sectional view illustrating a modified example of the printed circuit board of FIG. 11.

Referring to FIG. 14, a printed circuit board 100F according to a modified exemplary embodiment may have a package structure in which a wiring substrate 200 with electronic components 310 and 320 mounted thereon is disposed under the above-described printed circuit board 100E in a substrate-on-substrate form. Here, the above-described printed circuit board 100E may be used as an interposer substrate including a cavity. For example, the printed circuit board 100F according to a modified exemplary embodiment may further include a wiring substrate 200 including a plurality of insulating layers 211, 212, 213, and 214, a plurality of wiring layers 241, 242, and 243, and a plurality of via layers 261 and 262 and spaced apart from the insulating member 110 above the insulating member 110, a first electronic component 310 mounted on an upper side of the wiring substrate 200, a second electronic component 320 mounted on a lower side of the wiring substrate 200, a plurality of connection conductors 430 connecting the plurality of bumps 120, respectively, to the plurality of wiring layers 241, 242, and 243, a molding material 440 filling a space between the insulating member 110 and the wiring substrate 200 and embedding the first electronic component 310 and the plurality of connection conductors 430, and/or a plurality of electrical connection metals 450 disposed on the lower side of the wiring substrate 200 and connected to the plurality of wiring layers 241, 242, and 243.

Meanwhile, in the printed circuit board 100F according to a modified exemplary embodiment, at least a portion of the first electronic component 310 may be disposed in the cavity C. In this case, it is possible to further increase a depth of the cavity C substantially as much as a height and/or a thickness of the plurality of bumps 120, thereby reducing an overall thickness of the package structure while suppressing warpage. In addition, the plurality of bumps 120 make it possible to reduce a distance between the substrates, thereby reducing a pitch of the plurality of connection conductors 430.

In addition, in the printed circuit board 100F according to a modified exemplary embodiment, since the plurality of bumps 120 are surrounded by the plurality of insulating walls 130, the plurality of connection conductors 430 can be easily attached to the plurality of bumps 120. Therefore, a package assembly process can be more easily performed.

In addition, in the printed circuit board 100F according to a modified exemplary embodiment, the plurality of insulating walls 130 may be spaced apart from each other on the insulating member 110, and a space between the plurality of insulating walls 130 may extend to the cavity C, and preferably further to an outer edge of the insulating member 110, thereby improving flowability when the molding material 440 is injected, even if a depth of the cavity C increases. Therefore, the molding material 440 can be effectively filled between the substrates.

Hereinafter, the components of the printed circuit board 100F according to a modified exemplary embodiment will be described in more detail with reference to FIG. 14.

The wiring substrate 200 may be a package substrate for mounting the electronic components 310 and 320. The wiring substrate 200 may include a first insulating layer 211, a second insulating layer 212 disposed on a lower surface of the first insulating layer 211, a first resist layer 213 disposed on an upper surface of the first insulating layer 211, a second resist layer 214 disposed on a lower surface of the second insulating layer 212, a first wiring layer 241 embedded in the first insulating layer 211 and at least partially covered by the first resist layer 213, a second wiring layer 242 disposed on the lower surface of the first insulating layer 211 and embedded in the second insulating layer 212 so that an upper surface of the second wiring layer 242 is exposed to an upper surface of the second insulating layer 212, a third wiring layer 243 disposed on the lower surface of the second insulating layer 212 and at least partially covered by the second resist layer 214, a first via layer 261 penetrating through the first insulating layer 211 and connecting the first and second wiring layers 241 and 242 to each other, and/or a second via layer 262 penetrating through the second insulating layer 212 and connecting the second and third wiring layers 242 and 243 to each other. The wiring substrate 200 may be a coreless substrate as described above, but may also be a cored substrate if necessary.

Each of the first and second insulating layers 211 and 212 may include an insulating material. The insulating material may include a thermosetting resin such as an epoxy resin, a thermoplastic resin such as a polyimide resin, or a material containing an inorganic filler, an organic filler, and/or a glass fiber together with the thermosetting or thermoplastic resin. The insulating material may be a photosensitive material and/or a non-photosensitive material. For example, the applicable insulating material may be PID, ABF, PPG, RCC, or the like, but is not limited thereto. As an insulating material, another type of polymer material is applicable. The first and second insulating layers 211 and 212 may include the same type of insulating material, but are not limited thereto, and may include different types of insulating materials. The second insulating layer 212 may include a single layer as illustrated, but may include a plurality of layers differently from what is illustrated, and the specific number of layers is not particularly limited.

The first and second resist layers 213 and 214 may include known solder resist layers, but are not limited thereto. For example, the first and second resist layers 213 and 214 may include ABF, which contains a thermosetting resin and an inorganic filler. The first and second resist layers 213 and 214 may be disposed on the outermost sides of the wiring substrate 200, respectively, to protect patterns and the like inside the wiring substrate 200 from the outside. Each of the first and second resist layers 213 and 214 may have a plurality of openings. For example, the first resist layer 213 may have a plurality of openings at least partially exposing the first wiring layer 241. Also, the second resist layer 214 may have a plurality of openings at least partially exposing the third wiring layer 243. If necessary, a surface treatment layer including a nickel (Ni) layer and/or a gold (Au) layer may be formed on a surface of each of the first and third wiring layers 241 and 243 exposed through the openings.

Each of the first to third wiring layers 241 to 243 may include a metal material. The metal material may include copper (Cu), aluminum (Al), silver (Ag), tin (Sn), gold (Au), nickel (Ni), lead (Pb), titanium (Ti), and/or an alloy thereof. The first to third wiring layers 241 to 243 may perform various functions depending on how the wiring layers are designed. For example, the first to third wiring layers 241 to 243 may include ground patterns, power patterns, signal patterns, or the like. Here, the signal patterns may include various signals, e.g., data signals, other than ground patterns, power patterns, and the like. Each of these patterns may include a line pattern, a plane pattern, and/or a pad pattern. Like the second insulating layer 212, the second wiring layer 242 may include a single layer as illustrated, but may include a plurality of layers differently from what is illustrated, and the specific number of layers is not particularly limited. Each of the first to third wiring layers 241 to 243 may include an electroless plating layer (or chemical copper) and an electrolytic plating layer (or electrical copper), but is not limited thereto.

Each of the first and second via layers 261 and 262 may include a metal material. The metal material may include copper (Cu), aluminum (Al), silver (Ag), tin (Sn), gold (Au), nickel (Ni), lead (Pb), titanium (Ti), and/or an alloy thereof. The first and second via layers 261 and 262 may perform various functions depending on how the via layers are designed. For example, the first and second via layers 261 and 262 may include connection vias for signal connection, connection vias for ground connection, connection vias for power connection, or the like. The first and second via layers 261 and 262 may be tapered in the same direction. For example, both the first and second via layers 261 and 262 may be tapered upwardly. Each of the first and second via layers 261 and 262 may be formed by filling via holes with the metal material or by applying the metal material along wall surfaces of via holes. The respective connection vias of the first and second via layers 261 and 262 may have a stack via relationship or a staggered via relationship. Like the second insulating layer 212 and the second wiring layer 242, the second via layer 262 may include a single layer as illustrated, but may include a plurality of layers differently from what is illustrated, and the specific number of layers is not particularly limited. Each of the first and second via layers 261 and 262 may include an electroless plating layer (or chemical copper) and an electrolytic plating layer (or electrical copper), but is not limited thereto. The first via layer 261 may be formed by the same plating process as the second wiring layer 242, such that the first via layer 261 and the second wiring layer 242 are integrated with each other without a boundary therebetween. The second via layer 262 may be formed by the same plating process as the third wiring layer 243, such that the second via layer 262 and the third wiring layer 243 are integrated with each other without a boundary therebetween.

Each of the first and second electronic components 310 and 320 may be an active component and/or a passive component in various types. For example, each of the first and second electronic components 310 and 320 may include an integrated circuit (IC) die, that is, a semiconductor chip, in various types, but is not limited thereto. Each of the first and second electronic components 310 and 320 may include a chip-type passive component such as a chip capacitor, e.g., a multilayer ceramic capacitor (MLCC), and a chip inductor, e.g., a power inductor (PI). As a non-limiting example, the first electronic component 310 may include a semiconductor chip including a body 311 in which an integrated circuit is formed and connection terminals 312 disposed on an active surface of the body 311, and the second electronic component 320 may include a chip capacitor, but the first and second electronic components 310 and 320 are not limited thereto.

The first and second electronic components 310 and 320 may be surface-mounted on the wiring substrate 200 through first and second connection conductors 411 and 412, respectively. The first and second connection conductors 411 and 412 may include a low melting point metal having a lower melting point than copper (Cu), for example, tin (Sn) or an alloy containing tin (Sn). For example, the first and second connection conductors 411 and 412 may include solder. If necessary, the first electronic component 310 may be fixed to the wiring substrate 200 using an underfill 420 containing a resin having adhesive properties, such as an epoxy resin, after being surface-mounted on the wiring substrate 200 through the first connection conductors 411.

The plurality of connection conductors 430 may be solder ball joints for substrate-on-substrate connection. For example, each of the plurality of connection conductors 430 may be of a ball type in which a copper core is wrapped with solder, but is not limited thereto, and may be of a general solder ball type. Each of the plurality of connection conductors 430 is not limited thereto, and may include a conductive adhesive material other than solder. Concerning the plurality of connection conductors 430, the number thereof, a distance therebetween, an arrangement form thereof, etc. are not particularly limited, and may be adjusted depending on design.

The molding material 440 may mold the first electronic component 310, the underfill 420, and the plurality of connection conductors 430, etc. to protect them. The molding material 440 may include an epoxy resin or the like, but the material is not particularly limited thereto, and may include another type of resin material having excellent flowability.

The electrical connection metals 450 may physically and/or electrically connect the printed circuit board 100F to the outside. For example, the printed circuit board 100F may be a ball grid array (BGA) type substrate. The electrical connection metals 450 may include a low melting point metal having a lower melting point than copper (Cu), for example, tin (Sn) or an alloy containing tin (Sn). For example, the electrical connection metals 450 may include solder, but this is merely an example, and the material is not particularly limited thereto. The electrical connection metals 450 may be lands, balls, pins, or the like. Each of the electrical connection metals 450 may be multi-layered or single-layered. The electrical connection metal 450 may include a copper pillar and solder when multilayered, and may include tin-silver solder when single-layered, but this is also merely an example, the material is not limited thereto. Concerning the electrical connection metals 450, the number thereof, a distance therebetween, an arrangement form thereof, etc. are not particularly limited, and may be modified well according to design requirements.

Concerning the other details, the details described above for the printed circuit boards 100A, 100B, 100C, 100D, and 100E may also be applicable to the printed circuit board 100F according to a modified exemplary embodiment unless contradictory, and the overlapping description will not be repeated.

Figure 15:
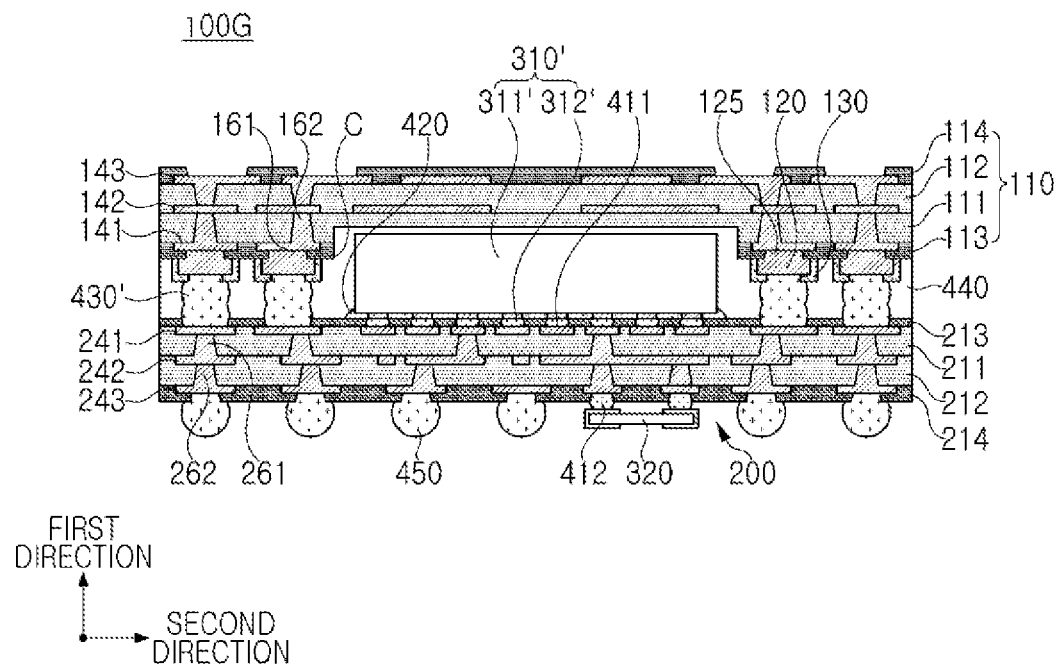
FIG. 15 is a schematic cross-sectional view illustrating another modified example of the printed circuit board of FIG. 11.

FIG. 15 is a schematic cross-sectional view illustrating another modified example of the printed circuit board of FIG. 11.

Referring to FIG. 15, a printed circuit board 100G according to another modified exemplary embodiment may have a package structure in which a wiring substrate 200 with electronic components 310' and 320 mounted thereon is disposed under the above-described printed circuit board 100E in a substrate-on-substrate form. Here, the above-described printed circuit board 100E may be used as an interposer substrate including a cavity. For example, the printed circuit board 100G according to another modified exemplary embodiment may further include a wiring substrate 200 including a plurality of insulating layers 211, 212, 213, and 214, a plurality of wiring layers 241, 242, and 243, and a plurality of via layers 261 and 262 and spaced apart from the insulating member 110 above the insulating member 110, a first electronic component 310' mounted on an upper side of the wiring substrate 200, a second electronic component 320 mounted on a lower side of the wiring substrate 200, a plurality of connection conductors 430' connecting the plurality of bumps 120, respectively, to the plurality of wiring layers 241, 242, and 243, a molding material 440 filling a space between the insulating member 110 and the wiring substrate 200 and embedding the first electronic component 310' and the plurality of connection conductors 430', and/or a plurality of electrical connection metals 450 disposed on the lower side of the wiring substrate 200 and connected to the plurality of wiring layers 241, 242, and 243.

Meanwhile, the printed circuit board 100G according to another modified exemplary embodiment is different from the above-described printed circuit board 100F according to a modified exemplary embodiment in that the first electronic component 310' may be thicker than the first electronic component 310. The thickness may be determined based on the first direction. For example, a body 311' and/or connection terminals 312' of the first electronic component 310' may be thicker than the body 311 and/or the connection terminals 312 of the first electronic component 310. Accordingly, the plurality of connection conductors 430' may also be thicker than the plurality of connection conductors 430. However, even in this case, the plurality of bumps 120 make it possible to maintain a distance between the substrates at a similar level, thereby maintaining a pitch of the plurality of connection conductors 430' at a similar level.

Concerning the other details, the details described above for the printed circuit boards 100A, 100B, 100C, 100D, 100E, and 100F may also be applicable to the printed circuit board 100G according to another modified exemplary embodiment unless contradictory, and the overlapping description will not be repeated.

Figure 16:
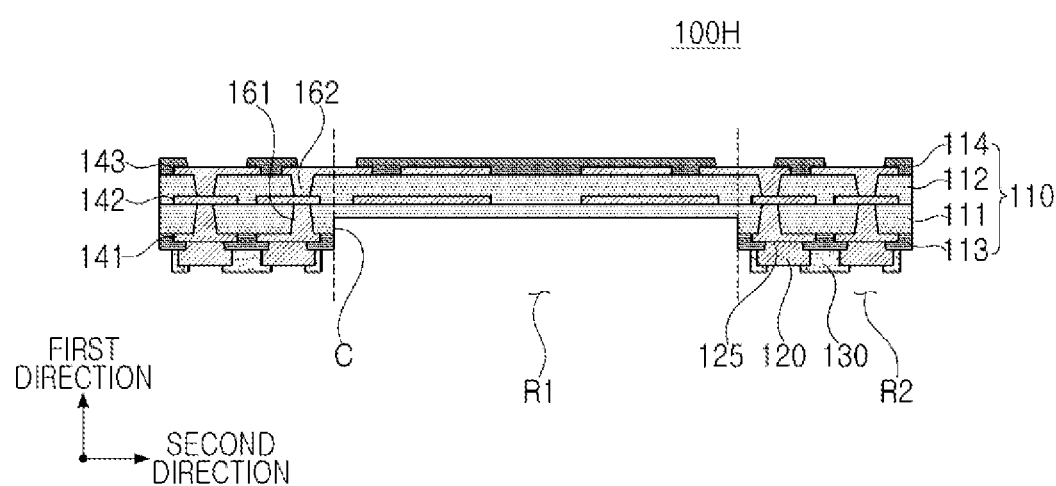
FIG. 16 is a schematic cross-sectional view illustrating another example of a printed circuit board.

FIG. 16 is a schematic cross-sectional view illustrating another example of a printed circuit board.

Figure 17:
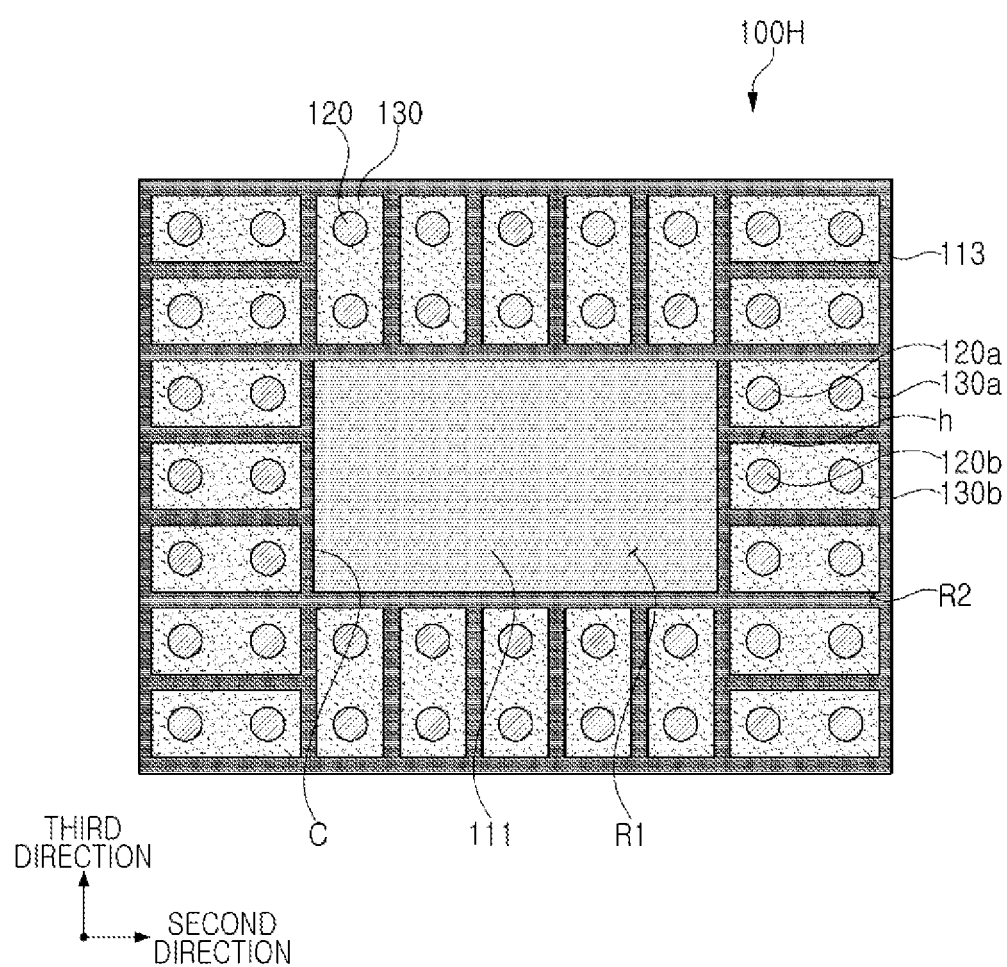
FIG. 17 is a schematic plan view of the printed circuit board of FIG. 16 when viewed from below.

FIG. 17 is a schematic plan view of the printed circuit board of FIG. 16 when viewed from below.

Referring to FIGS. 16 and 17, a printed circuit board 100H according to another exemplary embodiment may include a first insulating layer 111, a first resist layer 113 disposed on a lower surface of the first insulating layer 111, a second insulating layer 112 disposed on an upper surface of the first insulating layer 111, a second resist layer 114 disposed on an upper surface of the second insulating layer 112, a plurality of bumps 120 disposed on a lower surface of the first resist layer 113, a plurality of insulating walls 130 disposed on the lower surface of the first resist layer 113 and surrounding the plurality of bumps 120, a first wiring layer 141 disposed on the lower surface of the first insulating layer 111 and at least partially covered by the first resist layer 113, a plurality of bump vias 125 penetrating through the first resist layer 113 and connecting the plurality of bumps 120 to the first wiring layer 141 respectively, a second wiring layer 142 disposed on the upper surface of the first insulating layer 111 and embedded in the second insulating layer 112 so that a lower surface of the second wiring layer 142 is exposed to a lower surface of the second insulating layer 112, a first via layer 161 penetrating through the first insulating layer 111 and connecting the first and second wiring layers 141 and 142 to each other, a third wiring layer 143 disposed on the upper surface of the second insulating layer 112 and at least partially covered by the second resist layer 114, and a second via layer 162 penetrating through the second insulating layer 112 and connecting the second and third wiring layers 142 and 143 to each other. An insulating member 110 may include the first and second insulating layers 111 and 112 and the first and second resist layers 113 and 114, and have a cavity C. The cavity C may penetrate through the first resist layer 113 and further penetrate through at least a portion of the first insulating layer 111. The printed circuit board 100H according to another exemplary embodiment may be used as an interposer substrate including a cavity, but is not limited thereto.

Meanwhile, in the printed circuit board 100H according to another exemplary embodiment, each of the plurality of insulating walls 130 may surround at least two of the plurality of bumps 120. For example, one first insulating wall 130a may surround a plurality of first bumps 120a, and one second insulating wall 130b may surround a plurality of second bumps 120b. For example, in the plan view, each of the first insulating wall 130a and the second insulating wall 130b may have a substantially rectangular shape. More specifically, each of the first insulating wall 130a and the second insulating wall 130b may have a substantially rectangular block shape, but is not limited thereto. In the plan view, each space h between the plurality of insulating walls 130 may have a trench shape in a direction toward the cavity C from an outer edge of the insulating member 110. A side region R2 may include a space that extends continuously from the outer edge of the insulating member 110 to a wall surface of the cavity C without being blocked by the plurality of insulating walls 130, e.g., the first and second insulating walls 130a and 130b, and the continuously extending space of the side region R2 may include a space between the plurality of insulating walls 130 spaced apart from each other, e.g., the space h between the first and second insulating walls 130a and 130b. Therefore, it is possible to minimize obstruction when a molding material flows later.

In addition, in the printed circuit board 100H according to another exemplary embodiment, for example, each of the plurality of insulating walls 130 may surround side surfaces of at least two of the plurality of bumps 120 and at least partially cover lower surfaces of the at least two of the plurality of bumps 120. Accordingly, in the cross-sectional view, a lower surface of each of the plurality of insulating walls 130 may be further spaced apart from a lower surface of the insulating member 110 than the lower surface of each of the plurality of bumps 120. For example, the plurality of bumps 120 may be surrounded in an SMD type. Therefore, connection conductors can be easily attached to the plurality of bumps 120, and a package assembly process can be easily performed.

Concerning the other details, the details described above for the printed circuit boards 100A, 100B, 100C, 100D, 100E, 100F, and 100G may also be applicable to the printed circuit board 100H according to another exemplary embodiment unless contradictory, and the overlapping description will not be repeated.

FIGS. 18A through 18I are schematic views illustrating examples of processes for manufacturing the printed circuit board of FIG. 16.

Figure 18A:
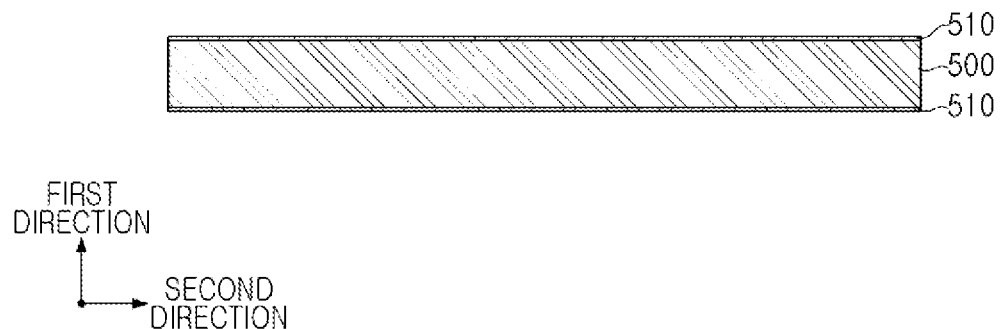
FIGS. 18A through 18I are schematic views illustrating examples of processes for manufacturing the printed circuit board of FIG. 16.

Referring to FIG. 18A, a carrier substrate 500 with a metal layer 510 formed on one or both surfaces thereof may be prepared.

Figure 18B:
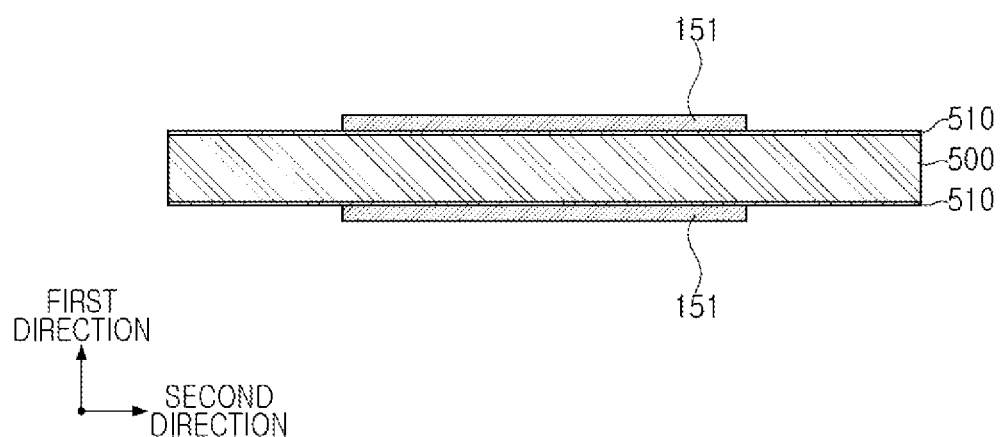

Referring to FIG. 18B, a first plating layer 151 may be formed on the metal layer 510 of the carrier substrate 500.

Figure 18C:
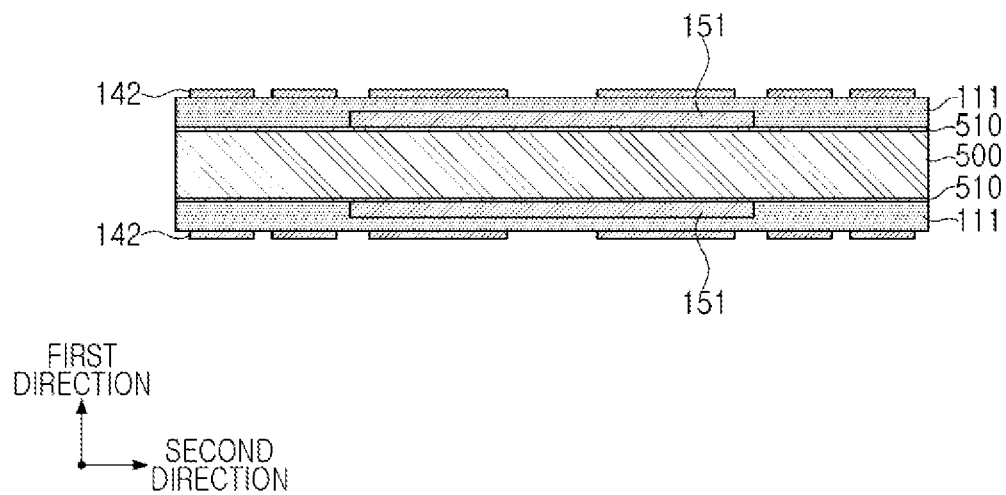

Referring to FIG. 18C, a first insulating layer 111 embedding the first plating layer 151 may be formed on the metal layer 510 of the carrier substrate 500. Thereafter, a second wiring layer 142 may be formed on the first insulating layer 111.

Figure 18D:
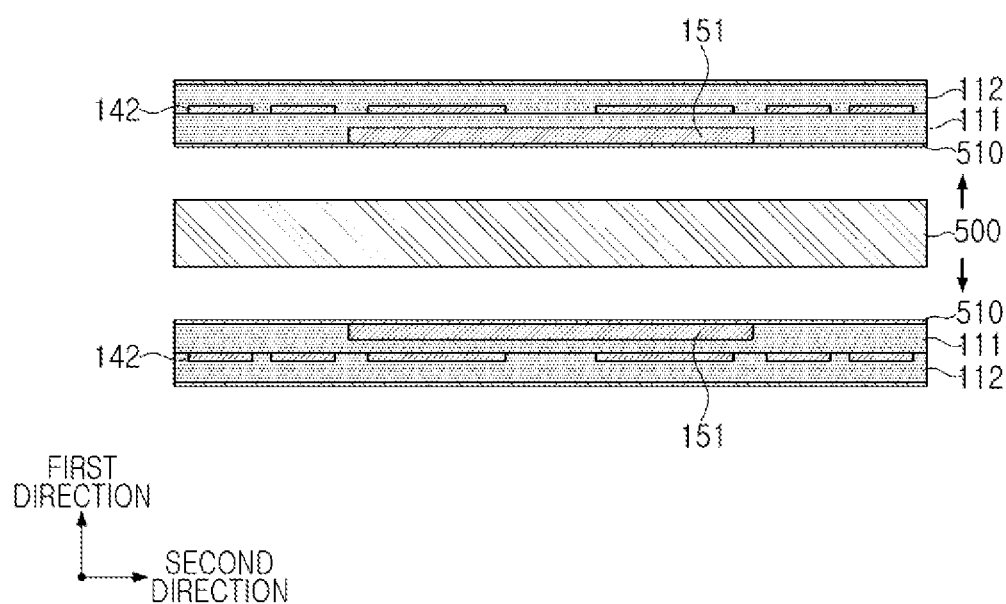

Referring to FIG. 18D, a second insulating layer 112 embedding the second wiring layer 142 may be formed on the first insulating layer 111. Thereafter, the carrier substrate 500 may be removed.

Figure 18E:
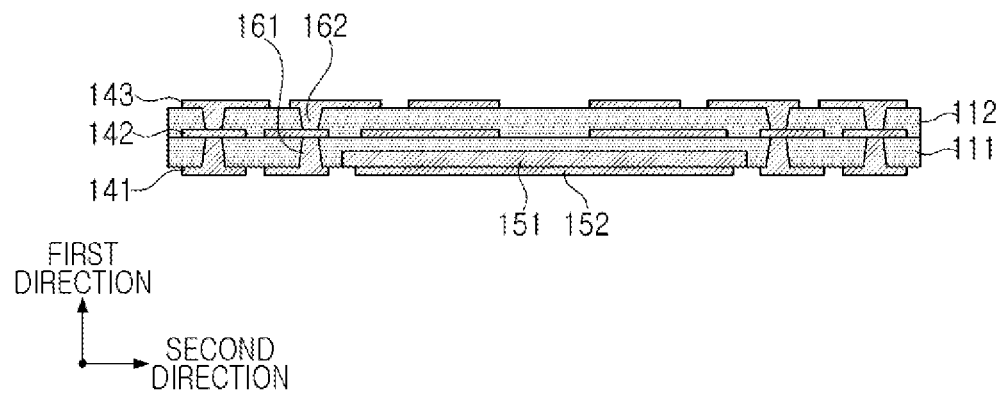

Referring to FIG. 18E, first and second via layers 161 and 162 may be formed in the first and second insulating layers 111 and 112, respectively. In addition, first and third wiring layers 141 and 143 may be formed on the first and second insulating layers 111 and 112, respectively. In addition, a second plating layer 152 may be formed on the first plating layer 151.

Figure 18F:
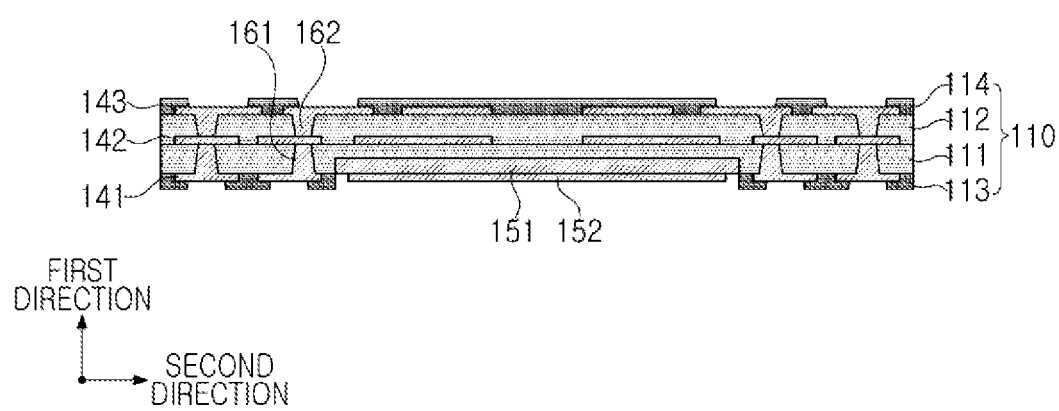

Referring to FIG. 18F, first and second resist layers 113 and 114 may be formed. In addition, each of the first and second resist layers 113 and 114 may be patterned to form a plurality of openings.

Figure 18G:
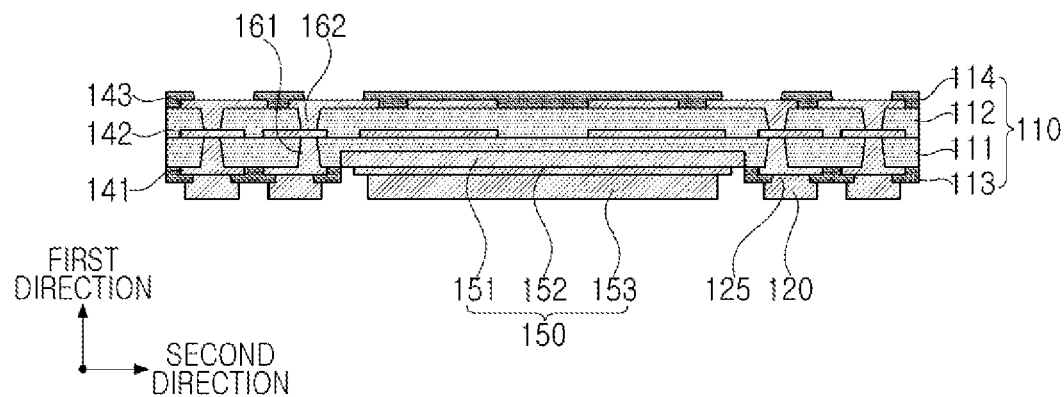

Referring to FIG. 18G, a plurality of bumps 120 may be formed on the first resist layer 113. Also, a plurality of bump vias 125 may be formed in the plurality of openings of the first resist layer 113, respectively. In addition, a third plating layer 153 may be formed on the second plating layer 152. At this time, a plating structure 150 may be formed.

Figure 18H:
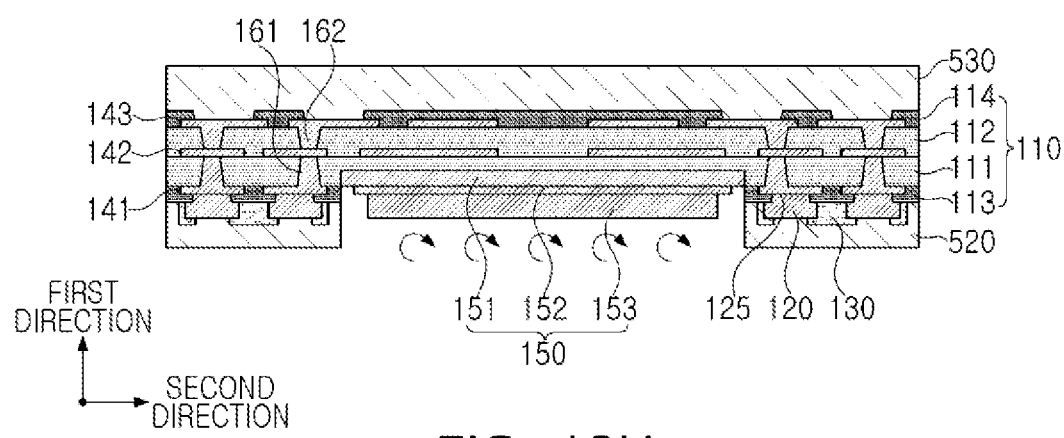

Referring to FIG. 18H, a plurality of insulating walls 130 surrounding the plurality of bumps 120 may be formed on the first resist layer 113. The plurality of insulating walls 130 may be formed by forming a solder resist layer and then patterning the solder resist layer in a trench shape using a photolithography process or the like. Thereafter, all the regions except the plating structure 150 may be covered with dry films 520 and 530, and an etching process may be performed on the plating structure 150.

Figure 18I:
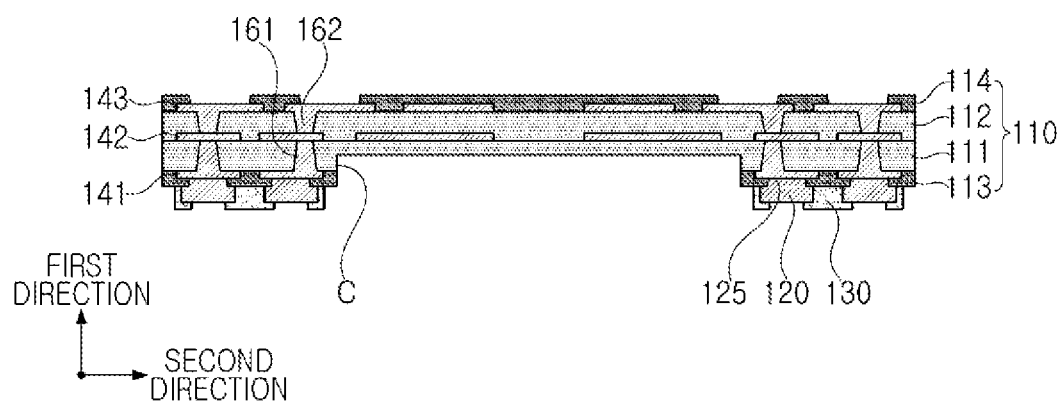

Referring to FIG. 18I, a cavity C may be formed in a region where the plating structure 150 is removed. Thereafter, the dry films 520 and 530 may be removed. Then, the above-described printed circuit board 100H according to another exemplary embodiment may be manufactured. However, this is merely an example of a manufacturing method, and the above-described printed circuit board 100H according to another exemplary embodiment may be manufactured through different processes.

Concerning the other details, the details described above for the printed circuit boards 100A, 100B, 100C, 100D, 100E, 100F, 100G, and 100H and the method for manufacturing the printed circuit board 100E may also be applicable to the method for manufacturing the printed circuit board 100H according to another exemplary embodiment unless contradictory, and the overlapping description will not be repeated.

Figure 19:
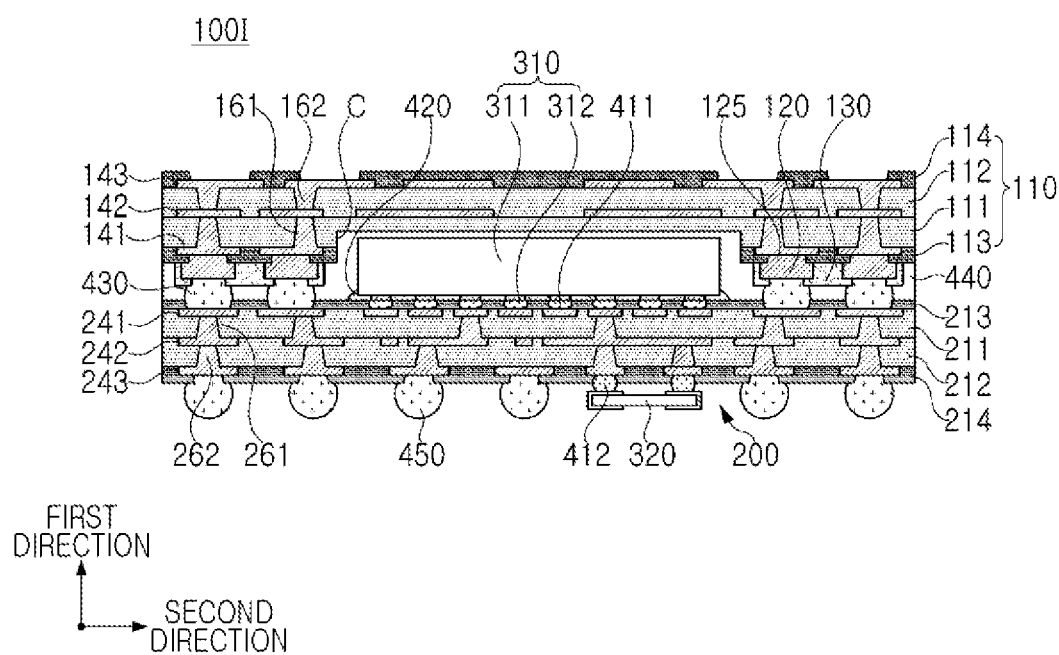
FIG. 19 is a schematic cross-sectional view illustrating a modified example of the printed circuit board of FIG. 16.

FIG. 19 is a schematic cross-sectional view illustrating a modified example of the printed circuit board of FIG. 16.

Figure 20:
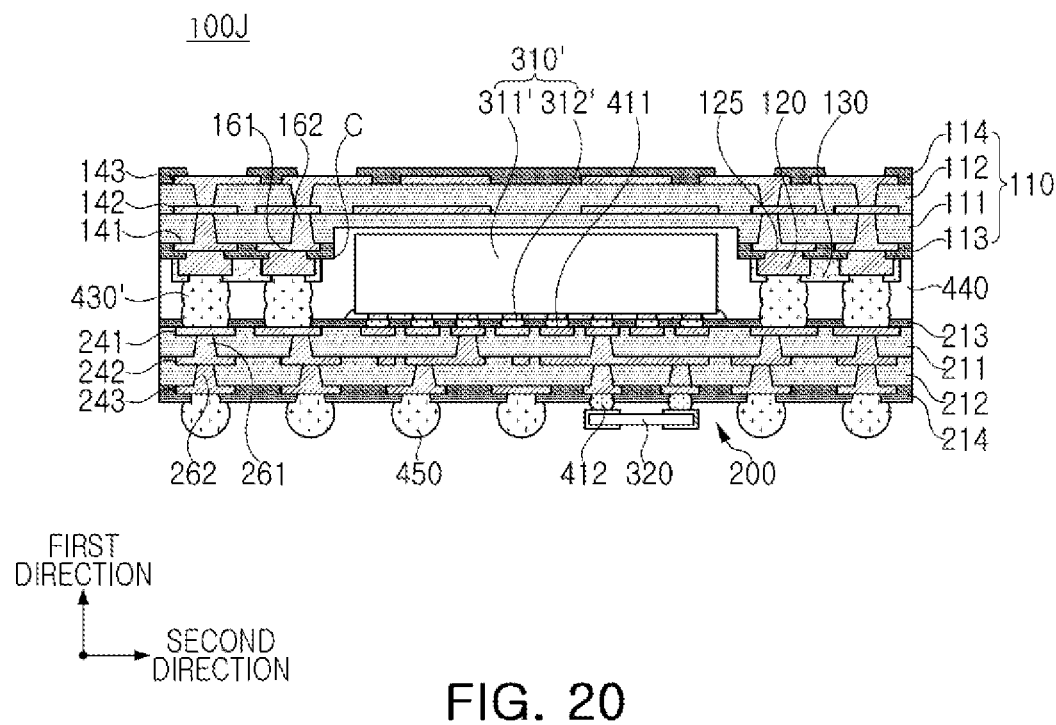
FIG. 20 is a schematic cross-sectional view illustrating another modified example of the printed circuit board of FIG. 16.

FIG. 20 is a schematic cross-sectional view illustrating another modified example of the printed circuit board of FIG. 16.

Referring to FIGS. 19 and 20, each of printed circuit boards 100I and 100J according to modified exemplary embodiments may have a package structure in which a wiring substrate 200 with electronic components 310 or 310' and 320 mounted thereon is disposed under the above-described printed circuit board 100H in a substrate-on-substrate form. Here, the above-described printed circuit board 100H may be used as an interposer substrate including a cavity. For example, each of the printed circuit boards 100I and 100J according to modified exemplary embodiments may further include a wiring substrate 200 including a plurality of insulating layers 211, 212, 213, and 214, a plurality of wiring layers 241, 242, and 243, and a plurality of via layers 261 and 262 and spaced apart from the insulating member 110 above the insulating member 110, a first electronic component 310 or 310' mounted on an upper side of the wiring substrate 200, a second electronic component 320 mounted on a lower side of the wiring substrate 200, a plurality of connection conductors 430 or 430' connecting the plurality of bumps 120, respectively, to the plurality of wiring layers 241, 242, and 243, a molding material 440 filling a space between the insulating member 110 and the wiring substrate 200 and embedding the first electronic component 310 or 310' and the plurality of connection conductors 430 or 430', and/or a plurality of electrical connection metals 450 disposed on the lower side of the wiring substrate 200 and connected to the plurality of wiring layers 241, 242, and 243.

Meanwhile, in each of the printed circuit boards 100I and 100J according to modified exemplary embodiments, there is a trench-shaped space between the plurality of insulating walls 130 spaced apart from each other, and the space extends to the cavity C, and preferably to an outer edge of the insulating member 110, thereby improving flowability when the molding material 440 is injected, even if a depth of the cavity C increases. Therefore, the molding material 440 can be effectively filled between the substrates.

Concerning the other details, the details described above for the printed circuit boards 100A, 100B, 100C, 100D, 100E, 100F, 100G, and 100H may also be applicable to the printed circuit boards 100I and 100J according to modified exemplary embodiments unless contradictory, and the overlapping description will not be repeated.

Figure 21:
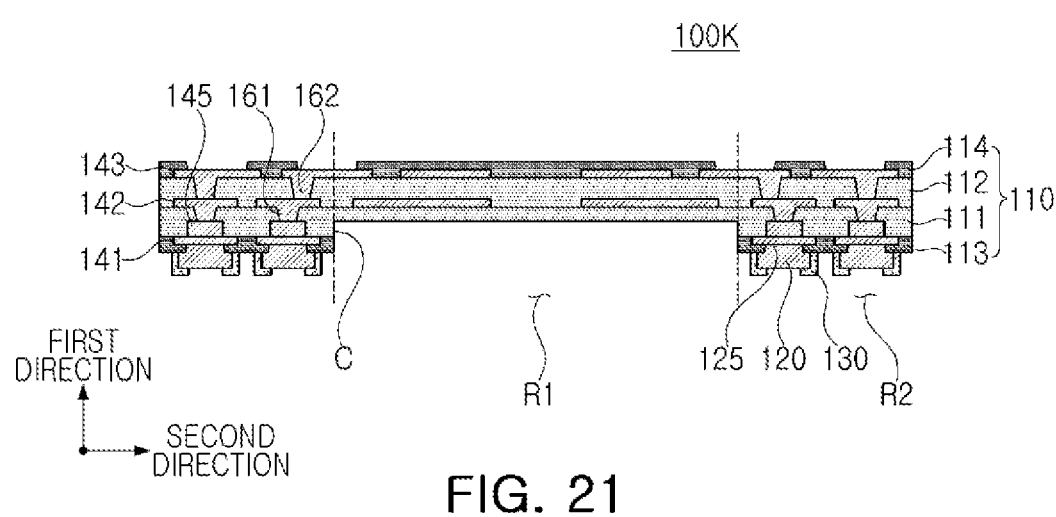
FIG. 21 is a schematic cross-sectional view illustrating another example of a printed circuit board.

FIG. 21 is a schematic cross-sectional view illustrating another example of a printed circuit board.

Figure 22:
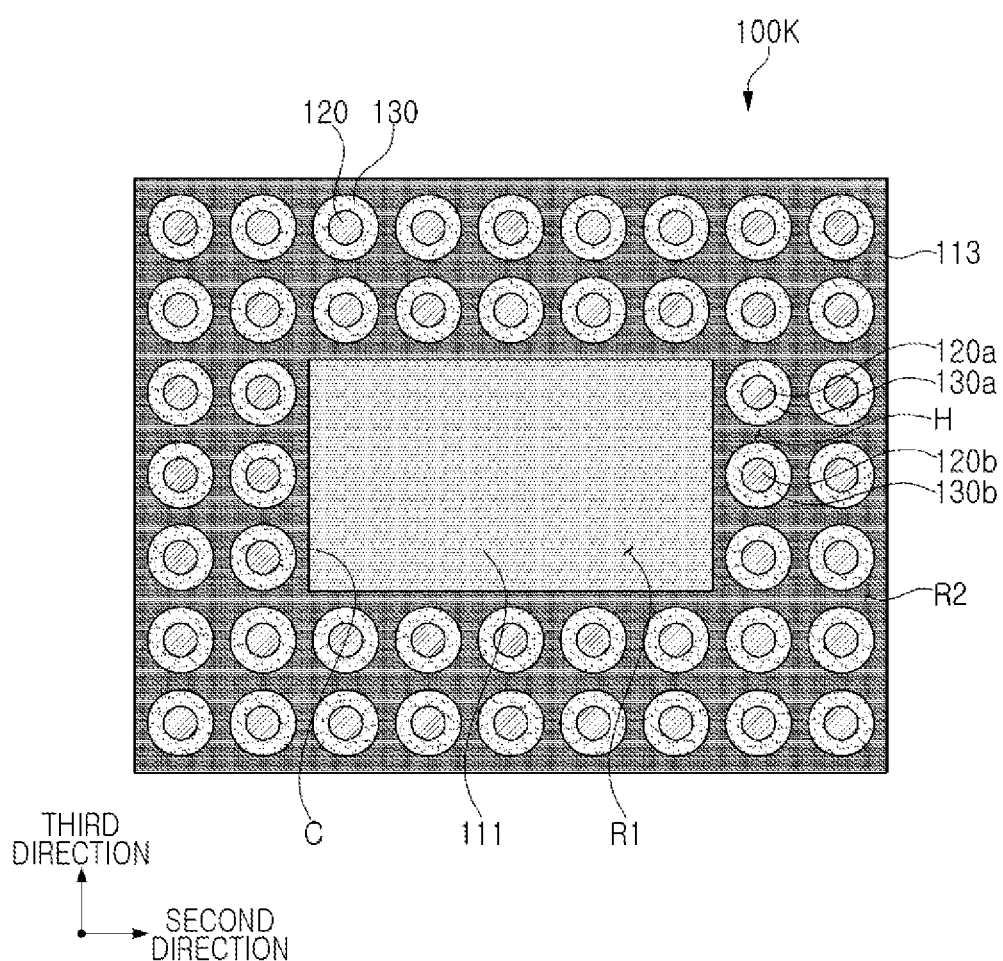
FIG. 22 is a schematic plan view of the printed circuit board of FIG. 21 when viewed from below.

FIG. 22 is a schematic plan view of the printed circuit board of FIG. 21 when viewed from below.

Referring to FIGS. 21 and 22, a printed circuit board 100K according to another exemplary embodiment may include a first insulating layer 111, a first resist layer 113 disposed on a lower surface of the first insulating layer 111, a second insulating layer 112 disposed on an upper surface of the first insulating layer 111, a second resist layer 114 disposed on an upper surface of the second insulating layer 112, a plurality of bumps 120 disposed on a lower surface of the first resist layer 113, a plurality of insulating walls 130 disposed on the lower surface of the first resist layer 113 and surrounding the plurality of bumps 120 respectively, a first wiring layer 141 disposed on the lower surface of the first insulating layer 111 and at least partially covered by the first resist layer 113, a conductive pattern layer 145 embedded in the first insulating layer 111 with a lower surface of the conductive pattern layer 145 contacting an upper surface of the first wiring layer 141, a plurality of bump vias 125 penetrating through the first resist layer 113 and connecting the plurality of bumps 120 to the first wiring layer 141 respectively, a second wiring layer 142 disposed on the upper surface of the first insulating layer 111 and embedded in the second insulating layer 112 so that a lower surface of the second wiring layer 142 is exposed to a lower surface of the second insulating layer 112, a first via layer 161 penetrating through the first insulating layer 111 and connecting the conductive pattern layer 145 and the second wiring layer 142 to each other, a third wiring layer 143 disposed on the upper surface of the second insulating layer 112 and at least partially covered by the second resist layer 114, and a second via layer 162 penetrating through the second insulating layer 112 and connecting the second and third wiring layers 142 and 143 to each other. An insulating member 110 may include the first and second insulating layers 111 and 112 and the first and second resist layers 113 and 114, and have a cavity C. The cavity C may penetrate through the first resist layer 113 and further penetrate through at least a portion of the first insulating layer 111. The printed circuit board 100K according to another exemplary embodiment may be used as an interposer substrate including a cavity, but is not limited thereto.

Meanwhile, in the printed circuit board 100K according to another exemplary embodiment, the conductive pattern layer 145 may be formed together by a plating process when a plating layer for forming the cavity C is formed. Therefore, the conductive pattern layer 145 makes it possible to more effectively control a variation in plating thickness of the plating layer associated with a depth of the cavity C. From this point of view, an upper surface of the conductive pattern layer 145 may be positioned on substantially the same level as a bottom surface of the cavity C. In addition, the conductive pattern layer 145 may be thicker than each of the first to third wiring layers 141 to 143. The thickness may be determined based on the first direction.

Hereinafter, the components of the printed circuit board 100K according to another exemplary embodiment will be described in more detail with reference to FIGS. 21 and 22.

The conductive pattern layer 145 may include a metal material. The metal material may include copper (Cu), aluminum (Al), silver (Ag), tin (Sn), gold (Au), nickel (Ni), lead (Pb), titanium (Ti), and/or an alloy thereof. The conductive pattern layer 145 may perform various functions depending on design. For example, the conductive pattern layer 145 may include ground patterns, power patterns, signal patterns, or the like. Here, the signal patterns may include various signals, e.g., data signals, other than ground patterns, power patterns, and the like. Each of these patterns may include a line pattern, a plane pattern, and/or a pad pattern. The conductive pattern layer 145 may include an electroless plating layer (or chemical copper) and an electrolytic plating layer (or electrical copper), but is not limited thereto.

The first and second via layers 161 and 162 may be tapered in the same direction. For example, both the first and second via layers 161 and 162 may be tapered downwardly. The first via layer 161 may be formed by the same plating process as the second wiring layer 142, such that the first via layer 161 and the second wiring layer 142 are integrated with each other without a boundary therebetween. The second via layer 162 may be formed by the same plating process as the third wiring layer 143, such that the second via layer 162 and the third wiring layer 143 are integrated with each other without a boundary therebetween.

Concerning the other details, the details described above for the printed circuit boards 100A, 100B, 100C, 100D, 100E, 100F, 100G, 100H, 100I, and 100J may also be applicable to the printed circuit board 100K according to another exemplary embodiment unless contradictory, and the overlapping description will not be repeated.

FIGS. 23A through 23I are schematic views illustrating examples of processes for manufacturing the printed circuit board of FIG. 21.

Figure 23A:
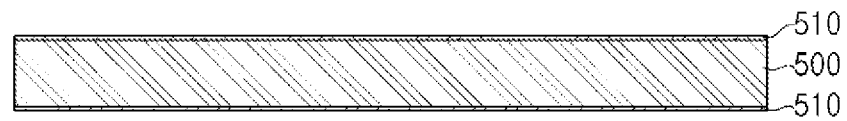
FIGS. 23A through 23I are schematic views illustrating examples of processes for manufacturing the printed circuit board of FIG. 21.

Referring to FIG. 23A, a carrier substrate 500 with a metal layer 510 formed on one or both surfaces thereof may be prepared.

Figure 23B:
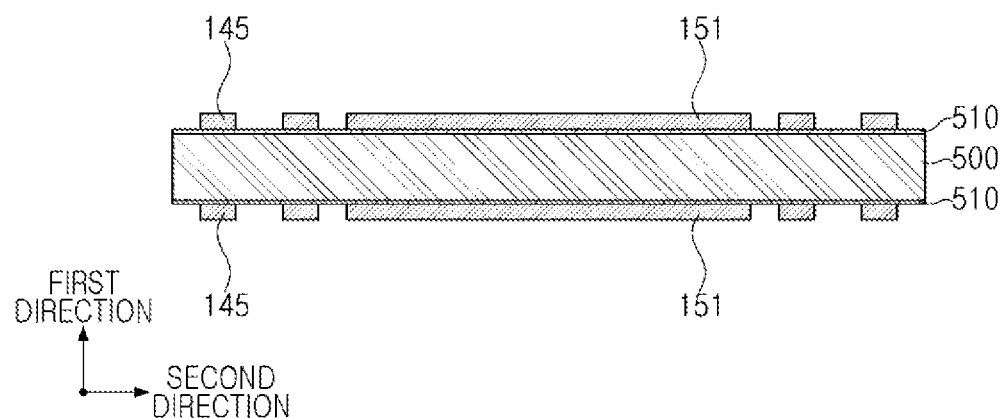

Referring to FIG. 23B, a first plating layer 151 and a conductive pattern layer 145 may be formed on the metal layer 510 of the carrier substrate 500. The conductive pattern layer 145 may be formed together with the first plating layer 151 by a plating process such as AP, SAP, MSAP, or TT, which is thus helpful in controlling a variation in plating thickness of the first plating layer 151.

Figure 23C:
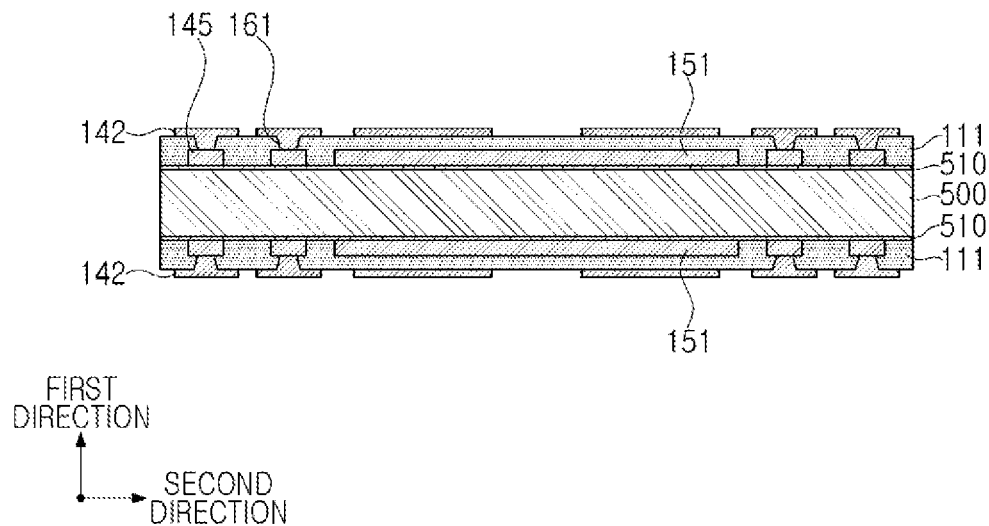

Referring to FIG. 23C, a first insulating layer 111 embedding the first plating layer 151 and the conductive pattern layer 145 may be formed on the metal layer 510 of the carrier substrate 500. Thereafter, a first via layer 161 may be formed in the first insulating layer 111. In addition, a second wiring layer 142 may be formed on the first insulating layer 111.

Figure 23D:
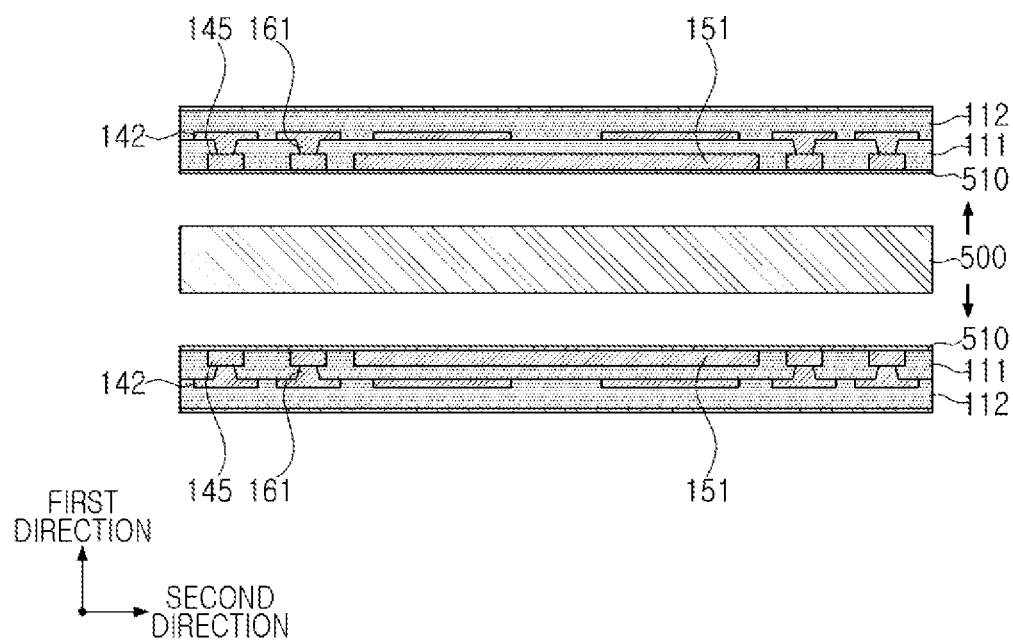

Referring to FIG. 23D, a second insulating layer 112 embedding the second wiring layer 142 may be formed on the first insulating layer 111. Thereafter, the carrier substrate 500 may be removed.

Figure 23E:
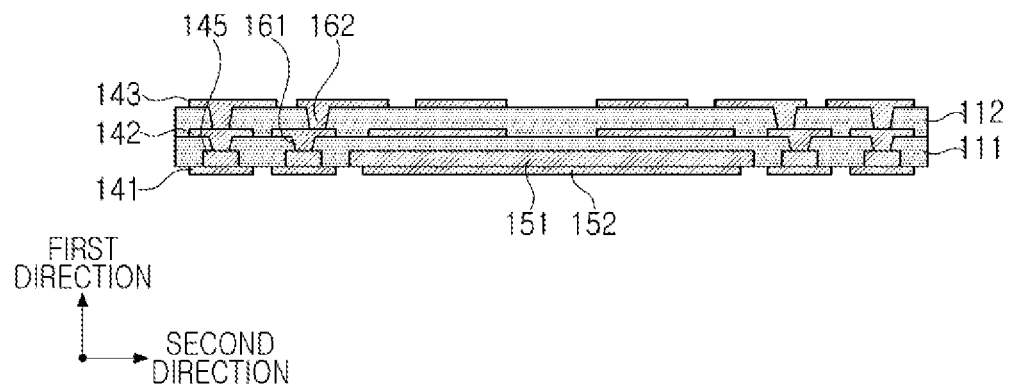

Referring to FIG. 23E, a second via layer 162 may be formed in the second insulating layer 112. In addition, a third wiring layer 143 may be formed on the second insulating layer 112. At this time, a first wiring layer 141 may be formed on the first insulating layer 111. In addition, a second plating layer 152 may be formed on the first plating layer 151.

Alternatively, after forming the second insulating layer 112 embedding the second wiring layer 142 and before removing the carrier substrate 500, the second via layer 162 may be formed in the second insulating layer 112 and the third wiring layer 143 may be formed on the second insulating layer 112. Then, the carrier substrate 500 may be removed. Thereafter, the first wiring layer 141 may be formed on the first insulating layer 111, and the second plating layer 152 may be formed on the first plating layer 151.

Figure 23F:
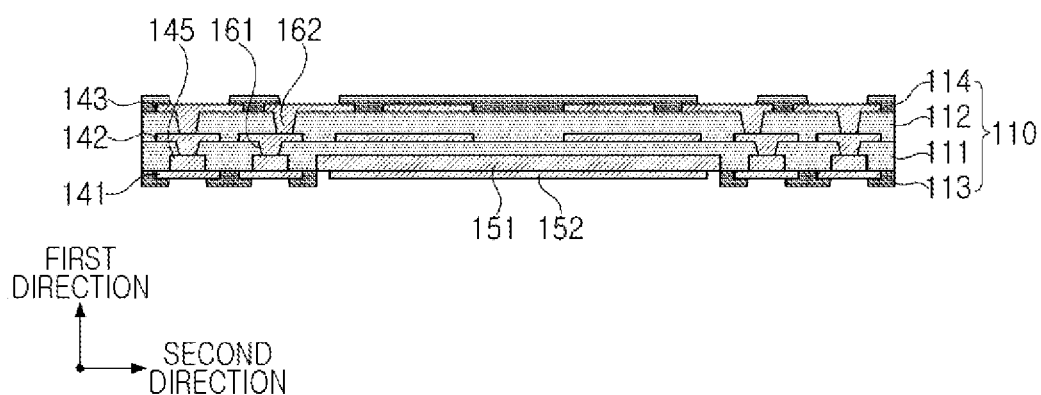

Referring to FIG. 23F, first and second resist layers 113 and 114 may be formed. In addition, each of the first and second resist layers 113 and 114 may be patterned to form a plurality of openings.

Figure 23G:
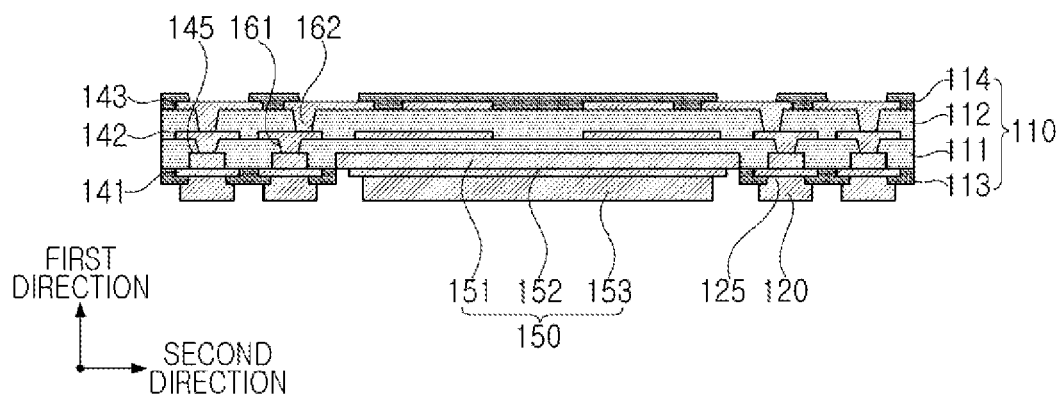

Referring to FIG. 23G, a plurality of bumps 120 may be formed on the first resist layer 113. Also, a plurality of bump vias 125 may be formed in the plurality of openings of the first resist layer 113, respectively. In addition, a third plating layer 153 may be formed on the second plating layer 152. At this time, a plating structure 150 may be formed.

Figure 23H:
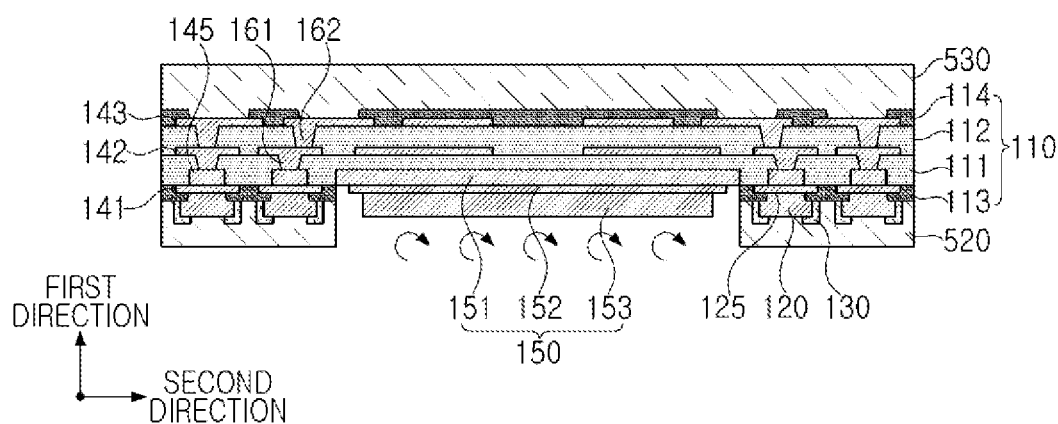

Referring to FIG. 23H, a plurality of insulating walls 130 surrounding the plurality of bumps 120, respectively, may be formed on the first resist layer 113. Thereafter, all the regions except the plating structure 150 may be covered with dry films 520 and 530, and an etching process may be performed on the plating structure 150.

Figure 23I:
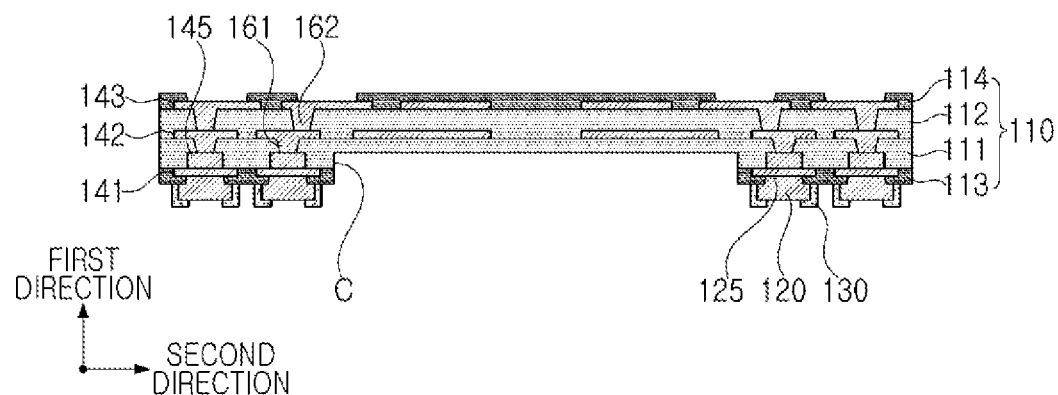

Referring to FIG. 23I, a cavity C may be formed in a region where the plating structure 150 is removed. Thereafter, the dry films 520 and 530 may be removed. Then, the above-described printed circuit board 100K according to another exemplary embodiment may be manufactured. However, this is merely an example of a manufacturing method, and the above-described printed circuit board 100K according to another exemplary embodiment may be manufactured through different processes.

Concerning the other details, the details described above for the printed circuit boards 100A, 100B, 100C, 100D, 100E, 100F, 100G, 100H, 100I, 100J, and 100K, and the methods for manufacturing the printed circuit boards 100E and 100H may also be applicable to the method for manufacturing the printed circuit board 100K according to another exemplary embodiment unless contradictory, and the overlapping description will not be repeated.

Figure 24:
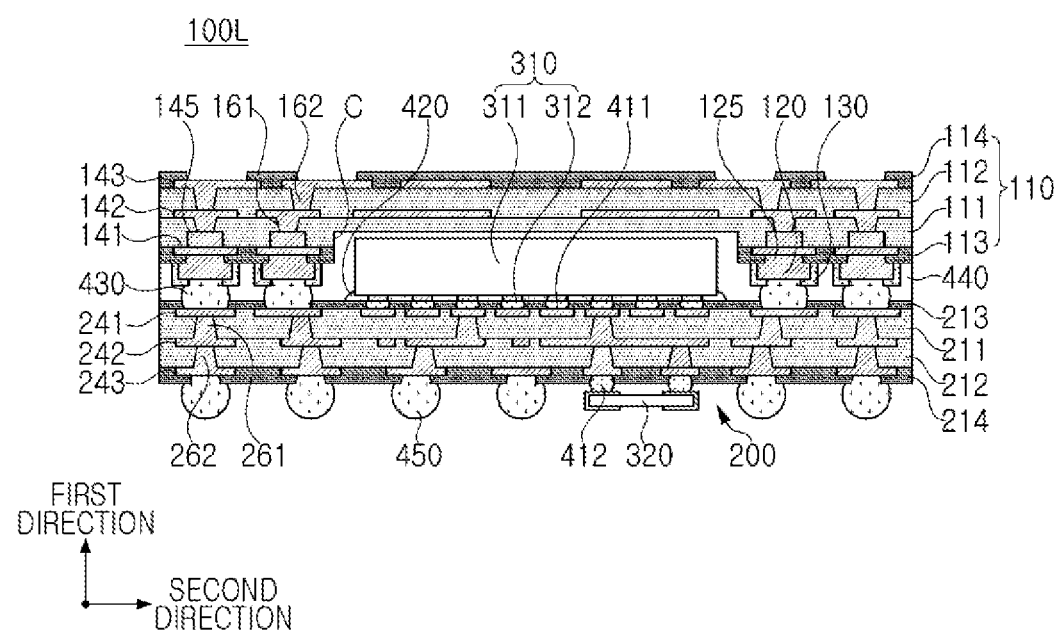
FIG. 24 is a schematic cross-sectional view illustrating a modified example of the printed circuit board of FIG. 21.

FIG. 24 is a schematic cross-sectional view illustrating a modified example of the printed circuit board of FIG. 21.

Figure 25:
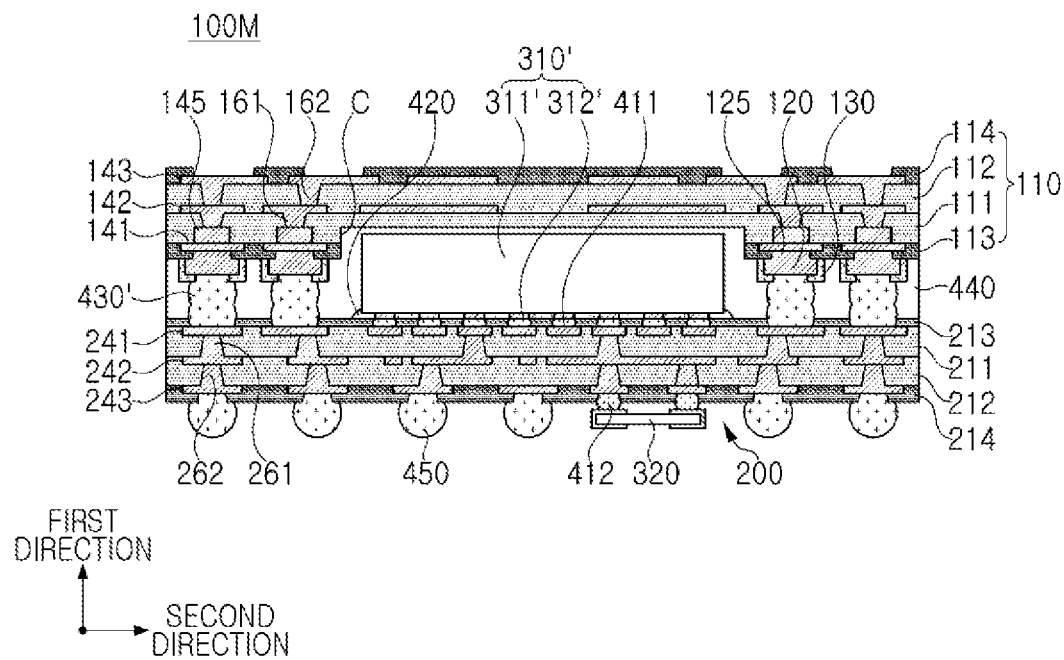
FIG. 25 is a schematic cross-sectional view illustrating another modified example of the printed circuit board of FIG. 21.

FIG. 25 is a schematic cross-sectional view illustrating another modified example of the printed circuit board of FIG. 21.

Referring to FIGS. 24 and 25, each of printed circuit boards 100L and 100M according to modified exemplary embodiments may have a package structure in which a wiring substrate 200 with electronic components 310 or 310' and 320 mounted thereon is disposed under the above-described printed circuit board 100K in a substrate-on-substrate form. Here, the above-described printed circuit board 100K may be used as an interposer substrate including a cavity. For example, each of the printed circuit boards 100L and 100M according to modified exemplary embodiments may further include a wiring substrate 200 including a plurality of insulating layers 211, 212, 213, and 214, a plurality of wiring layers 241, 242, and 243, and a plurality of via layers 261 and 262 and spaced apart from the insulating member 110 above the insulating member 110, a first electronic component 310 or 310' mounted on an upper side of the wiring substrate 200, a second electronic component 320 mounted on a lower side of the wiring substrate 200, a plurality of connection conductors 430 or 430' connecting the plurality of bumps 120, respectively, to the plurality of wiring layers 241, 242, and 243, a molding material 440 filling a space between the insulating member 110 and the wiring substrate 200 and embedding the first electronic component 310 or 310' and the plurality of connection conductors 430 or 430', and/or a plurality of electrical connection metals 450 disposed on the lower side of the wiring substrate 200 and connected to the plurality of wiring layers 241, 242, and 243.

Concerning the other details, the details described above for the printed circuit boards 100A, 100B, 100C, 100D, 100E, 100F, 100G, 100H, 100I, 100J, and 100K may also be applicable to the printed circuit boards 100L and 100M according to modified exemplary embodiments unless contradictory, and the overlapping description will not be repeated.

Figure 26:
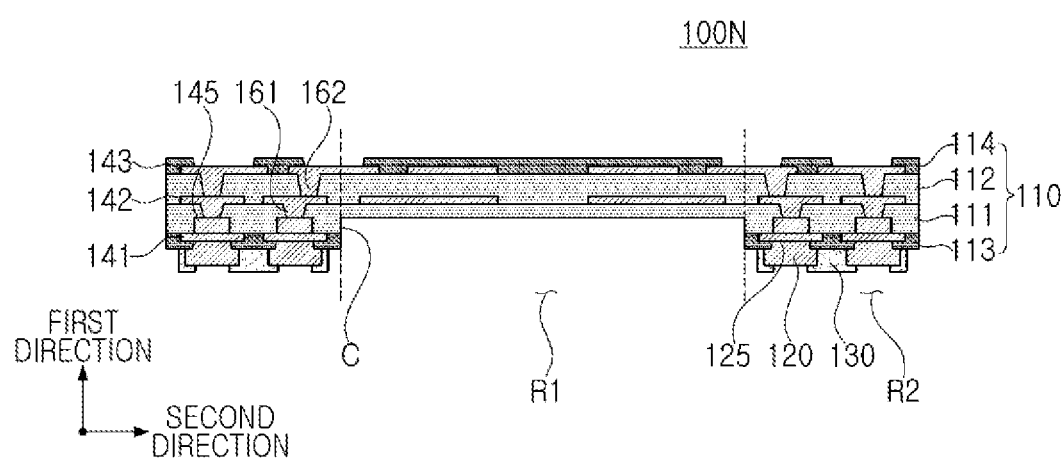
FIG. 26 is a schematic cross-sectional view illustrating another example of a printed circuit board.

FIG. 26 is a schematic cross-sectional view illustrating another example of a printed circuit board.

Figure 27:
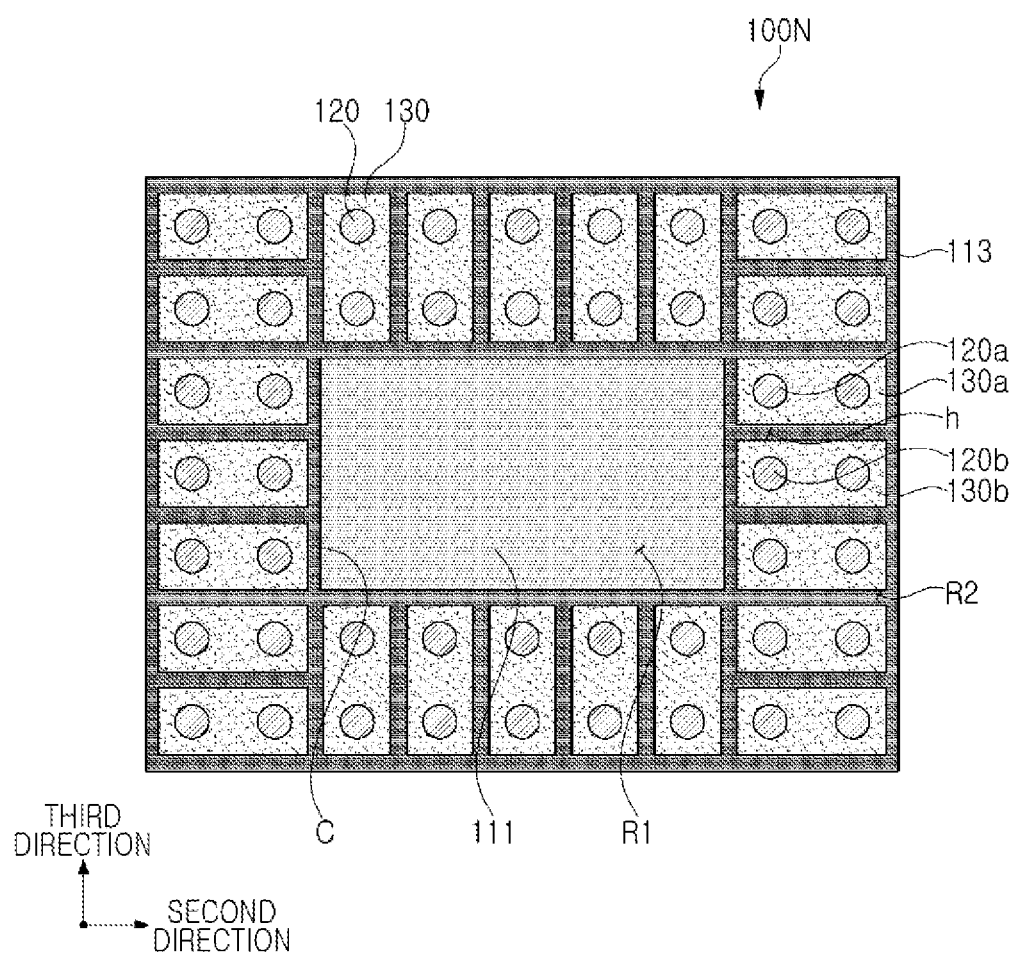
FIG. 27 is a schematic plan view of the printed circuit board of FIG. 26 when viewed from below.

FIG. 27 is a schematic plan view of the printed circuit board of FIG. 26 when viewed from below.

Referring to FIGS. 26 and 27, a printed circuit board 100N according to another exemplary embodiment may include a first insulating layer 111, a first resist layer 113 disposed on a lower surface of the first insulating layer 111, a second insulating layer 112 disposed on an upper surface of the first insulating layer 111, a second resist layer 114 disposed on an upper surface of the second insulating layer 112, a plurality of bumps 120 disposed on a lower surface of the first resist layer 113, a plurality of insulating walls 130 disposed on the lower surface of the first resist layer 113 and surrounding the plurality of bumps 120, a first wiring layer 141 disposed on the lower surface of the first insulating layer 111 and at least partially covered by the first resist layer 113, a conductive pattern layer 145 embedded in the first insulating layer 111 with a lower surface of the conductive pattern layer 145 contacting an upper surface of the first wiring layer 141, a plurality of bump vias 125 penetrating through the first resist layer 113 and connecting the plurality of bumps 120 to the first wiring layer 141 respectively, a second wiring layer 142 disposed on the upper surface of the first insulating layer 111 and embedded in the second insulating layer 112 so that a lower surface of the second wiring layer 142 is exposed to a lower surface of the second insulating layer 112, a first via layer 161 penetrating through the first insulating layer 111 and connecting the conductive pattern layer 145 and the second wiring layer 142 to each other, a third wiring layer 143 disposed on the upper surface of the second insulating layer 112 and at least partially covered by the second resist layer 114, and a second via layer 162 penetrating through the second insulating layer 112 and connecting the second and third wiring layers 142 and 143 to each other. An insulating member 110 may include the first and second insulating layers 111 and 112 and the first and second resist layers 113 and 114, and have a cavity C. The cavity C may penetrate through the first resist layer 113 and further penetrate through at least a portion of the first insulating layer 111. Each of the plurality of insulating walls 130 may surround at least two of the plurality of bumps 120. In addition, the printed circuit board 100N according to another exemplary embodiment may be used as an interposer substrate including a cavity, but is not limited thereto.

Concerning the other details, the details described above for the printed circuit boards 100A, 100B, 100C, 100D, 100E, 100F, 100G, 100H, 100I, 100J, 100K, 100L, and 100M may also be applicable to the printed circuit board 100N according to another exemplary embodiment unless contradictory, and the overlapping description will not be repeated.

FIGS. 28A through 28I are schematic views illustrating examples of processes for manufacturing the printed circuit board of FIG. 26.

Figure 28A:
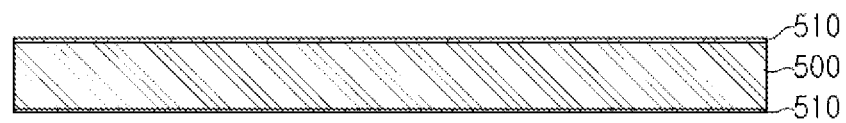
FIGS. 28A through 28I are schematic views illustrating examples of processes for manufacturing the printed circuit board of FIG. 26.
Figure 28A:
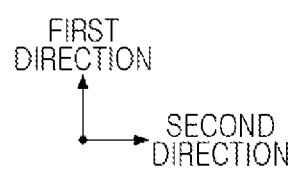

Referring to FIG. 28A, a carrier substrate 500 with a metal layer 510 formed on one or both surfaces thereof may be prepared.

Figure 28B:
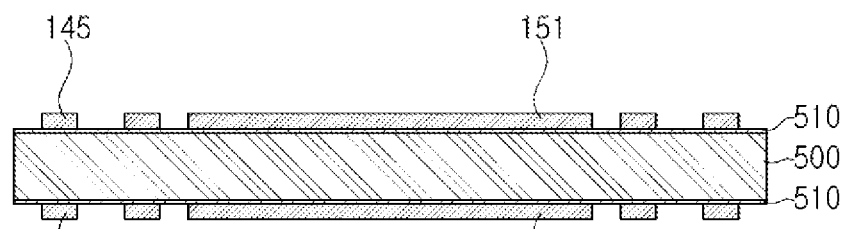
Figure 28B:
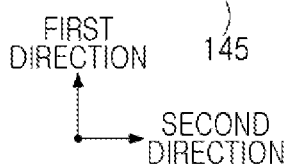

Referring to FIG. 28B, a first plating layer 151 and a conductive pattern layer 145 may be formed on the metal layer 510 of the carrier substrate 500.

Figure 28C:
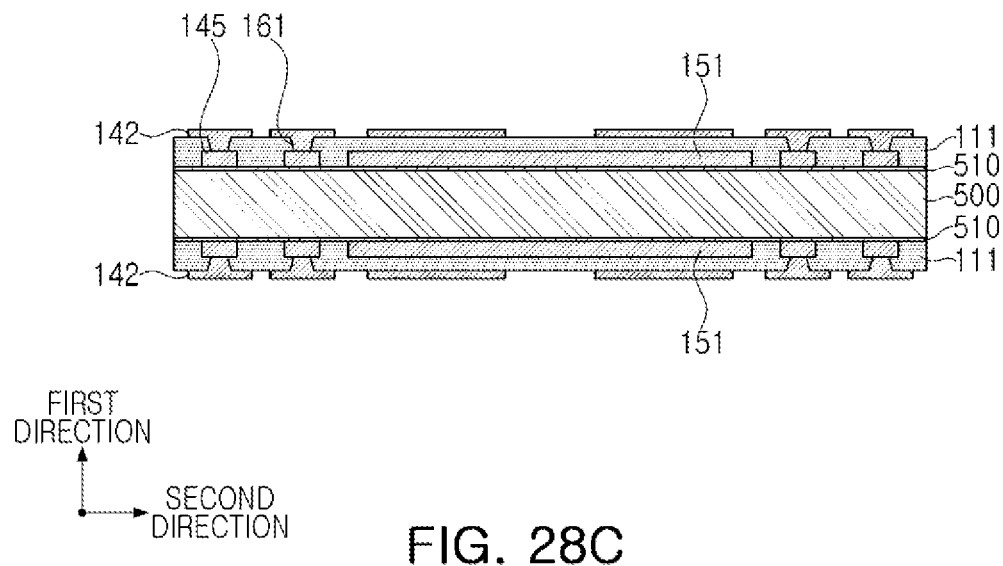

Referring to FIG. 28C, a first insulating layer 111 embedding the first plating layer 151 and the conductive pattern layer 145 may be formed on the metal layer 510 of the carrier substrate 500. Thereafter, a first via layer 161 may be formed in the first insulating layer 111. In addition, a second wiring layer 142 may be formed on the first insulating layer 111.

Figure 28D:
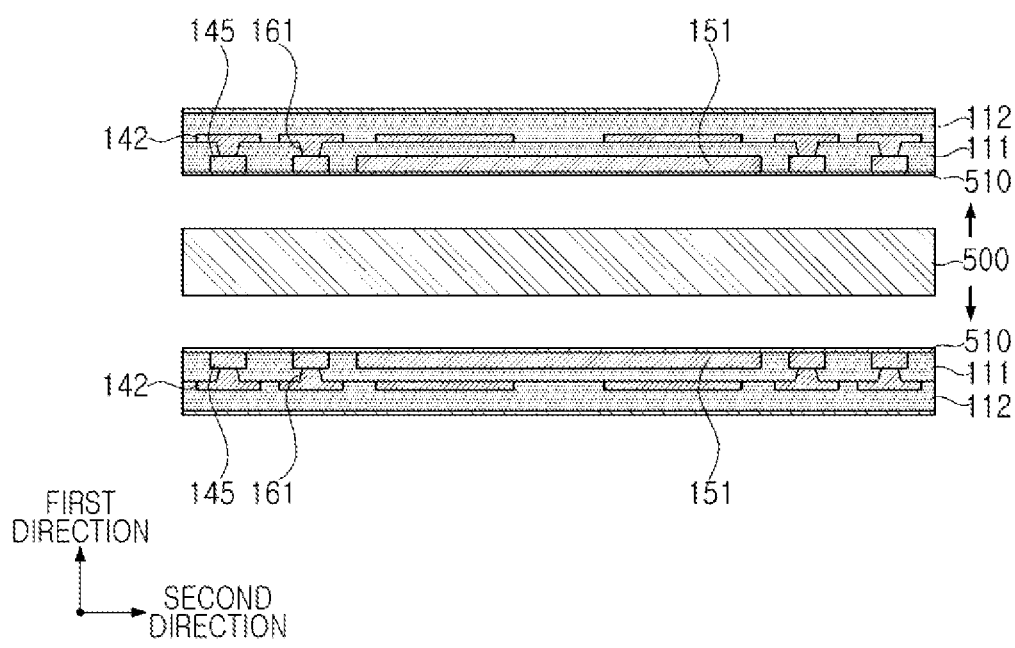

Referring to FIG. 28D, a second insulating layer 112 embedding the second wiring layer 142 may be formed on the first insulating layer 111. Thereafter, the carrier substrate 500 may be removed.

Figure 28E:
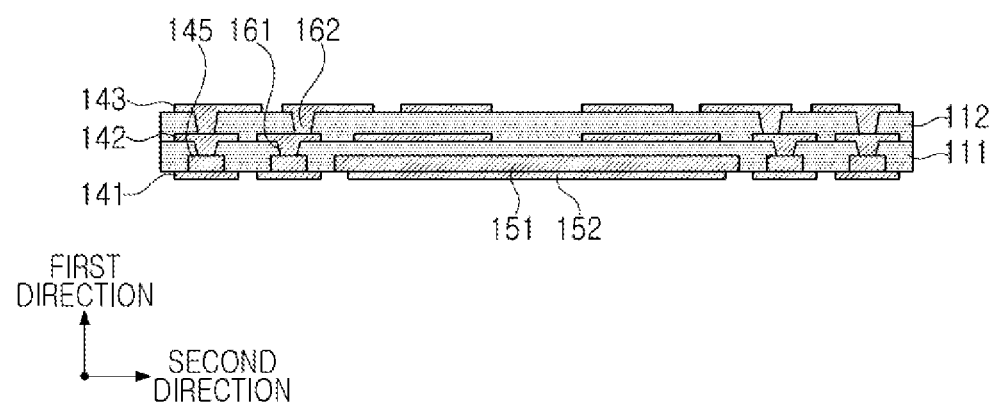

Referring to FIG. 28E, a second via layer 162 may be formed in the second insulating layer 112. In addition, a third wiring layer 143 may be formed on the second insulating layer 112. At this time, a first wiring layer 141 may be formed on the first insulating layer 111. In addition, a second plating layer 152 may be formed on the first plating layer 151.

Alternatively, after forming the second insulating layer 112 embedding the second wiring layer 142 and before removing the carrier substrate 500, the second via layer 162 may be formed in the second insulating layer 112 and the third wiring layer 143 may be formed on the second insulating layer 112. Then, the carrier substrate 500 may be removed. Thereafter, the first wiring layer 141 may be formed on the first insulating layer 111, and the second plating layer 152 may be formed on the first plating layer 151.

Figure 28F:
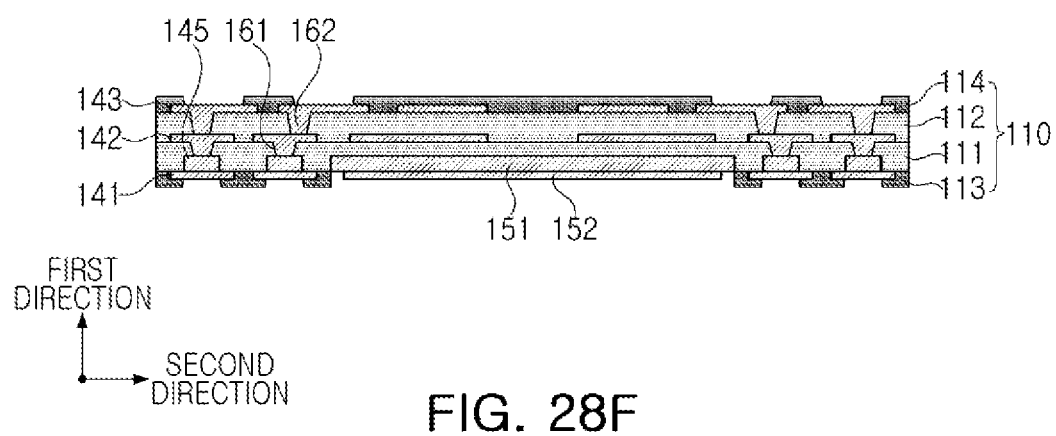

Referring to FIG. 28F, first and second resist layers 113 and 114 may be formed. In addition, each of the first and second resist layers 113 and 114 may be patterned to form a plurality of openings.

Figure 28G:
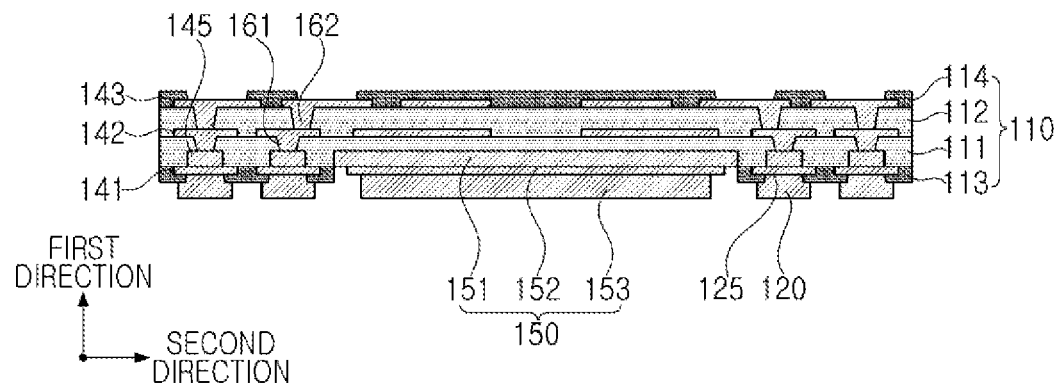

Referring to FIG. 28G, a plurality of bumps 120 may be formed on the first resist layer 113. Also, a plurality of bump vias 125 may be formed in the plurality of openings of the first resist layer 113, respectively. In addition, a third plating layer 153 may be formed on the second plating layer 152. At this time, a plating structure 150 may be formed.

Figure 28H:
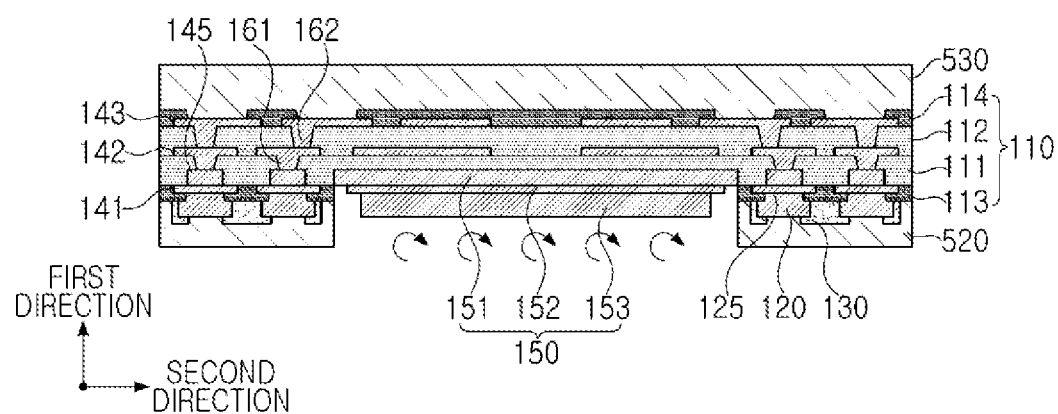

Referring to FIG. 28H, a plurality of insulating walls 130 surrounding the plurality of bumps 120 may be formed on the first resist layer 113. The plurality of insulating walls 130 may have trenches therebetween. Thereafter, all the regions except the plating structure 150 may be covered with dry films 520 and 530, and an etching process may be performed on the plating structure 150.

Figure 28I:
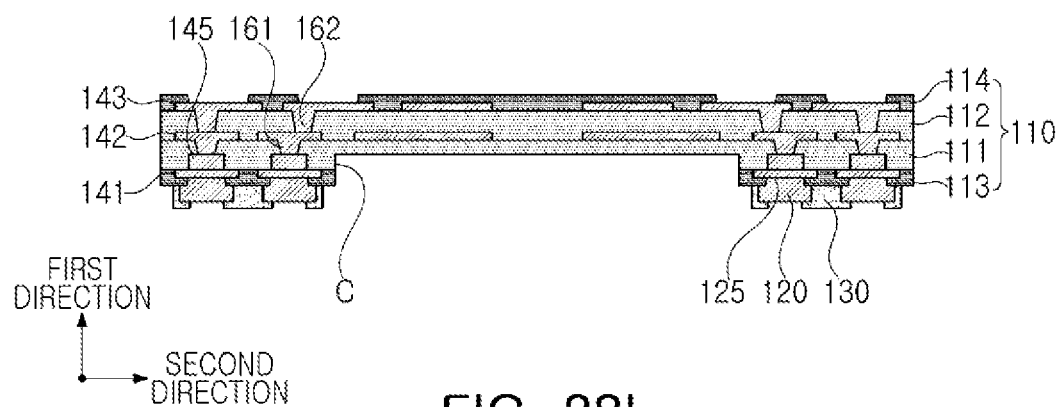

Referring to FIG. 28I, a cavity C may be formed in a region where the plating structure 150 is removed. Thereafter, the dry films 520 and 530 may be removed. Then, the above-described printed circuit board 100N according to another exemplary embodiment may be manufactured. However, this is merely an example of a manufacturing method, and the above-described printed circuit board 100N according to another exemplary embodiment may be manufactured through different processes.

Concerning the other details, the details described above for the printed circuit boards 100A, 100B, 100C, 100D, 100E, 100F, 100G, 100H, 100I, 100J, 100K, 100L, 100M, and 100N and the methods for manufacturing the printed circuit boards 100E, 100H, and 100K may also be applicable to the method for manufacturing the printed circuit board 100N according to another exemplary embodiment unless contradictory, and the overlapping description will not be repeated.

Figure 29:
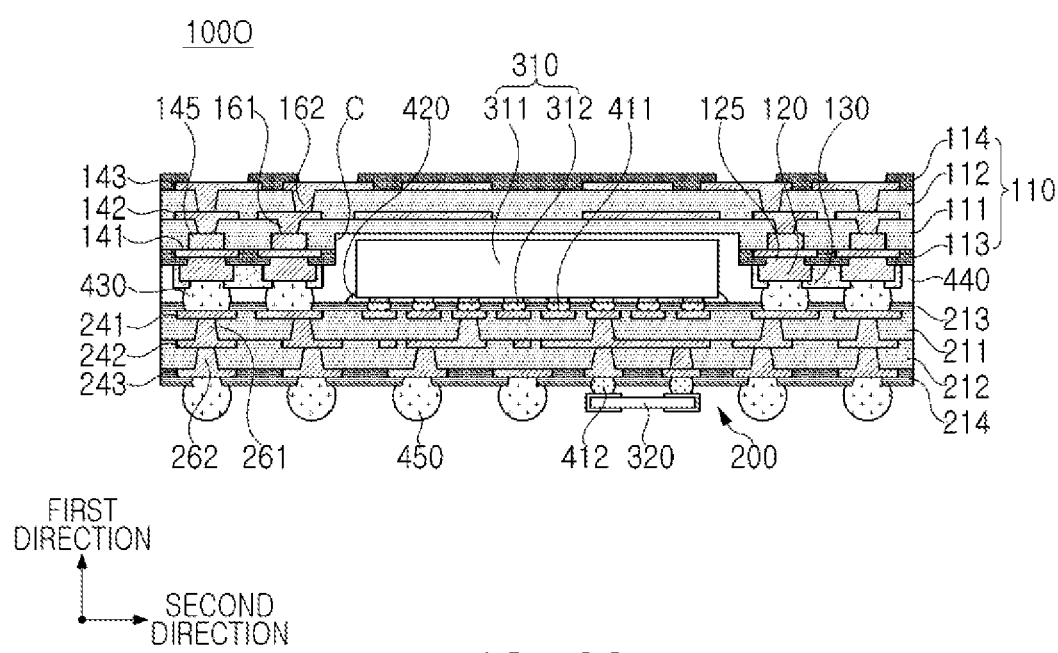
FIG. 29 is a schematic cross-sectional view illustrating a modified example of the printed circuit board of FIG. 26.

FIG. 29 is a schematic cross-sectional view illustrating a modified example of the printed circuit board of FIG. 26.

Figure 30:
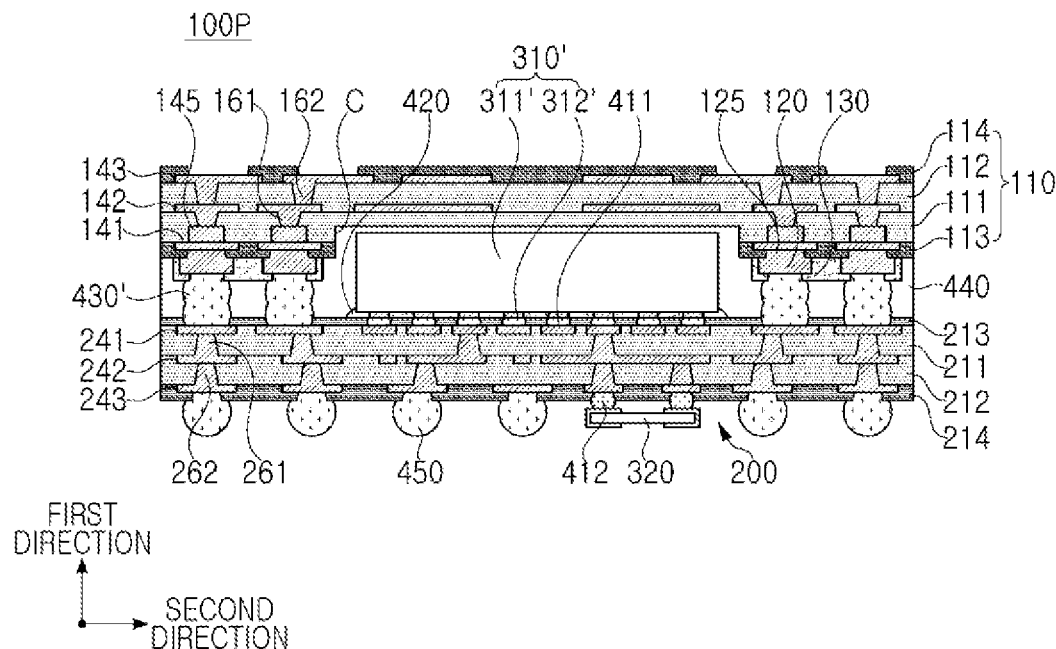
FIG. 30 is a schematic cross-sectional view illustrating another modified example of the printed circuit board of FIG. 26.

FIG. 30 is a schematic cross-sectional view illustrating another modified example of the printed circuit board of FIG. 26.

Referring to FIGS. 29 and 30, each of printed circuit boards 1000 and 100P according to modified exemplary embodiments may have a package structure in which a wiring substrate 200 with electronic components 310 or 310' and 320 mounted thereon is disposed under the above-described printed circuit board 100N in a substrate-on-substrate form. Here, the above-described printed circuit board 100N may be used as an interposer substrate including a cavity. For example, each of the printed circuit boards 1000 and 100P according to modified exemplary embodiments may further include a wiring substrate 200 including a plurality of insulating layers 211, 212, 213, and 214, a plurality of wiring layers 241, 242, and 243, and a plurality of via layers 261 and 262 and spaced apart from the insulating member 110 above the insulating member 110, a first electronic component 310 or 310' mounted on an upper side of the wiring substrate 200, a second electronic component 320 mounted on a lower side of the wiring substrate 200, a plurality of connection conductors 430 or 430' connecting the plurality of bumps 120, respectively, to the plurality of wiring layers 241, 242, and 243, a molding material 440 filling a space between the insulating member 110 and the wiring substrate 200 and embedding the first electronic component 310 or 310' and the plurality of connection conductors 430 or 430', and/or a plurality of electrical connection metals 450 disposed on the lower side of the wiring substrate 200 and connected to the plurality of wiring layers 241, 242, and 243.

Concerning the other details, the details described above for the printed circuit boards 100A, 100B, 100C, 100D, 100E, 100F, 100G, 100H, 100I, 100J, 100K, 100L, 100M, and 100N may also be applicable to the printed circuit boards 1000 and 100P according to modified exemplary embodiments unless contradictory, and the overlapping description will not be repeated.

Figure 31:
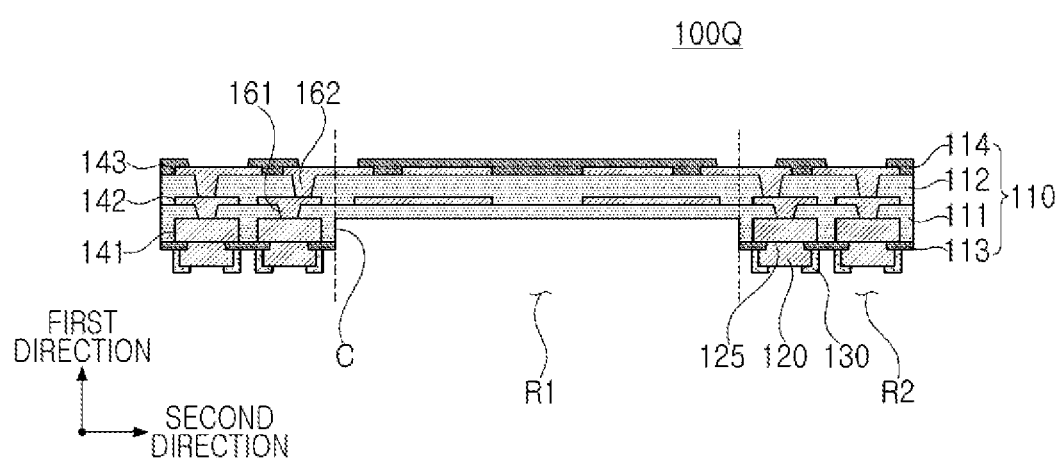
FIG. 31 is a schematic cross-sectional view illustrating another example of a printed circuit board.

FIG. 31 is a schematic cross-sectional view illustrating another example of a printed circuit board.

Figure 32:
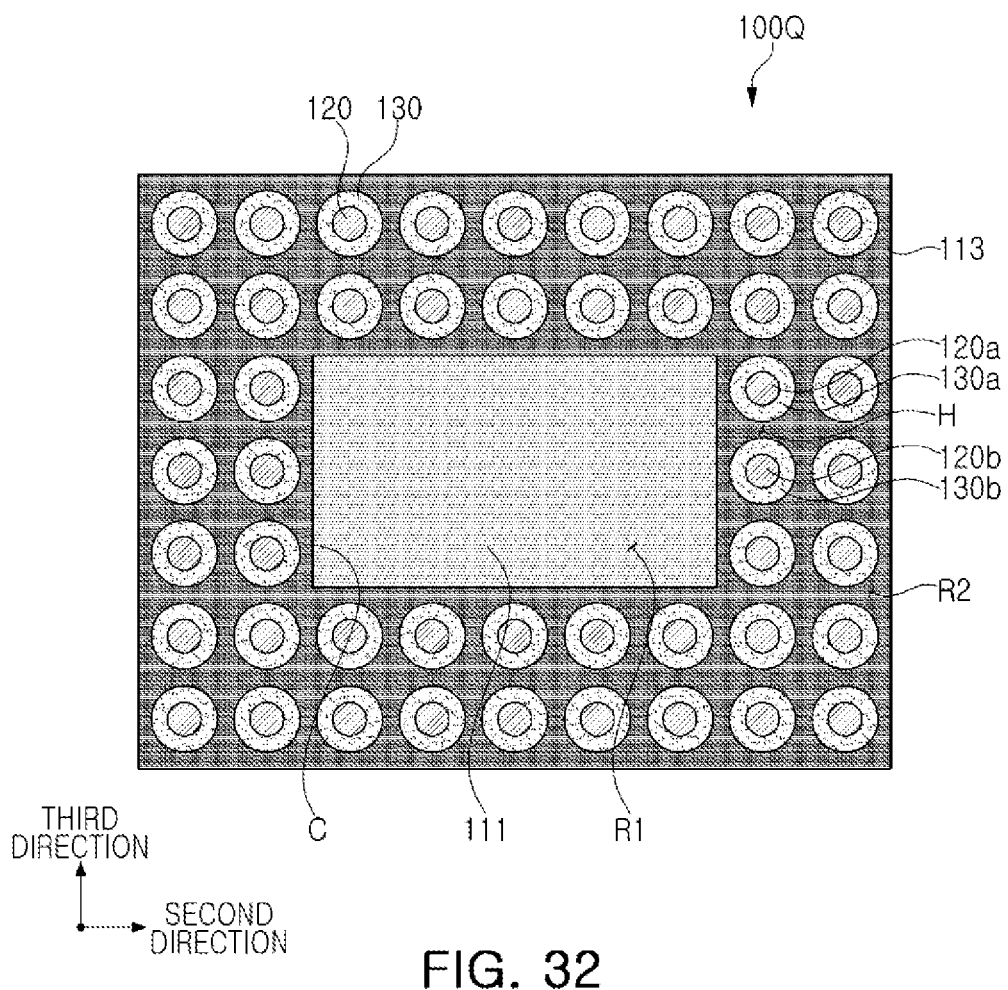
FIG. 32 is a schematic plan view of the printed circuit board of FIG. 31 when viewed from below.

FIG. 32 is a schematic plan view of the printed circuit board of FIG. 31 when viewed from below.

Referring to FIGS. 31 and 32, a printed circuit board 100Q according to another exemplary embodiment may include a first insulating layer 111, a first resist layer 113 disposed on a lower surface of the first insulating layer 111, a second insulating layer 112 disposed on an upper surface of the first insulating layer 111, a second resist layer 114 disposed on an upper surface of the second insulating layer 112, a plurality of bumps 120 disposed on a lower surface of the first resist layer 113, a plurality of insulating walls 130 disposed on the lower surface of the first resist layer 113 and surrounding the plurality of bumps 120 respectively, a first wiring layer 141 embedded in the first insulating layer 111 with a lower surface of the first wiring layer 141 exposed to a lower surface of first insulating layer 111, a plurality of bump vias 125 penetrating through the first resist layer 113 and connecting the plurality of bumps 120 to the first wiring layer 141 respectively, a second wiring layer 142 disposed on the upper surface of the first insulating layer 111 and embedded in the second insulating layer 112 so that a lower surface of the second wiring layer 142 is exposed to a lower surface of the second insulating layer 112, a first via layer 161 penetrating through the first insulating layer 111 and connecting the first and second wiring layers 141 and 142 to each other, a third wiring layer 143 disposed on the upper surface of the second insulating layer 112 and at least partially covered by the second resist layer 114, and a second via layer 162 penetrating through the second insulating layer 112 and connecting the second and third wiring layers 142 and 143 to each other. An insulating member 110 may include the first and second insulating layers 111 and 112 and the first and second resist layers 113 and 114, and have a cavity C. The cavity C may penetrate through the first resist layer 113 and further penetrate through at least a portion of the first insulating layer 111. The printed circuit board 100Q according to another exemplary embodiment may be used as an interposer substrate including a cavity, but is not limited thereto.

Meanwhile, in the printed circuit board 100Q according to another exemplary embodiment, the first wiring layer 141 may be formed together by a plating process when a plating layer for forming the cavity C is formed. Therefore, the first wiring layer 141 makes it possible to more effectively control a variation in plating thickness of the plating layer associated with a depth of the cavity C. From this point of view, an upper surface of the first wiring layer 141 may be positioned on substantially the same level as a bottom surface of the cavity C. In addition, the first wiring layer 141 may be thicker than each of the second and third wiring layers 142 and 143. The thickness may be determined based on the first direction.

Hereinafter, the components of the printed circuit board 100Q according to another exemplary embodiment will be described in more detail with reference to FIGS. 31 and 32.

The first and second via layers 161 and 162 may be tapered in the same direction. For example, both the first and second via layers 161 and 162 may be tapered downwardly. The first via layer 161 may be formed by the same plating process as the second wiring layer 142, such that the first via layer 161 and the second wiring layer 142 are integrated with each other without a boundary therebetween. The second via layer 162 may be formed by the same plating process as the third wiring layer 143, such that the second via layer 162 and the third wiring layer 143 are integrated with each other without a boundary therebetween.

Concerning the other details, the details described above for the printed circuit boards 100A, 100B, 100C, 100D, 100E, 100F, 100G, 100H, 100I, 100J, 100K, 100L, 100M, 100N, 100O, and 100P may also be applicable to the printed circuit board 100Q according to another exemplary embodiment unless contradictory, and the overlapping description will not be repeated.

FIGS. 33A through 33H are schematic views illustrating examples of processes for manufacturing the printed circuit board of FIG. 31.

Figure 33A:
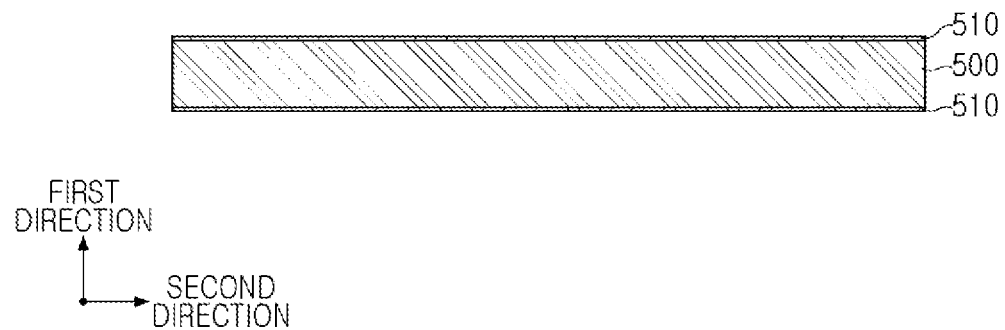
FIGS. 33A through 33H are schematic views illustrating examples of processes for manufacturing the printed circuit board of FIG. 31.

Referring to FIG. 33A, a carrier substrate 500 with a metal layer 510 formed on one or both surfaces thereof may be prepared.

Figure 33B:
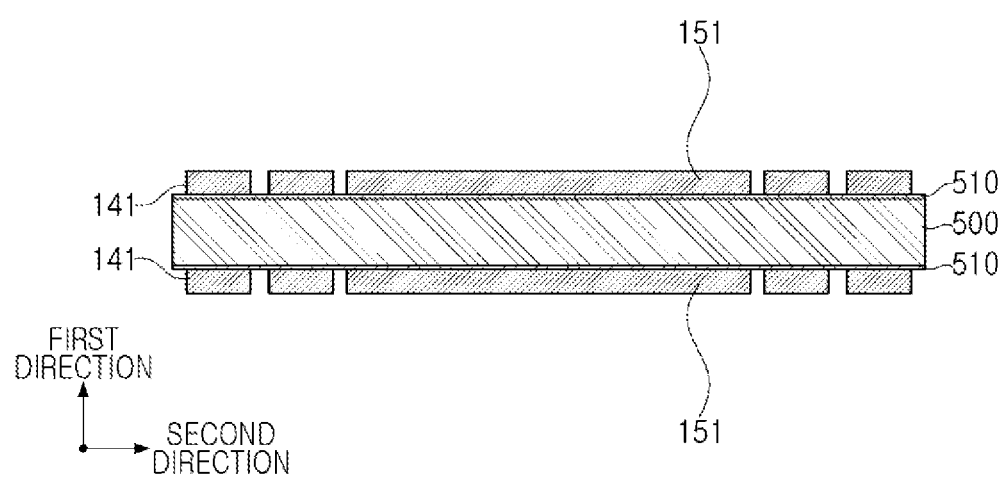

Referring to FIG. 33B, a first plating layer 151 and a first wiring layer 141 may be formed on the metal layer 510 of the carrier substrate 500. The first wiring layer 141 may be formed together with the first plating layer 151 by a plating process such as AP, SAP, MSAP, or TT, which is thus helpful in controlling a variation in plating thickness of the first plating layer 151.

Figure 33C:
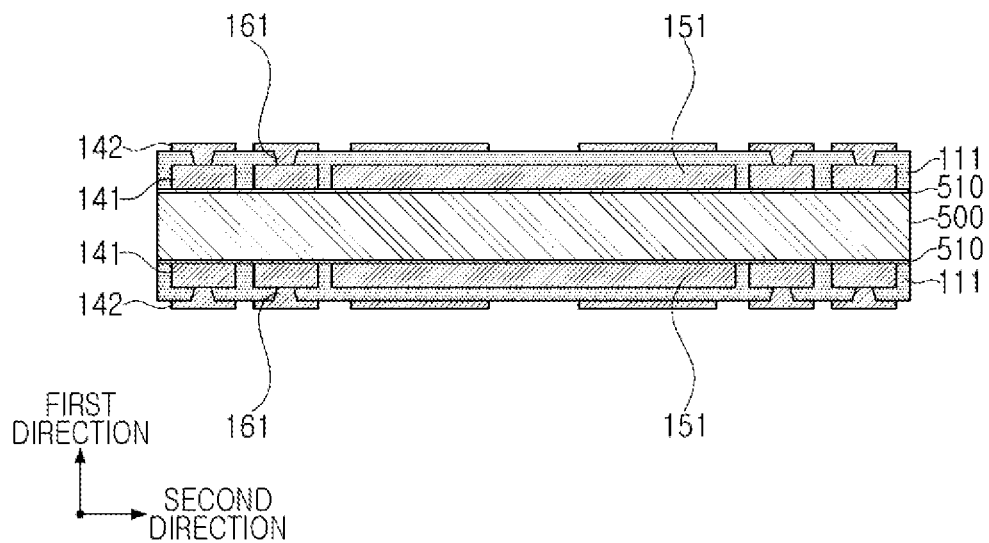

Referring to FIG. 33C, a first insulating layer 111 embedding the first plating layer 151 and the first wiring layer 141 may be formed on the metal layer 510 of the carrier substrate 500. Thereafter, a first via layer 161 may be formed in the first insulating layer 111. In addition, a second wiring layer 142 may be formed on the first insulating layer 111.

Figure 33D:
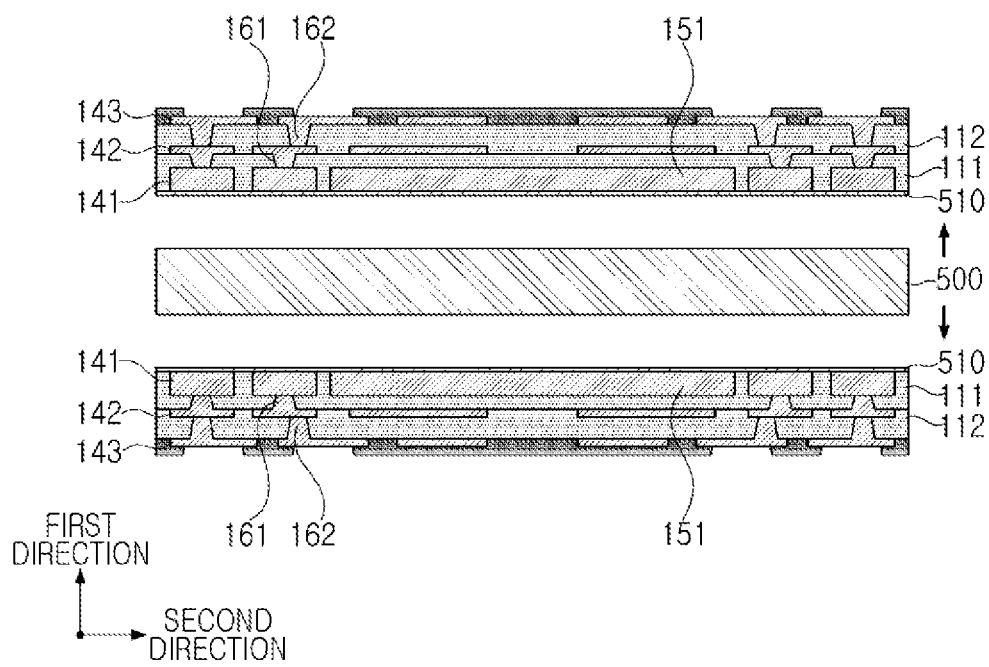

Referring to FIG. 33D, a second insulating layer 112 embedding the second wiring layer 142 may be formed on the first insulating layer 111. Thereafter, a second via layer 162 may be formed in the second insulating layer 112. In addition, a third wiring layer 143 may be formed on the second insulating layer 112. Thereafter, the carrier substrate 500 may be removed.

Figure 33E:
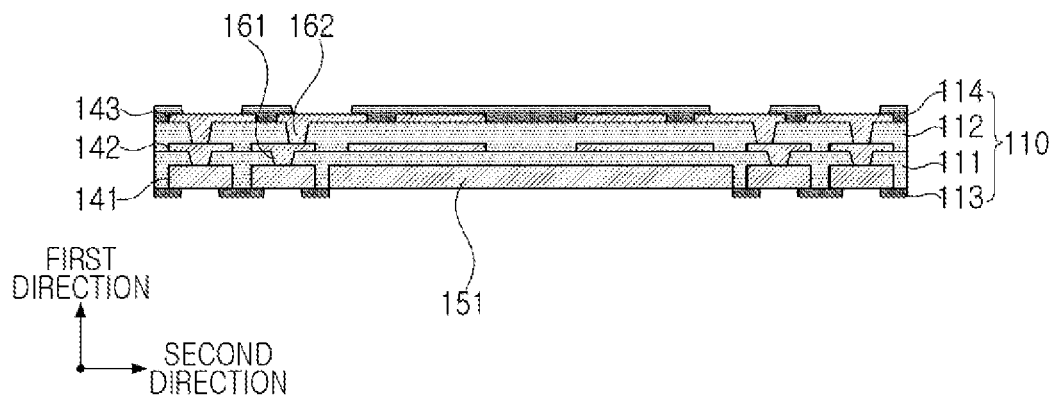

Referring to FIG. 33E, first and second resist layers 113 and 114 may be formed. In addition, each of the first and second resist layers 113 and 114 may be patterned to form a plurality of openings.

Figure 33F:
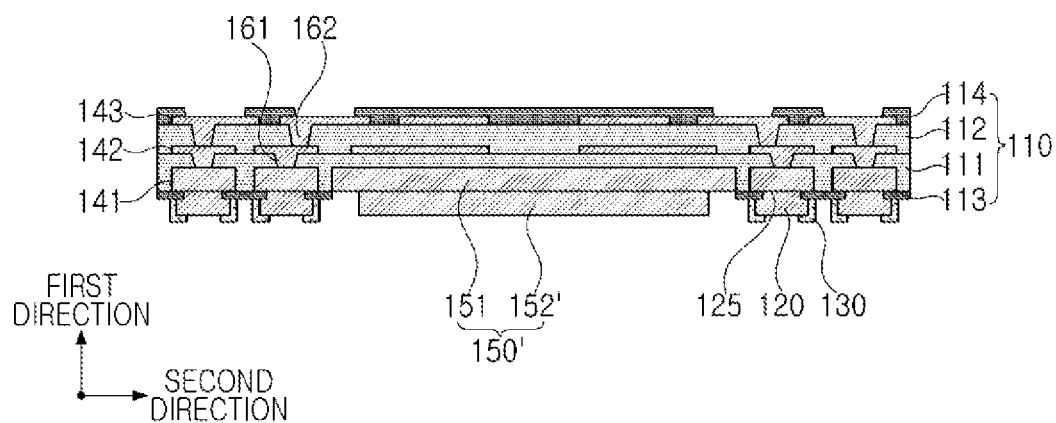

Referring to FIG. 33F, a plurality of bumps 120 may be formed on the first resist layer 113. Also, a plurality of bump vias 125 may be formed in the plurality of openings of the first resist layer 113, respectively. In addition, a second plating layer 152' may be formed on the first plating layer 151. At this time, a plating structure 150' may be formed.

Figure 33G:
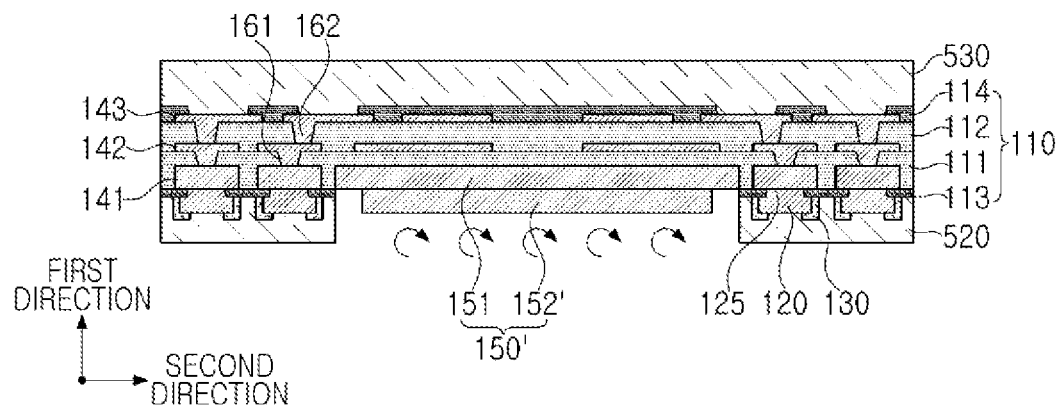

Referring to FIG. 33G, a plurality of insulating walls 130 surrounding the plurality of bumps 120, respectively, may be formed on the first resist layer 113. Thereafter, all the regions except the plating structure 150' may be covered with dry films 520 and 530, and an etching process may be performed on the plating structure 150'.

Figure 33H:
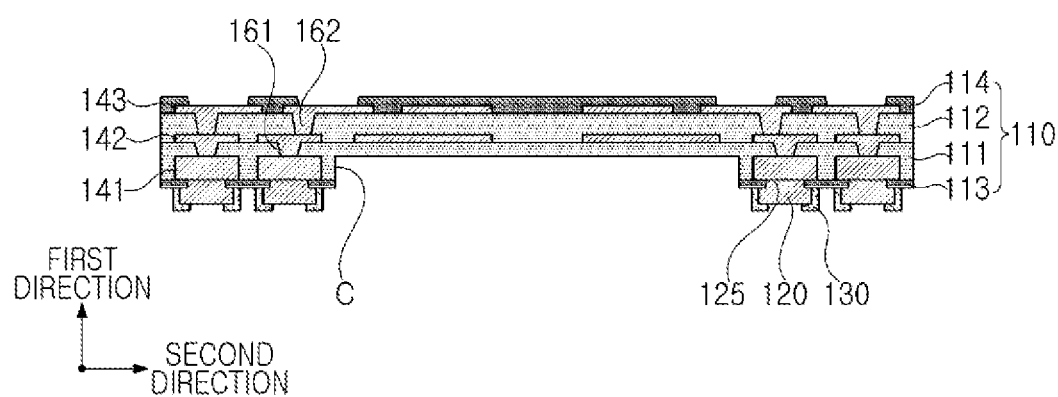

Referring to FIG. 33H, a cavity C may be formed in a region where the plating structure 150' is removed. Thereafter, the dry films 520 and 530 may be removed. Then, the above-described printed circuit board 100Q according to another exemplary embodiment may be manufactured. However, this is merely an example of a manufacturing method, and the above-described printed circuit board 100Q according to another exemplary embodiment may be manufactured through different processes.

Concerning the other details, the details described above for the printed circuit boards 100A, 100B, 100C, 100D, 100E, 100F, 100G, 100H, 100I, 100J, 100K, 100L, 100M, 100N, 100O, 100P, and 100Q, and the methods for manufacturing the printed circuit boards 100E, 100H, 100K, and 100N may also be applicable to the method for manufacturing the printed circuit board 100Q according to another exemplary embodiment unless contradictory, and the overlapping description will not be repeated.

Figure 34:
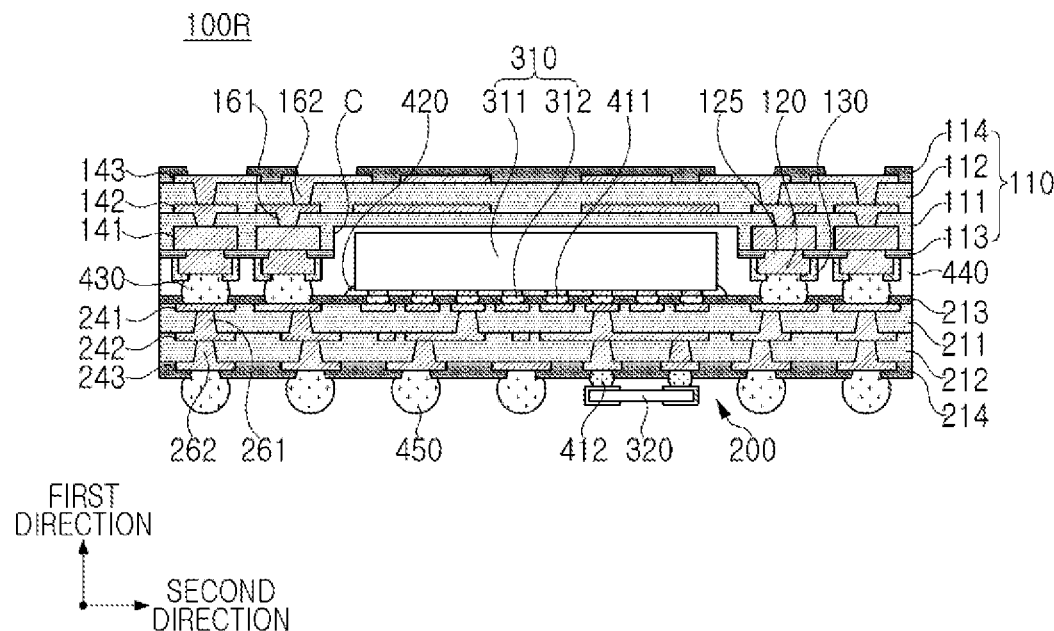
FIG. 34 is a schematic cross-sectional view illustrating a modified example of the printed circuit board of FIG. 31.

FIG. 34 is a schematic cross-sectional view illustrating a modified example of the printed circuit board of FIG. 31.

Figure 35:
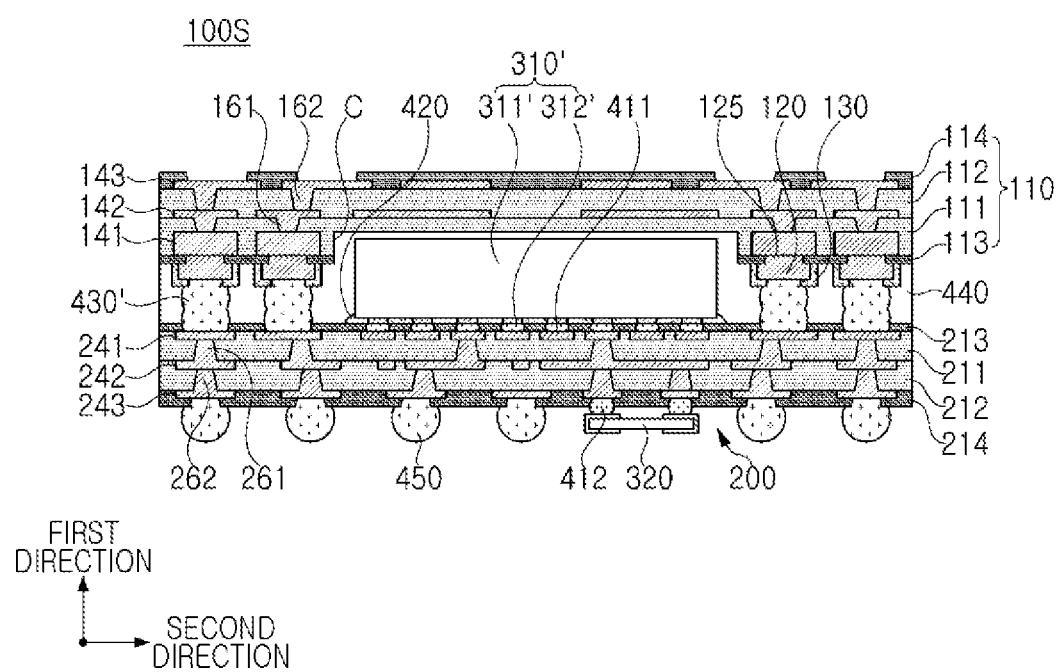
FIG. 35 is a schematic cross-sectional view illustrating another modified example of the printed circuit board of FIG. 31.

FIG. 35 is a schematic cross-sectional view illustrating another modified example of the printed circuit board of FIG. 31.

Referring to FIGS. 34 and 35, each of printed circuit boards 100R and 100S according to modified exemplary embodiments may have a package structure in which a wiring substrate 200 with electronic components 310 or 310' and 320 mounted thereon is disposed under the above-described printed circuit board 100Q in a substrate-on-substrate form. Here, the above-described printed circuit board 100Q may be used as an interposer substrate including a cavity. For example, each of the printed circuit boards 100R and 100S according to modified exemplary embodiments may further include a wiring substrate 200 including a plurality of insulating layers 211, 212, 213, and 214, a plurality of wiring layers 241, 242, and 243, and a plurality of via layers 261 and 262 and spaced apart from the insulating member 110 above the insulating member 110, a first electronic component 310 or 310' mounted on an upper side of the wiring substrate 200, a second electronic component 320 mounted on a lower side of the wiring substrate 200, a plurality of connection conductors 430 or 430' connecting the plurality of bumps 120, respectively, to the plurality of wiring layers 241, 242, and 243, a molding material 440 filling a space between the insulating member 110 and the wiring substrate 200 and embedding the first electronic component 310 or 310' and the plurality of connection conductors 430 or 430', and/or a plurality of electrical connection metals 450 disposed on the lower side of the wiring substrate 200 and connected to the plurality of wiring layers 241, 242, and 243.

Concerning the other details, the details described above for the printed circuit boards 100A, 100B, 100C, 100D, 100E, 100F, 100G, 100H, 100I, 100J, 100K, 100L, 100M, 100N, 100O, 100P, and 100Q may also be applicable to the printed circuit boards 100R and 100S according to modified exemplary embodiments unless contradictory, and the overlapping description will not be repeated.

Figure 36:
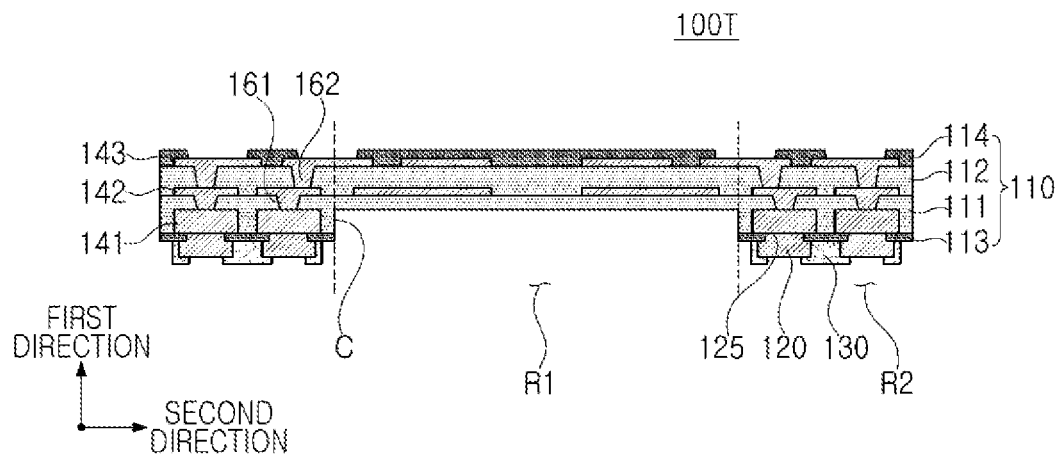
FIG. 36 is a schematic cross-sectional view illustrating another example of a printed circuit board.

FIG. 36 is a schematic cross-sectional view illustrating another example of a printed circuit board.

Figure 37:
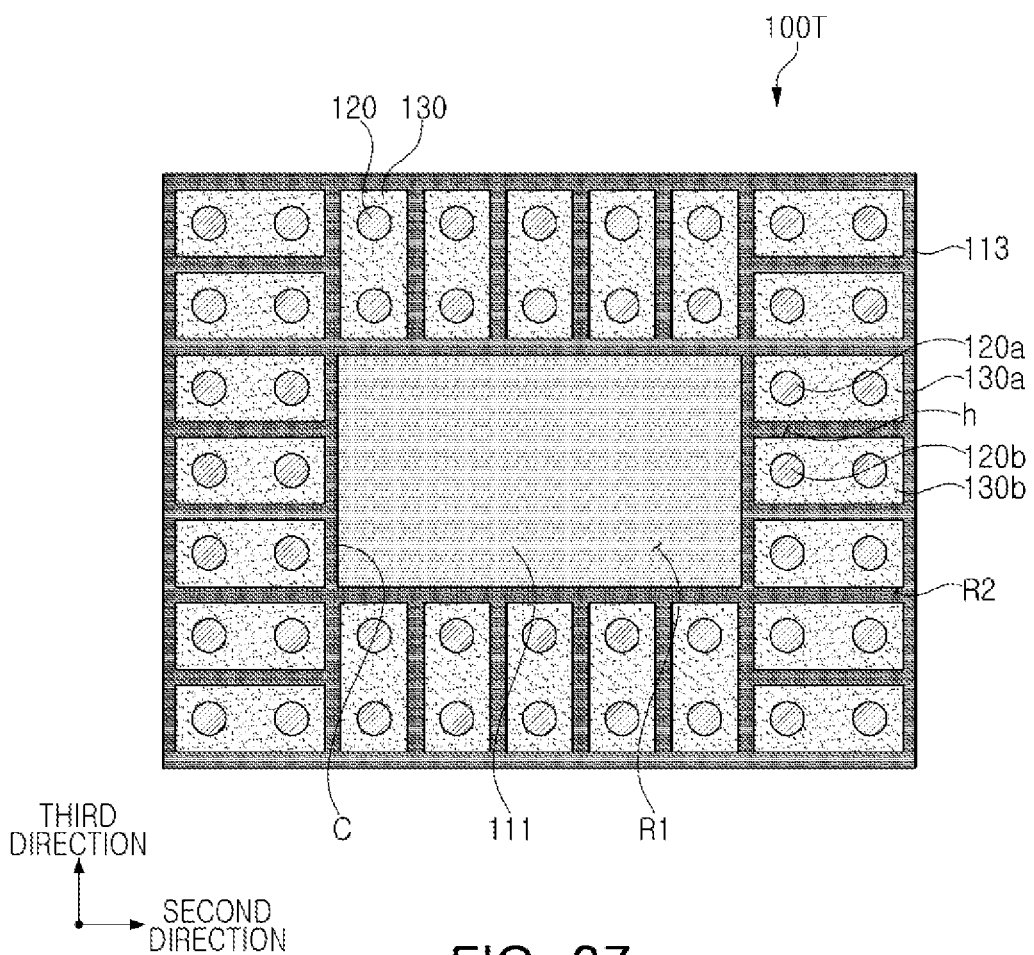
FIG. 37 is a schematic plan view of the printed circuit board of FIG. 36 when viewed from below.

FIG. 37 is a schematic plan view of the printed circuit board of FIG. 36 when viewed from below.

Referring to FIGS. 36 and 37, a printed circuit board 100T according to another exemplary embodiment may include a first insulating layer 111, a first resist layer 113 disposed on a lower surface of the first insulating layer 111, a second insulating layer 112 disposed on an upper surface of the first insulating layer 111, a second resist layer 114 disposed on an upper surface of the second insulating layer 112, a plurality of bumps 120 disposed on a lower surface of the first resist layer 113, a plurality of insulating walls 130 disposed on the lower surface of the first resist layer 113 and surrounding the plurality of bumps 120, a first wiring layer 141 embedded in the first insulating layer 111 with a lower surface of the first wiring layer 141 exposed to a lower surface of the first insulating layer 111, a plurality of bump vias 125 penetrating through the first resist layer 113 and connecting the plurality of bumps 120 to the first wiring layer 141 respectively, a second wiring layer 142 disposed on the upper surface of the first insulating layer 111 and embedded in the second insulating layer 112 so that a lower surface of the second wiring layer 142 is exposed to a lower surface of the second insulating layer 112, a first via layer 161 penetrating through the first insulating layer 111 and connecting the first and second wiring layers 141 and 142 to each other, a third wiring layer 143 disposed on the upper surface of the second insulating layer 112 and at least partially covered by the second resist layer 114, and a second via layer 162 penetrating through the second insulating layer 112 and connecting the second and third wiring layers 142 and 143 to each other. An insulating member 110 may include the first and second insulating layers 111 and 112 and the first and second resist layers 113 and 114, and have a cavity C. The cavity C may penetrate through the first resist layer 113 and further penetrate through at least a portion of the first insulating layer 111. Each of the plurality of insulating walls 130 may surround at least two of the plurality of bumps 120. In addition, the printed circuit board 100T according to another exemplary embodiment may be used as an interposer substrate including a cavity, but is not limited thereto.

Concerning the other details, the details described above for the printed circuit boards 100A, 100B, 100C, 100D, 100E, 100F, 100G, 100H, 100I, 100J, 100K, 100L, 100M, 100N, 100O, 100P, 100Q, 100R, and 100S may also be applicable to the printed circuit board 100T according to another exemplary embodiment unless contradictory, and the overlapping description will not be repeated.

FIGS. 38A through 38H are schematic views illustrating examples of processes for manufacturing the printed circuit board of FIG. 36.

Figure 38A:
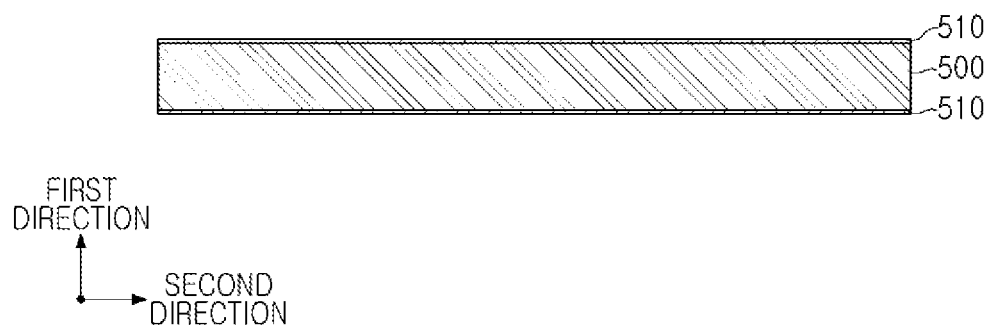
FIGS. 38A through 38H are schematic views illustrating examples of processes for manufacturing the printed circuit board of FIG. 36.

Referring to FIG. 38A, a carrier substrate 500 with a metal layer 510 formed on one or both surfaces thereof may be prepared.

Figure 38B:
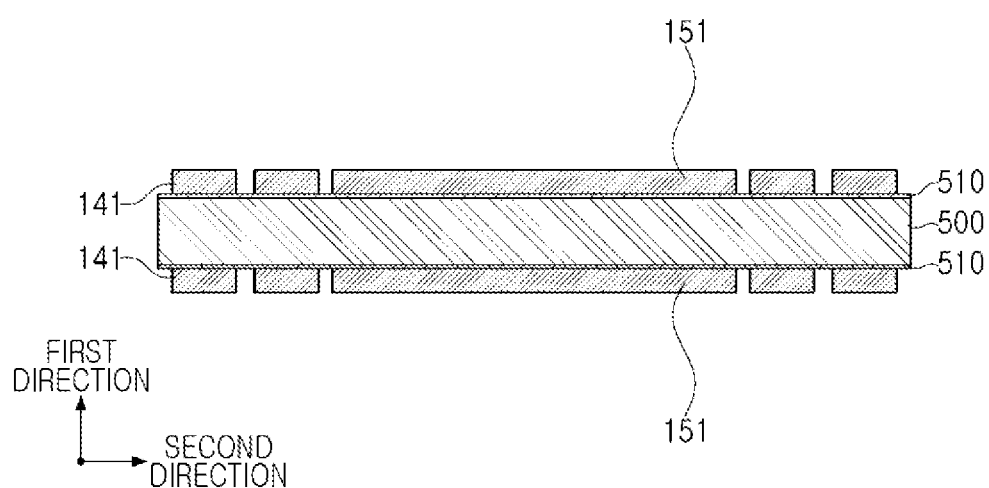

Referring to FIG. 38B, a first plating layer 151 and a first wiring layer 141 may be formed on the metal layer 510 of the carrier substrate 500.

Figure 38C:
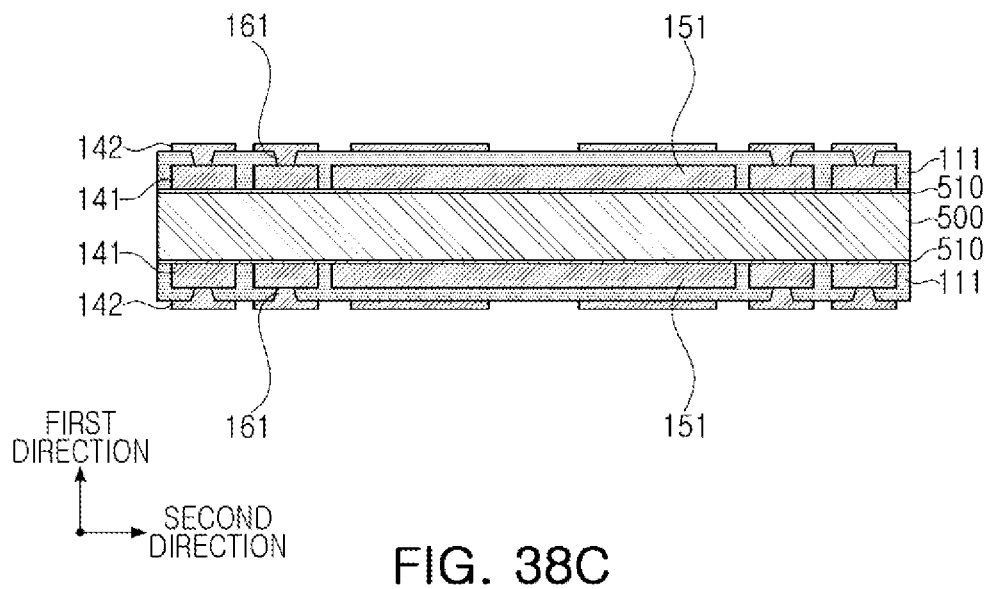

Referring to FIG. 38C, a first insulating layer 111 embedding the first plating layer 151 and the first wiring layer 141 may be formed on the metal layer 510 of the carrier substrate 500. Thereafter, a first via layer 161 may be formed in the first insulating layer 111. In addition, a second wiring layer 142 may be formed on the first insulating layer 111.

Figure 38D:
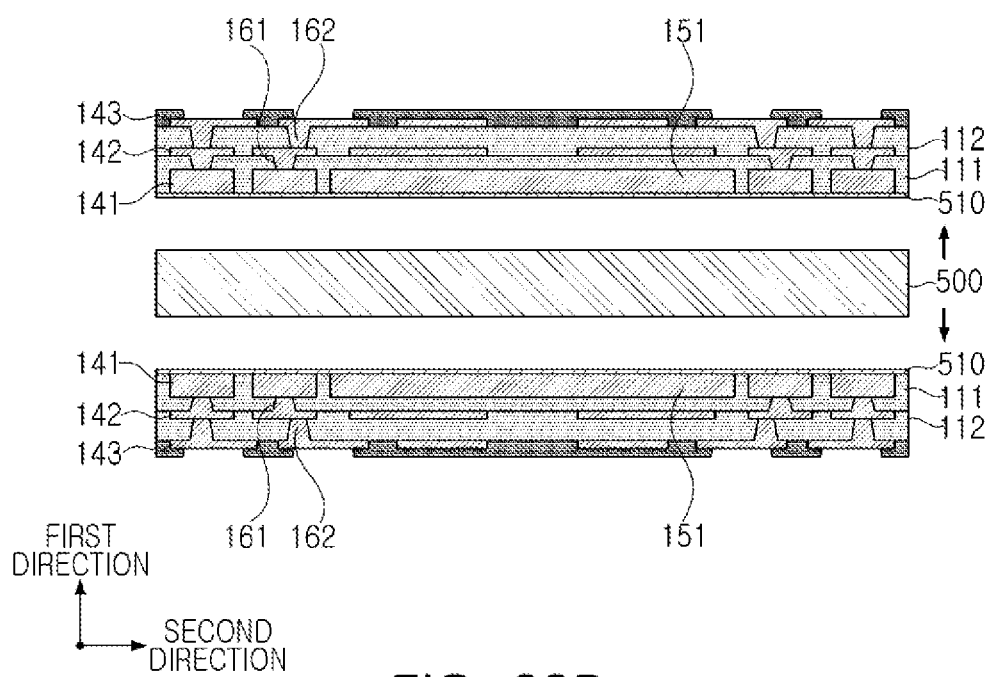

Referring to FIG. 38D, a second insulating layer 112 embedding the second wiring layer 142 may be formed on the first insulating layer 111. Thereafter, a second via layer 162 may be formed in the second insulating layer 112. In addition, a third wiring layer 143 may be formed on the second insulating layer 112. Thereafter, the carrier substrate 500 may be removed.

Figure 38E:
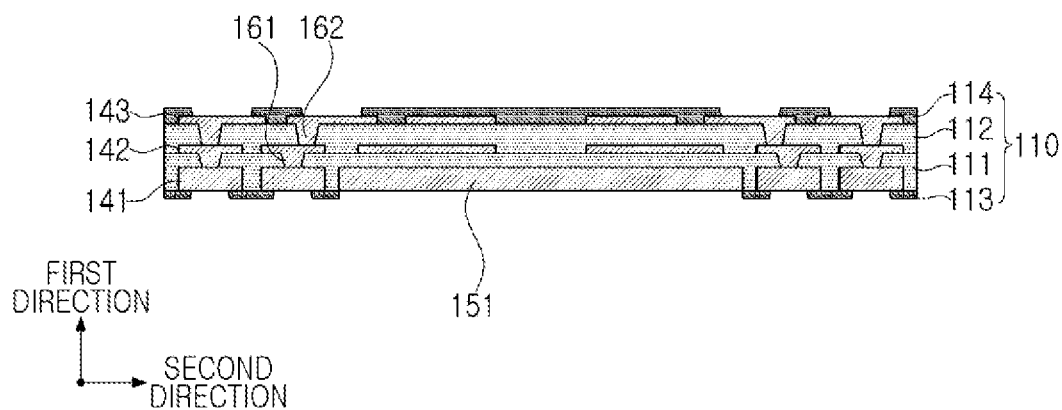

Referring to FIG. 38E, first and second resist layers 113 and 114 may be formed. In addition, each of the first and second resist layers 113 and 114 may be patterned to form a plurality of openings.

Figure 38F:
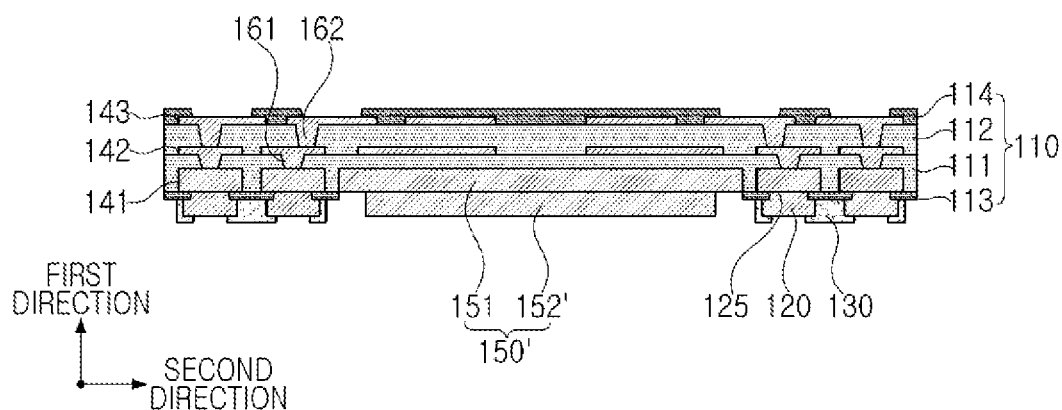

Referring to FIG. 38F, a plurality of bumps 120 may be formed on the first resist layer 113. Also, a plurality of bump vias 125 may be formed in the plurality of openings of the first resist layer 113, respectively. In addition, a second plating layer 152' may be formed on the first plating layer 151. At this time, a plating structure 150' may be formed.

Figure 38G:
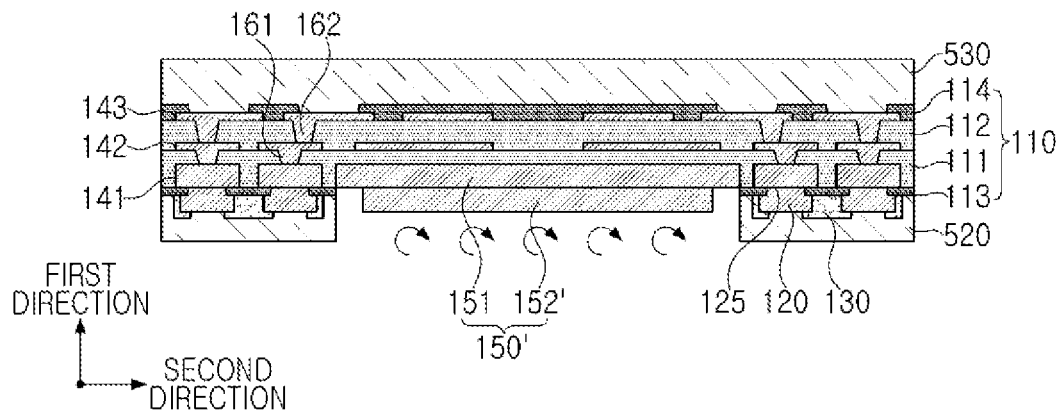

Referring to FIG. 38G, a plurality of insulating walls 130 surrounding the plurality of bumps 120 may be formed on the first resist layer 113. The plurality of insulating walls 130 may have trenches therebetween. Thereafter, all the regions except the plating structure 150' may be covered with dry films 520 and 530, and an etching process may be performed on the plating structure 150'.

Figure 38H:
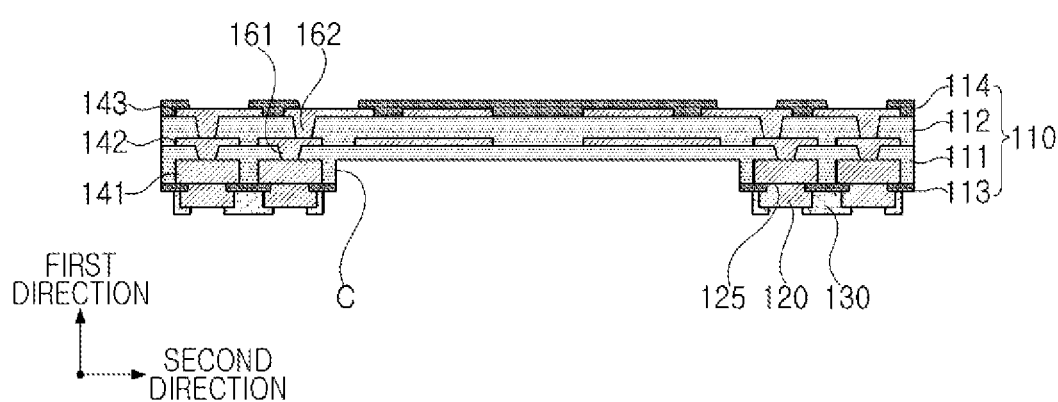

Referring to FIG. 38H, a cavity C may be formed in a region where the plating structure 150' is removed. Thereafter, the dry films 520 and 530 may be removed. Then, the above-described printed circuit board 100T according to another exemplary embodiment may be manufactured. However, this is merely an example of a manufacturing method, and the above-described printed circuit board 100T according to another exemplary embodiment may be manufactured through different processes.

Concerning the other details, the details described above for the printed circuit boards 100A, 100B, 100C, 100D, 100E, 100F, 100G, 100H, 100I, 100J, 100K, 100L, 100M, 100N, 100O, 100P, 100Q, 100R, 100S, and 100T and the methods for manufacturing the printed circuit boards 100E, 100H, 100K, 100N, and 100Q may also be applicable to the method for manufacturing the printed circuit board 100T according to another exemplary embodiment unless contradictory, and the overlapping description will not be repeated.

Figure 39:
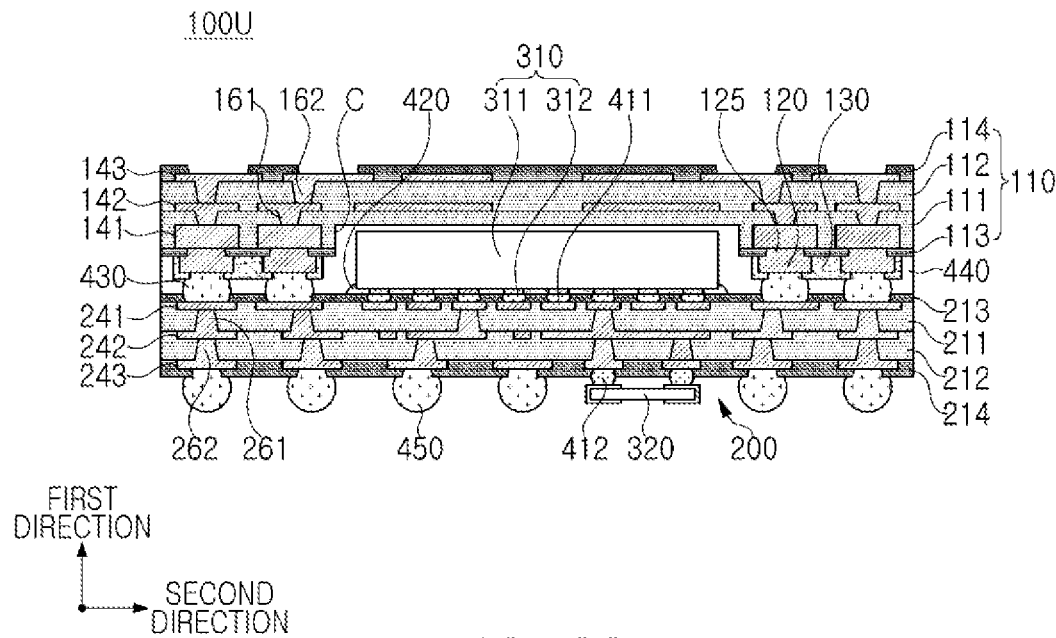
FIG. 39 is a schematic cross-sectional view illustrating a modified example of the printed circuit board of FIG. 36.

FIG. 39 is a schematic cross-sectional view illustrating a modified example of the printed circuit board of FIG. 36.

Figure 40:
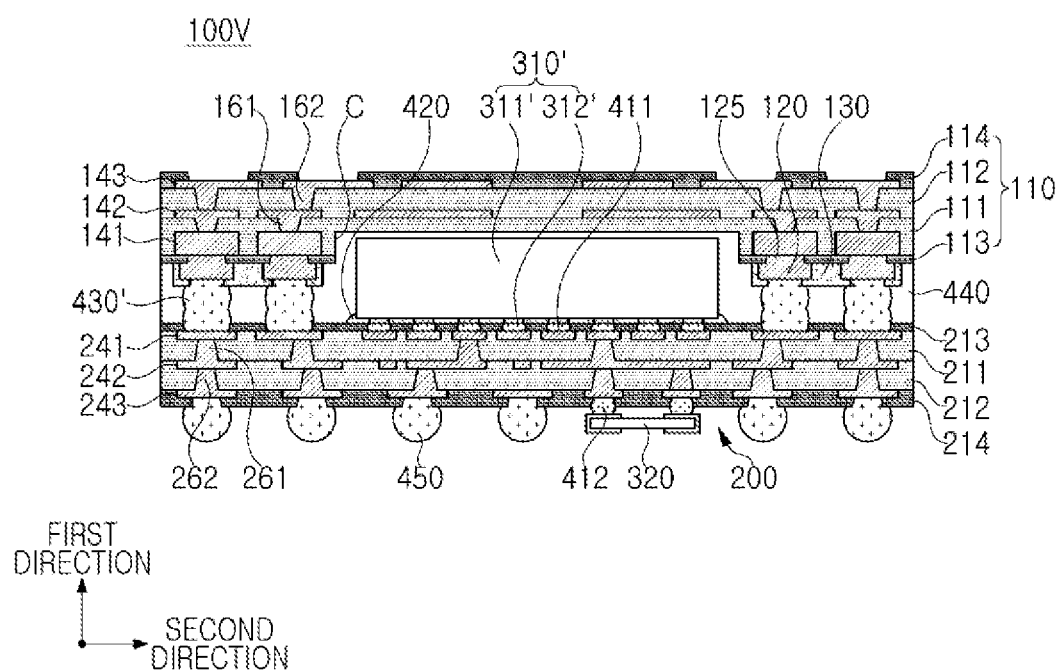
FIG. 40 is a schematic cross-sectional view illustrating another modified example of the printed circuit board of FIG. 36.

FIG. 40 is a schematic cross-sectional view illustrating another modified example of the printed circuit board of FIG. 36.

Referring to FIGS. 39 and 40, each of printed circuit boards 100U and 100V according to modified exemplary embodiments may have a package structure in which a wiring substrate 200 with electronic components 310 or 310' and 320 mounted thereon is disposed under the above-described printed circuit board 100T in a substrate-on-substrate form. Here, the above-described printed circuit board 100T may be used as an interposer substrate including a cavity. For example, each of the printed circuit boards 100U and 100V according to modified exemplary embodiments may further include a wiring substrate 200 including a plurality of insulating layers 211, 212, 213, and 214, a plurality of wiring layers 241, 242, and 243, and a plurality of via layers 261 and 262 and spaced apart from the insulating member 110 above the insulating member 110, a first electronic component 310 or 310' mounted on an upper side of the wiring substrate 200, a second electronic component 320 mounted on a lower side of the wiring substrate 200, a plurality of connection conductors 430 or 430' connecting the plurality of bumps 120, respectively, to the plurality of wiring layers 241, 242, and 243, a molding material 440 filling a space between the insulating member 110 and the wiring substrate 200 and embedding the first electronic component 310 or 310' and the plurality of connection conductors 430 or 430', and/or a plurality of electrical connection metals 450 disposed on the lower side of the wiring substrate 200 and connected to the plurality of wiring layers 241, 242, and 243.

Concerning the other details, the details described above for the printed circuit boards 100A, 100B, 100C, 100D, 100E, 100F, 100G, 100H, 100I, 100J, 100K, 100L, 100M, 100N, 100O, 100P, 100Q, 100R, 100S, and 100T may also be applicable to the printed circuit boards 100U and 100V according to modified exemplary embodiments unless contradictory, and the overlapping description will not be repeated.

Figure 41:
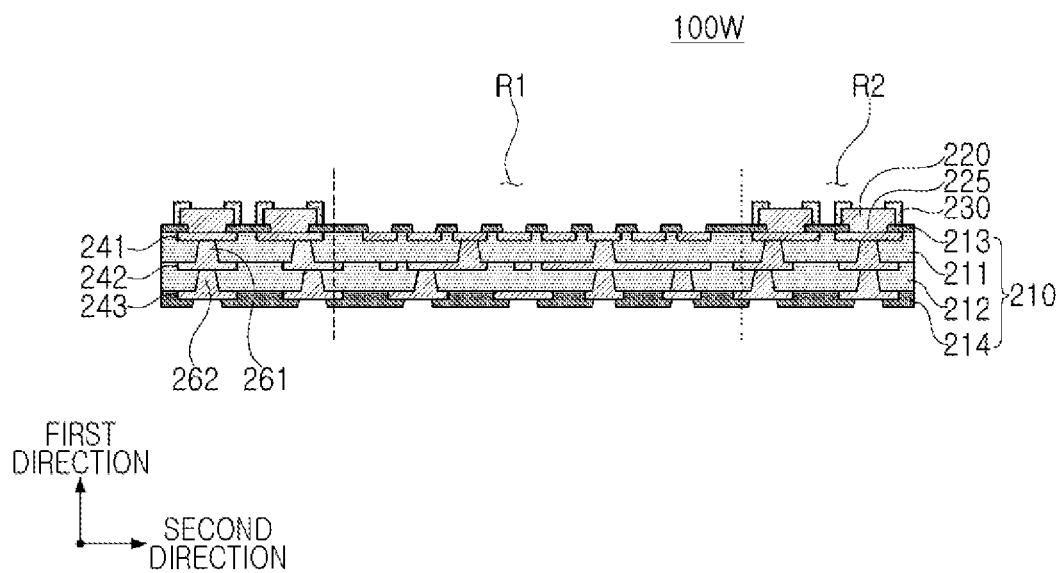
FIG. 41 is a schematic cross-sectional view illustrating another example of a printed circuit board.

FIG. 41 is a schematic cross-sectional view illustrating another example of a printed circuit board.

Figure 42:
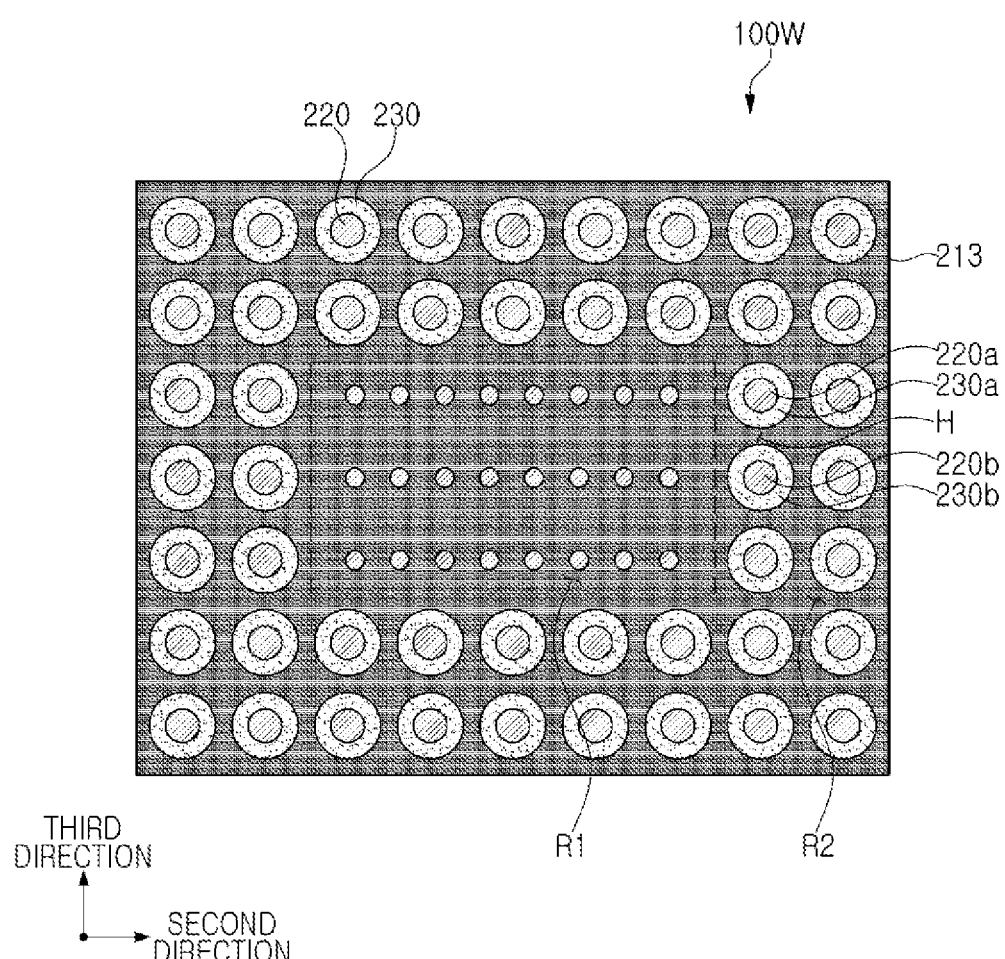
FIG. 42 is a schematic plan view of the printed circuit board of FIG. 41 when viewed from above.

FIG. 42 is a schematic plan view of the printed circuit board of FIG. 41 when viewed from above.

Referring to FIGS. 41 and 42, a printed circuit board 100W according to another exemplary embodiment may include a first insulating layer 211, a first resist layer 213 disposed on an upper surface of the first insulating layer 211, a second insulating layer 212 disposed on a lower surface of the first insulating layer 211, a second resist layer 214 disposed on a lower surface of the second insulating layer 212, a plurality of bumps 220 disposed on an upper surface of the first resist layer 213, a plurality of insulating walls 230 disposed on the upper surface of the first resist layer 213 and surrounding the plurality of bumps 220 respectively, a first wiring layer 241 disposed on the upper surface of the first insulating layer 211 and at least partially covered by the first resist layer 213, a plurality of bump vias 225 penetrating through the first resist layer 213 and connecting the plurality of bumps 220 to the first wiring layer 241, a second wiring layer 242 disposed on the lower surface of the first insulating layer 211 and embedded in the second insulating layer 212 so that an upper surface of the second wiring layer 242 is exposed to an upper surface of the second insulating layer 212, a first via layer 261 penetrating through the first insulating layer 211 and connecting the first and second wiring layers 241 and 242 to each other, a third wiring layer 243 disposed on the lower surface of the second insulating layer 212 and at least partially covered by the second resist layer 214, and a second via layer 262 penetrating through the second insulating layer 212 and connecting the second and third wiring layers 242 and 243 to each other. An insulating member 210 may include the first and second insulating layers 211 and 212 and the first and second resist layers 213 and 214. The printed circuit board 100W according to another exemplary embodiment may be used as a package substrate on which electronic components are mounted, but is not limited thereto.

Meanwhile, since the printed circuit board 100W according to another exemplary embodiment includes a plurality of bumps 220 protruding from the insulating member 210, the risk of warpage can be suppressed. In this case, it is also possible to reduce a pitch of connection conductors to be disposed between the printed circuit board 100W and another substrate such as an interposer substrate, and the pitch can be maintained even when a thickness of an electronic component increases.

In addition, in the printed circuit board 100W according to another exemplary embodiment, since the plurality of bumps 220 are surrounded by the plurality of insulating walls 230, connection conductors such as solder balls can be easily attached to the plurality of bumps 220. Therefore, a package assembly process can be more easily performed. For example, each of the plurality of insulating walls 230 may surround a side surface of each of the plurality of bumps 220 and cover at least a portion of an upper surface of each of the plurality of bumps 220. Accordingly, in the cross-sectional view, an upper surface of each of the plurality of insulating walls 230 may be further spaced apart from an upper surface of the insulating member 210 than the upper surface of each of the plurality of bumps 220. For example, the plurality of bumps 220 may be surrounded in an SMD type.

In addition, in the printed circuit board 100W according to another exemplary embodiment, in the plan view, when a central region of the insulating member 210 is defined as a center region R1, and a region surrounding the center region R1 is defined as a side region R2, the plurality of bumps 220 and the plurality of insulating walls 230 may be disposed in the side region R2. For example, a first bump 220a, a second bump 220b, a first insulating wall 230a, and a second insulating wall 230b may be disposed in the side region R2. Thus, the plurality of bumps 220 and the plurality of insulating walls 230 can be easily used for connection between substrates to be applied to a package structure.

In addition, in the printed circuit board 100W according to another exemplary embodiment, the plurality of insulating walls 230 may be spaced apart from each other on the insulating member 210, and a space between the plurality of insulating walls 230 may extend to the center region R1, and preferably further to an outer edge of the insulating member 210. Thus, flowability can be improved when a molding material is injected between substrates to be applied to a package structure later. Here, the center region R1 may be an inner region in which an electronic component, e.g., a semiconductor chip, is mounted. Here, the inner side and the outer side may be determined in the plan view.

For example, the plurality of bumps 220 may include a first bump 220a and a second bump 220b disposed adjacently to but spaced apart from each other on the insulating member 210, and the plurality of insulating walls 230 may include a first insulating wall 230a and a second insulating wall 230b disposed adjacently to but spaced apart from each other on the insulating member 210 and at least partially covering the first bump 220a and the second bump 220b, respectively. In this case, a space H between the first insulating wall 230a and the second insulating wall 230b adjacent to each other may further extend to the center region R1 and/or the outer edge of the insulating member 210.

For example, the side region R2 may include a space that extends continuously from the outer edge to the center region R1 of the insulating member 210 without being blocked by the plurality of insulating walls 230, e.g., the first and second insulating walls 230*a* and 230*b*, and the continuously extending space of the side region R2 may include a space between the plurality of insulating walls 230 spaced apart from each other, e.g., the space H between the first and second insulating walls 230*a* and 230*b*.

In addition, in the printed circuit board 100W according to another exemplary embodiment, each of the plurality of insulating walls 230 may surround each of the plurality of bumps 220 in a one-to-one manner. For example, one first insulating wall 230*a* may surround only one first bump 220*a*, and one second insulating wall 230*b* may surround only one second bump 220*b*. For example, in the plan view, each of the first insulating wall 230*a* and the second insulating wall 230*b* may have a substantially circular shape. More specifically, each of the first insulating wall 230*a* and the second insulating wall 230*b* may have a substantially circular ring shape, but is not limited thereto. In this case, the plurality of insulating walls 230 may be disposed locally and independently from each other, thereby minimizing obstruction when the molding material flows later.

Hereinafter, the components of the printed circuit board 100W according to another exemplary embodiment will be described in more detail with reference to FIGS. 41 and 42.

Each of the plurality of bumps 220 may include a metal material. The metal material may include copper (Cu), aluminum (Al), silver (Ag), tin (Sn), gold (Au), nickel (Ni), lead (Pb), titanium (Ti), and/or an alloy thereof. Each of the plurality of bumps 220 may perform various functions depending on design. For example, the plurality of bumps 220 may include ground bumps, power bumps, signal bumps, or the like. Here, the signal bumps may include bumps for connecting various signals, e.g., data signals, other than ground bumps, power bumps, and the like. Each of the plurality of bumps 220 may have a thickness of 10 μm or more in the first direction, but is not limited thereto. If necessary, a surface treatment layer including a nickel (Ni) layer and/or a gold (Au) layer may be formed on each of surfaces of the plurality of bumps 220 exposed from the plurality of insulating walls 230. Each of the plurality of bumps 220 may include an electroless plating layer (or chemical copper) and an electrolytic plating layer (or electrical copper), but is not limited thereto.

Each of the plurality of bump vias 225 may include a metal material. The metal material may include copper (Cu), aluminum (Al), silver (Ag), tin (Sn), gold (Au), nickel (Ni), lead (Pb), titanium (Ti), and/or an alloy thereof. The plurality of bump vias 225 may perform various functions depending on design. For example, the plurality of bump vias 225 may include bump vias for signal connection, bump vias for ground connection, bump vias for power connection, or the like. Each of the plurality of bump vias 225 may have a tapered shape in which a surface contacting each of the plurality of bumps 220 has a larger diameter than a surface contacting the first wiring layer 241. The plurality of bump vias 225 may be formed by filling via holes with the metal material. The plurality of bump vias 225 may be formed by the same plating process as the plurality of bump 220, such that each of the plurality of bump vias 225 is integrated with each of the plurality of bump 220 without a boundary therebetween. For example, the plurality of bump vias 225 and the plurality of bumps 220 may be integrated with each other in a one-to-one manner. Each of the plurality of bump vias 225 may include an electroless plating layer (or chemical copper) and an electrolytic plating layer (or electrical copper), but is not limited thereto.

Each of the plurality of insulating walls 230 may include an insulating material. The insulating material may include a photosensitive insulating material, e.g., photosensitive solder resist. However, the insulating material is not particularly limited thereto, and another type of polymer material such as thermosetting solder resist may be used as an insulating material. The plurality of insulating walls 230 may be formed from the same single layer, and thus may include the same insulating material. Each of the plurality of insulating walls 230 may be 10 μm or more thicker than each of the plurality of bumps 220 in the first direction, but is not limited thereto.

Concerning the other details, the details described above for the printed circuit boards 100A, 100B, 100C, 100D, 100E, 100F, 100G, 100H, 100I, 100J, 100K, 100L, 100M, 100N, 100O, 100P, 100Q, 100R, 100S, 100T, 100U, and 100V may also be applicable to the printed circuit board 100W according to another exemplary embodiment unless contradictory, and the overlapping description will not be repeated.

FIGS. 43A through 43E are schematic views illustrating examples of processes for manufacturing the printed circuit board of FIG. 41.

Figure 43A:
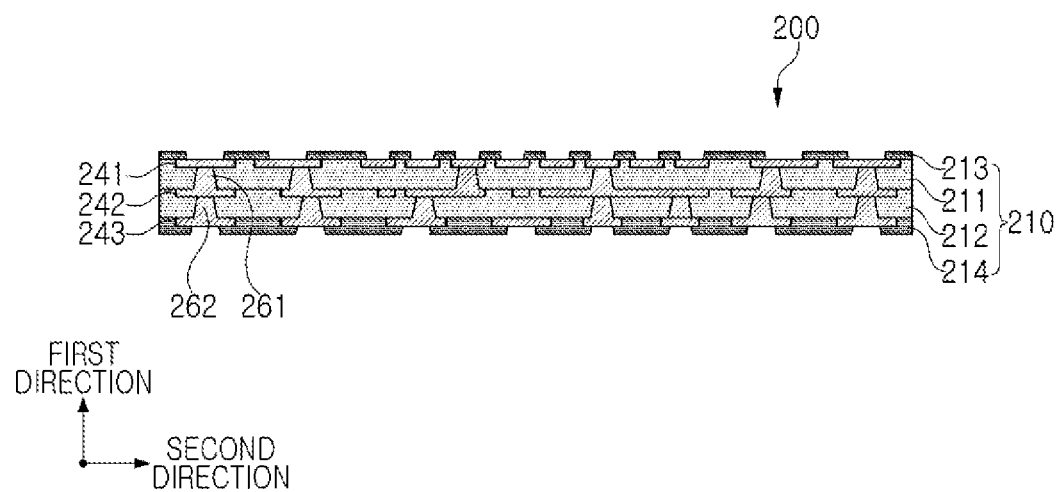
FIGS. 43A through 43E are schematic views illustrating examples of processes for manufacturing the printed circuit board of FIG. 41.

Referring to FIG. 43A, a wiring substrate 200 may be prepared. The wiring substrate 200 may be manufactured using a coreless process, but is not limited thereto.

Figure 43B:
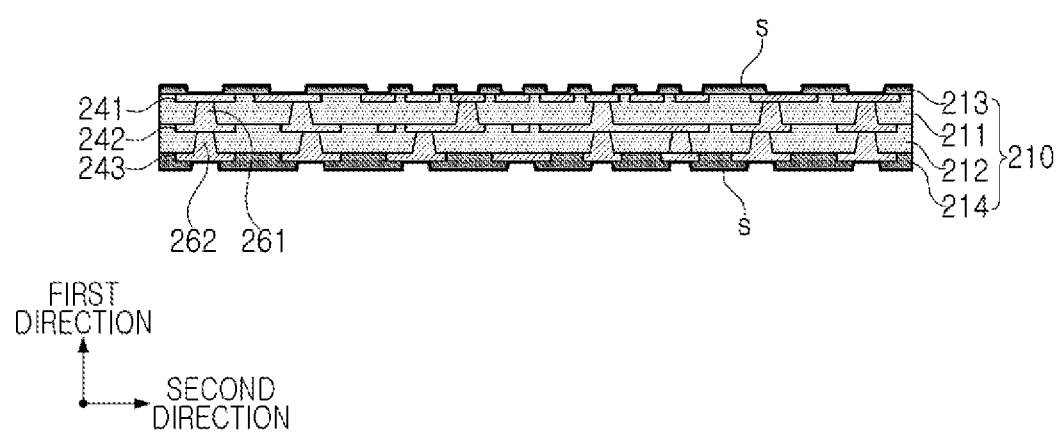

Referring to FIG. 43B, seed layers s may be formed on both sides of the wiring substrate 200 by using electroless plating (or chemical plating) or the like.

Figure 43C:
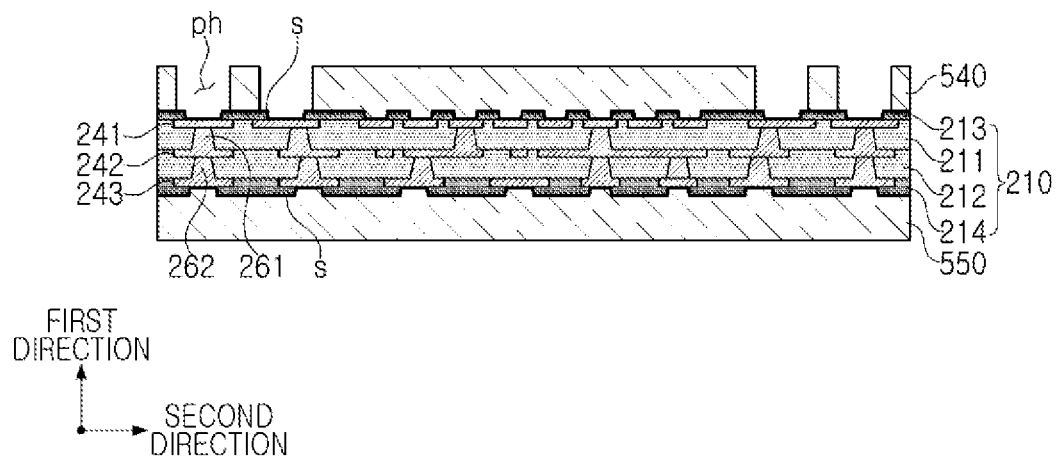

Referring to FIG. 43C, resist films 540 and 550 may be formed on the seed layers. In addition, pattern holes ph for forming a plurality of bumps 220 and a plurality of bump vias 225 may be formed in the upper resist film 540 by exposure and development.

Figure 43D:
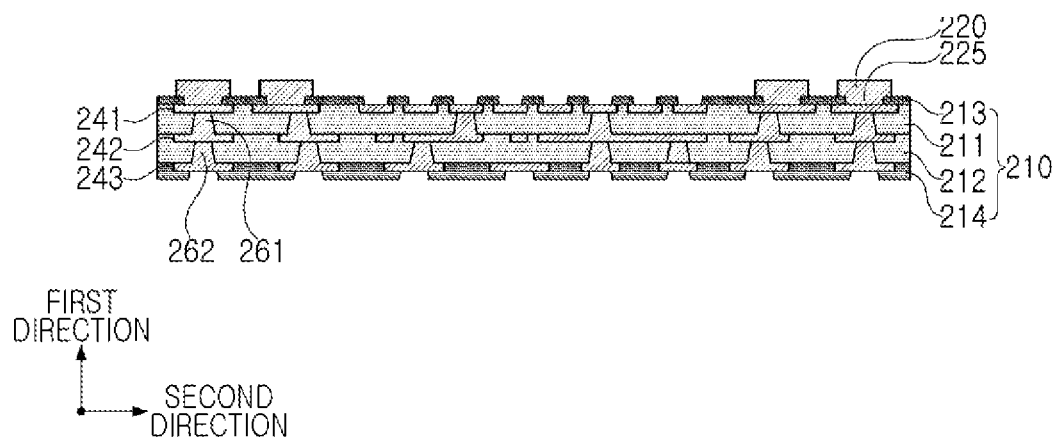

Referring to FIG. 43D, a plurality of bumps 220 and a plurality of bump vias 225 may be formed by filling the pattern holes through electrolytic plating (or electrical plating). Thereafter, the resist films 540 and 550 may be removed through treatment using a developer or the like. Thereafter, the seed layers s other than the plurality of bumps 220 and the plurality of bump vias 225 may be removed by etching.

Figure 43E:
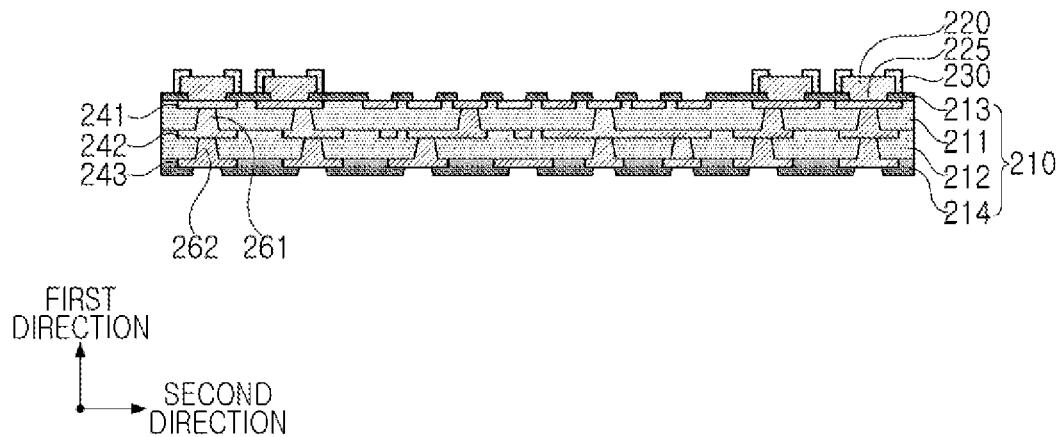

Referring to FIG. 43E, a plurality of insulating walls 230 surrounding the plurality of bumps 220 may be formed on the first resist layer 213. The plurality of insulating walls 230 may be formed by forming a solder resist layer and then patterning the solder resist layer using a photolithography process or the like.

Through a series of processes, the above-described printed circuit board 100W according to another exemplary embodiment may be manufactured. However, this is merely an example of a manufacturing method, and the above-described printed circuit board 100W according to another exemplary embodiment may be manufactured through different processes.

Concerning the other details, the details described above for the printed circuit boards 100A, 100B, 100C, 100D, 100E, 100F, 100G, 100H, 100I, 100J, 100K, 100L, 100M, 100N, 100O, 100P, 100Q, 100R, 100S, 100T, 100U, 100V, and 100W and the methods for manufacturing the printed circuit boards 100E, 100H, 100K, 100N, 100Q, and 100T may also be applicable to the method for manufacturing the printed circuit board 100W according to another exemplary embodiment unless contradictory, and the overlapping description will not be repeated.

Figure 44:
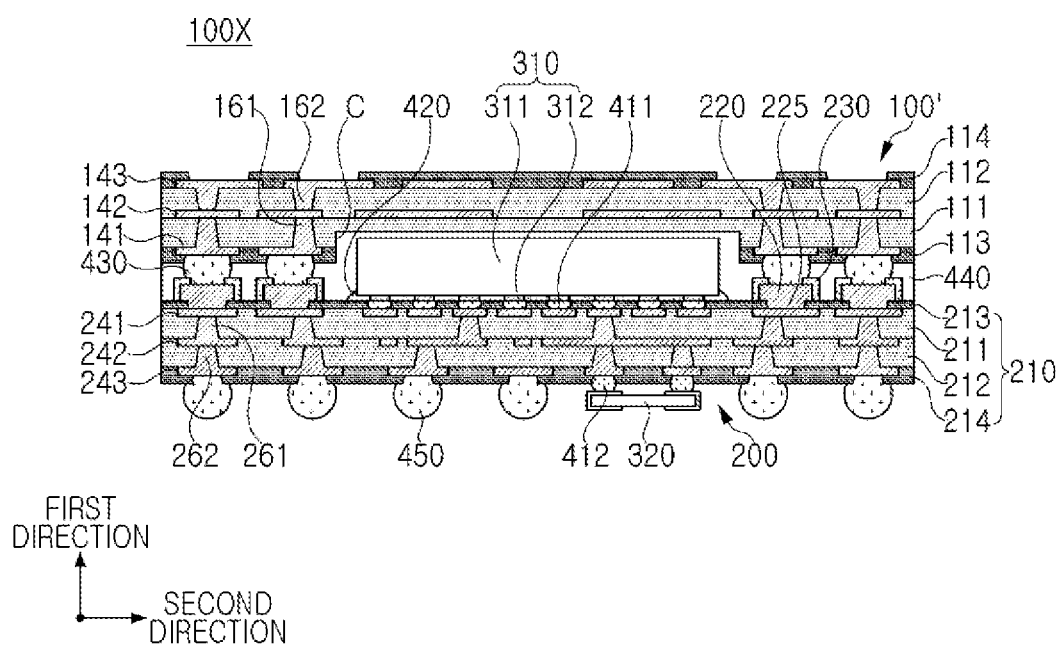
FIG. 44 is a schematic cross-sectional view illustrating a modified example of the printed circuit board of FIG. 41.

FIG. 44 is a schematic cross-sectional view illustrating a modified example of the printed circuit board of FIG. 41.

Referring to FIG. 44, a printed circuit board 100X according to a modified exemplary embodiment may have a package structure in which a wiring substrate 100' including a cavity C is disposed on the above-described printed circuit board 100W in a substrate-on-substrate form. Here, the above-described printed circuit board 100W may be used as a package substrate on which electronic components 310 and 320 are mounted. For example, the printed circuit board 100X according to a modified exemplary embodiment may further include a wiring substrate 100' including a plurality of insulating layers 111, 112, 113, and 114, a plurality of wiring layers 141, 142, and 143, and a plurality of via layers 161 and 162 and spaced apart from the insulating member 210 above the insulating member 210, a first electronic component 310 mounted on an upper side of the insulating member 210, a second electronic component 320 mounted on a lower side of the insulating member 210, a plurality of connection conductors 430 connecting the plurality of bumps 220, respectively, to the plurality of wiring layers 141, 142, and 143, a molding material 440 filling a space between the insulating member 210 and the wiring substrate 100' and embedding the first electronic component 310 and the plurality of connection conductors 430, and/or a plurality of electrical connection metals 450 disposed on the lower side of the insulating member 210 and connected to the first to third wiring layers 241 to 243.

Meanwhile, in the printed circuit board 100X to a modified exemplary embodiment, at least a portion of the first electronic component 310 may be disposed in the cavity C. In this case, it is possible to further increase a depth of the cavity C substantially as much as a height and/or a thickness of the plurality of bumps 220, thereby reducing an overall thickness of the package structure while suppressing warpage. In addition, the plurality of bumps 220 make it possible to reduce a distance between the substrates, thereby reducing a pitch of the plurality of connection conductors 430.

In addition, in the printed circuit board 100X according to a modified exemplary embodiment, since the plurality of bumps 220 are surrounded by the plurality of insulating walls 230, the plurality of connection conductors 430 can be easily attached to the plurality of bumps 220. Therefore, a package assembly process can be more easily performed.

In addition, in the printed circuit board 100X according to a modified exemplary embodiment, the plurality of insulating walls 230 may be spaced apart from each other on the insulating member 210, and a space between the plurality of insulating walls 230 may extend to the center region R1, and preferably further to an outer edge of the insulating member 210, thereby improving flowability when the molding material 440 is injected, even if a depth of the cavity C increases. Therefore, the molding material 440 can be effectively filled between the substrates.

Concerning the other details, the details described above for the printed circuit boards 100A, 100B, 100C, 100D, 100E, 100F, 100G, 100H, 100I, 100J, 100K, 100L, 100M, 100N, 100O, 100P, 100Q, 100R, 100S, 100T, 100U, 100V, and 100W, may also be applicable to the printed circuit board 100X according to a modified exemplary embodiment unless contradictory, and the overlapping description will not be repeated.

Figure 45:
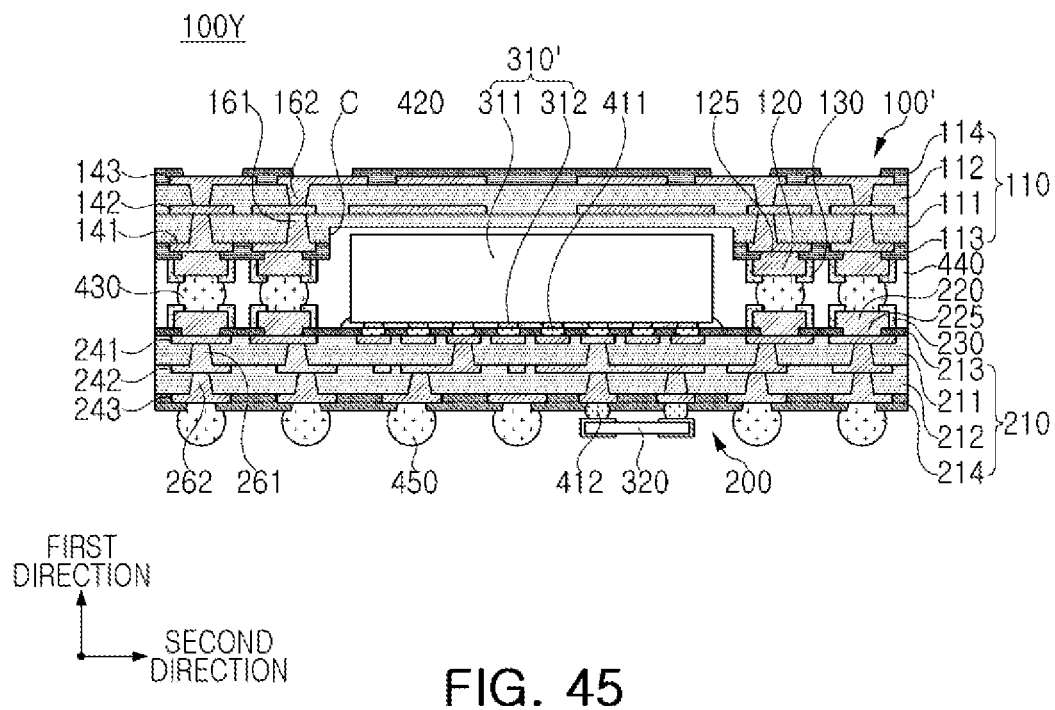
FIG. 45 is a schematic cross-sectional view illustrating another modified example of the printed circuit board of FIG. 41.

FIG. 45 is a schematic cross-sectional view illustrating another modified example of the printed circuit board of FIG. 41.

Referring to FIG. 45, a printed circuit board 100Y according to another modified exemplary embodiment may have a package structure in which a wiring substrate 100' including a cavity C is disposed on the above-described printed circuit board 100W in a substrate-on-substrate form. Here, the above-described printed circuit board 100W may be used as a package substrate on which electronic components 310' and 320 are mounted. For example, the printed circuit board 100Y according to another modified exemplary embodiment may further include a wiring substrate 100' including a plurality of insulating layers 111, 112, 113, and 114, a plurality of wiring layers 141, 142, and 143, a plurality of via layers 161 and 162, a plurality of bumps 120 disposed on the plurality of insulating layers 111, 112, 113, and 114 and connected to the plurality of wiring layers 141, 142, and 143, and a plurality of insulating walls 130 disposed on the plurality of insulating layers 111, 112, 113, and 114 and surrounding the plurality of bumps 120, respectively, and spaced apart from the insulating member 210 above the insulating member 210, a first electronic component 310' mounted on an upper side of the insulating member 210, a second electronic component 320 mounted on a lower side of the insulating member 210, a plurality of connection conductors 430 connecting the plurality of bumps 220 to the plurality of bumps 120 respectively, a molding material 440 filling a space between the insulating member 210 and the wiring substrate 100' and embedding the first electronic component 310' and the plurality of connection conductors 430, and/or a plurality of electrical connection metals 450 disposed on the lower side of the insulating member 210 and connected to the first to third wiring layers 241 to 243.

Meanwhile, the printed circuit board 100Y according to another modified exemplary embodiment is different from the above-described printed circuit board 100X according to a modified exemplary embodiment in that the wiring substrate 100' disposed in an upper portion of the printed circuit board 100Y may also include a plurality of bumps 120, a plurality of bump vias 125, and a plurality of insulating walls 130. Therefore, a depth of the cavity C can be substantially further increased, a pitch of the plurality of connection conductors 430 can be further reduced, and flowability can be further improved when the molding material 440 is injected. In addition, the plurality of insulating walls 130 may surround the plurality of bumps 120 in an SMD type. Therefore, the plurality of connection conductors 430 can be easily attached to the plurality of bumps 120, making a package assembly process easy.

In addition, in the printed circuit board 100Y according to another modified exemplary embodiment, each of the plurality of insulating walls 130 may surround each of the plurality of bumps 120 in a one-to-one manner. In this case, the plurality of insulating walls 130 may be disposed locally and independently from each other, thereby minimizing obstruction when the molding material 400 flows. Each of the plurality of bumps 120 and the plurality of insulating walls 130 may be disposed in a side region of the wiring substrate 100', and a space between the plurality of insulating walls 130 spaced apart from each other may extend to a center region, in which the cavity C is formed, of the wiring substrate 100', and preferably further to an outer edge of the wiring substrate 100'.

In addition, the printed circuit board 100Y according to another modified exemplary embodiment is different from the above-described printed circuit board 100X according to a modified exemplary embodiment in that the first electronic component 310' may be thicker than the first electronic component 310. The thickness may be determined based on the first direction. For example, a body 311' and/or connection terminals 312' of the first electronic component 310' may be thicker than a body 311 and/or connection terminals 312 of the first electronic component 310. However, even in this case, the plurality of bumps 120 and the plurality of bumps 220 make it possible to maintain a distance between the substrates at a similar level, thereby maintaining a pitch of the plurality of connection conductors 430 at a similar level.

Concerning the other details, the details described above for the printed circuit boards 100A, 100B, 100C, 100D, 100E, 100F, 100G, 100H, 100I, 100J, 100K, 100L, 100M, 100N, 100O, 100P, 100Q, 100R, 100S, 100T, 100U, 100V, 100W, and 100X, may also be applicable to the printed circuit board 100Y according to another modified exemplary embodiment unless contradictory, and the overlapping description will not be repeated.

Figure 46:
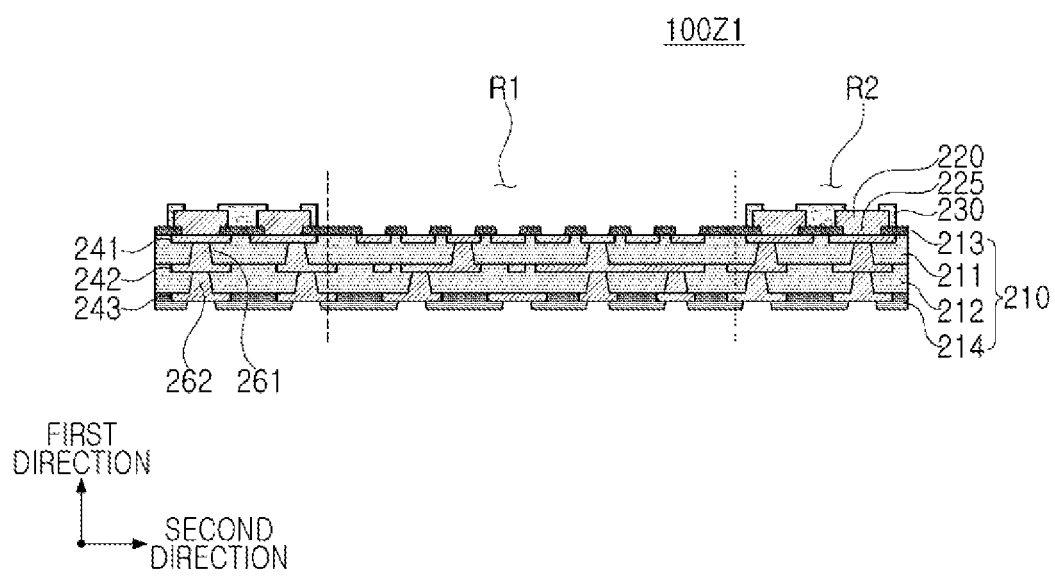
FIG. 46 is a schematic cross-sectional view illustrating another example of a printed circuit board.

FIG. 46 is a schematic cross-sectional view illustrating another example of a printed circuit board.

Figure 47:
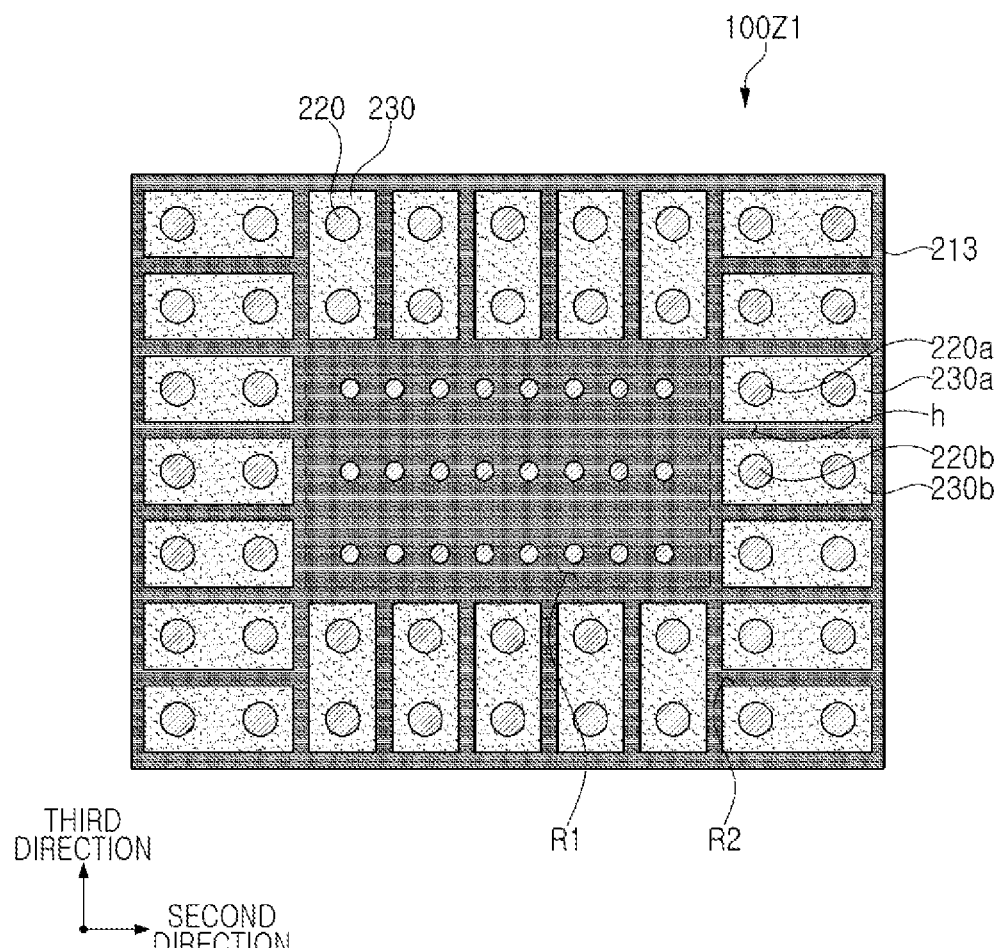
FIG. 47 is a schematic plan view of the printed circuit board of FIG. 46 when viewed from above.

FIG. 47 is a schematic plan view of the printed circuit board of FIG. 46 when viewed from above.

Referring to FIGS. 46 and 47, a printed circuit board 100Z1 according to another exemplary embodiment may include a first insulating layer 211, a first resist layer 213 disposed on an upper surface of the first insulating layer 211, a second insulating layer 212 disposed on a lower surface of the first insulating layer 211, a second resist layer 214 disposed on a lower surface of the second insulating layer 212, a plurality of bumps 220 disposed on an upper surface of the first resist layer 213, a plurality of insulating walls 230 disposed on the upper surface of the first resist layer 213 and surrounding the plurality of bumps 220, a first wiring layer 241 disposed on the upper surface of the first insulating layer 211 and at least partially covered by the first resist layer 213, a plurality of bump vias 225 penetrating through the first resist layer 213 and connecting the plurality of bumps 220 to the first wiring layer 241, a second wiring layer 242 disposed on the lower surface of the first insulating layer 211 and embedded in the second insulating layer 212 so that an upper surface of the second wiring layer 242 is exposed to an upper surface of the second insulating layer 212, a first via layer 261 penetrating through the first insulating layer 211 and connecting the first and second wiring layers 241 and 242 to each other, a third wiring layer 243 disposed on the lower surface of the second insulating layer 212 and at least partially covered by the second resist layer 214, and a second via layer 262 penetrating through the second insulating layer 212 and connecting the second and third wiring layers 242 and 243 to each other. An insulating member 210 may include the first and second insulating layers 211 and 212 and the first and second resist layers 213 and 214. The printed circuit board 100Z1 according to another exemplary embodiment may be used as a package substrate on which electronic components are mounted, but is not limited thereto.

Meanwhile, in the printed circuit board 100Z1 according to another exemplary embodiment, each of the plurality of insulating walls 230 may surround at least two of the plurality of bumps 220. For example, one first insulating wall 230a may surround a plurality of first bumps 220a, and one second insulating wall 230b may surround a plurality of second bumps 220b. For example, in the plan view, each of the first insulating wall 230a and the second insulating wall 230b may have a substantially rectangular shape. More specifically, each of the first insulating wall 230a and the second insulating wall 230b may have a substantially rectangular block shape, but is not limited thereto. In the plan view, each space h between the plurality of insulating walls 230 may have a trench shape in a direction toward a center region R1 from an outer edge of the insulating member 210.

A side region R2 may include a space that extends continuously from the outer edge of the insulating member 210 to the center region R1 without being blocked by the plurality of insulating walls 230, e.g., the first and second insulating walls 230a and 230b, and the continuously extending space of the side region R2 may include a space between the plurality of insulating walls 230 spaced apart from each other, e.g., the space h between the first and second insulating walls 230a and 230b. Therefore, it is possible to minimize obstruction when a molding material flows later.

In addition, in the printed circuit board 100Z1 according to another exemplary embodiment, for example, each of the plurality of insulating walls 230 may surround side surfaces of at least two of the plurality of bumps 220 and at least partially cover upper surfaces of the at least two of the plurality of bumps 220. Accordingly, in the cross-sectional view, an upper surface of each of the plurality of insulating walls 230 may be further spaced apart from an upper surface of the insulating member 210 than the upper surface of each of the plurality of bumps 220. For example, the plurality of bumps 220 may be surrounded in an SMD type. Therefore, connection conductors can be easily attached to the plurality of bumps 220, and a package assembly process can be easily performed.

Concerning the other details, the details described above for the printed circuit boards 100A, 100B, 100C, 100D, 100E, 100F, 100G, 100H, 100I, 100J, 100K, 100L, 100M, 100N, 100O, 100P, 100Q, 100R, 100S, 100T, 100U, 100V, 100W, 100X, and 100Y may also be applicable to the printed circuit board 100Z1 according to another exemplary embodiment unless contradictory, and the overlapping description will not be repeated.

FIGS. 48A through 48E are schematic views illustrating examples of processes for manufacturing the printed circuit board of FIG. 46.

Figure 48A:
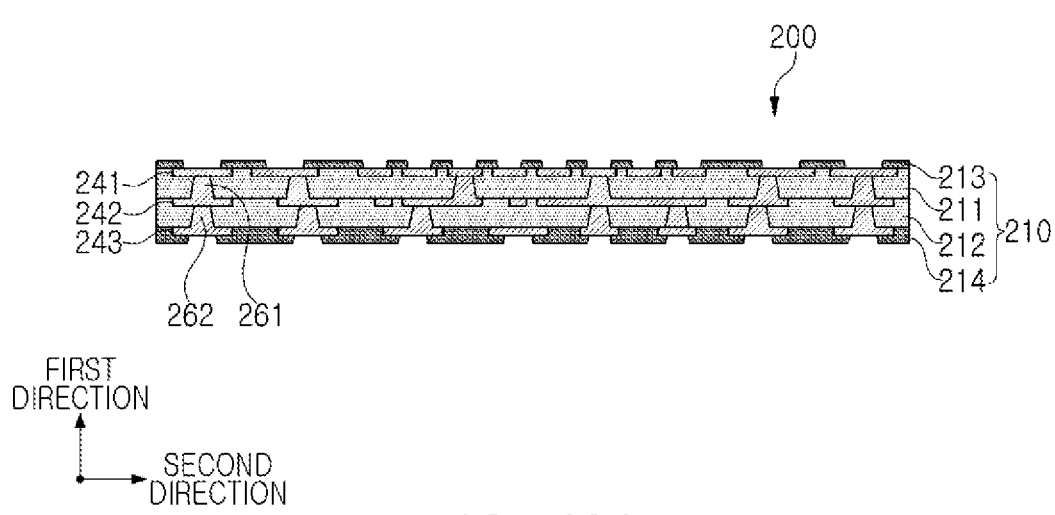
FIGS. 48A through 48E are schematic views illustrating examples of processes for manufacturing the printed circuit board of FIG. 46.

Referring to FIG. 48A, a wiring substrate 200 may be prepared.

Figure 48B:
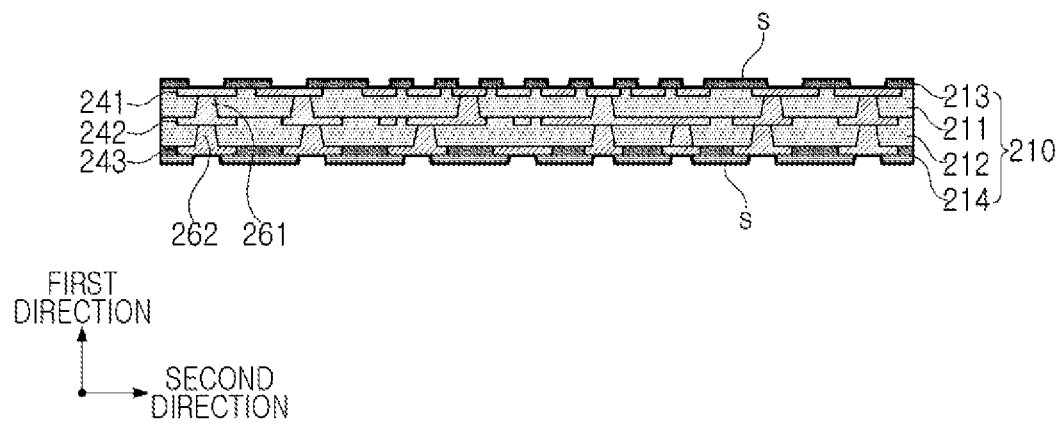

Referring to FIG. 48B, seed layers s may be formed on both sides of the wiring substrate 200.

Figure 48C:
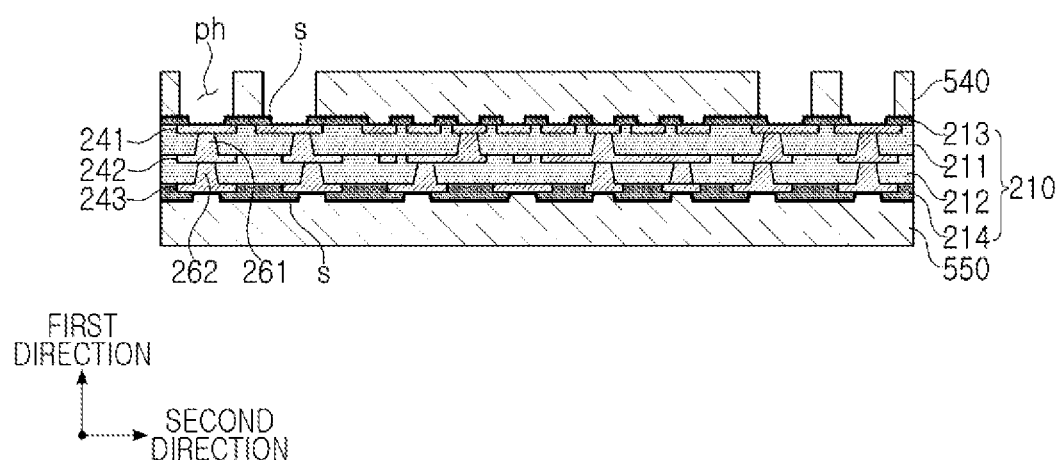

Referring to FIG. 48C, resist films 540 and 550 may be formed on the seed layers. In addition, pattern holes ph may be formed in the upper resist film 540.

Figure 48D:
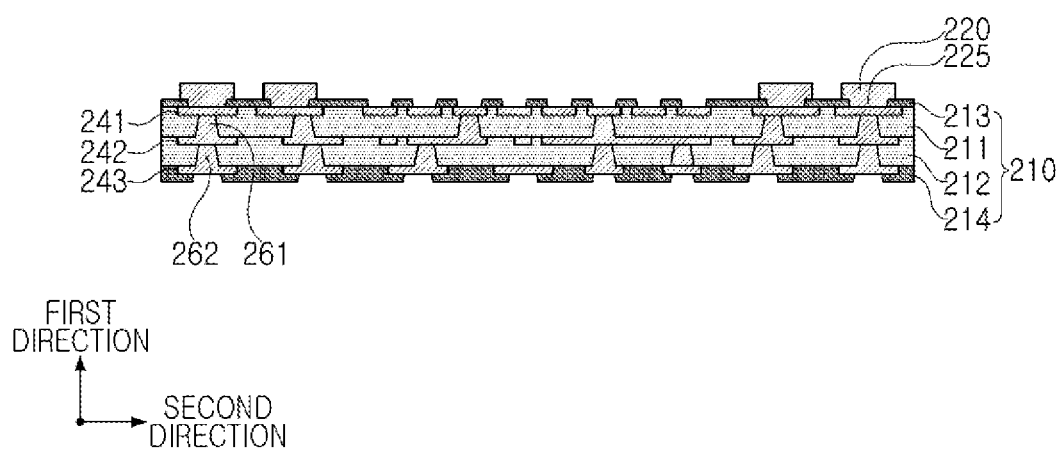

Referring to FIG. 48D, a plurality of bumps 220 and a plurality of bump vias 225 may be formed. Thereafter, the resist films 540 and 550 may be removed. Thereafter, the seed layers s other than the plurality of bumps 220 and the plurality of bump vias 225 may be removed by etching.

Figure 48E:
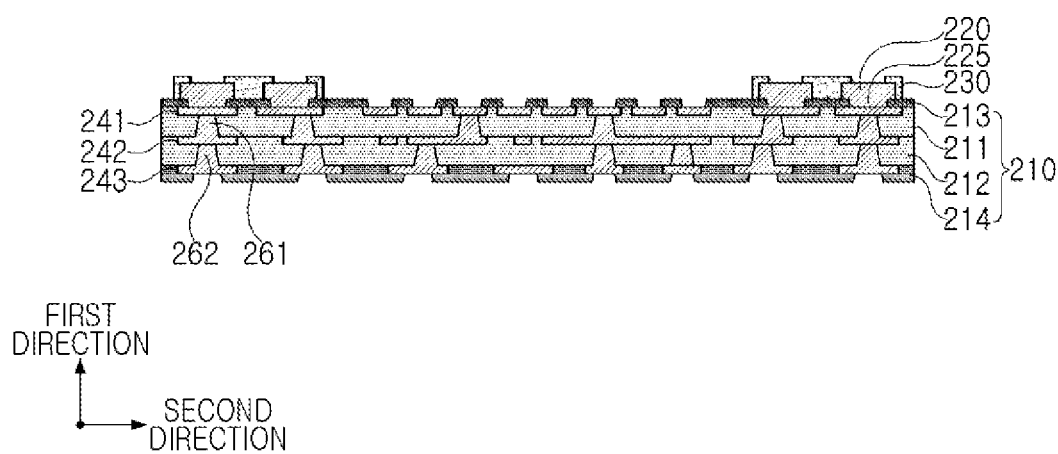

Referring to FIG. 48E, a plurality of insulating walls 230 surrounding the plurality of bumps 220 may be formed on the first resist layer 213. The plurality of insulating walls 230 may be formed by forming a solder resist layer and then patterning the solder resist layer in a trench shape using a photolithography process or the like.

Through a series of processes, the above-described printed circuit board 100Z1 according to another exemplary embodiment may be manufactured. However, this is merely an example of a manufacturing method, and the above-described printed circuit board 100Z1 according to another exemplary embodiment may be manufactured through different processes.

Concerning the other details, the details described above for the printed circuit boards 100A, 100B, 100C, 100D, 100E, 100F, 100G, 100H, 100I, 100J, 100K, 100L, 100M, 100N, 100O, 100P, 100Q, 100R, 100S, 100T, 100U, 100V, 100W, 100X, 100Y, and 100Z1 and the methods for manufacturing the printed circuit boards 100E, 100H, 100K, 100N, 100Q, 100T, and 100W may also be applicable to the method for manufacturing the printed circuit board 100W according to another exemplary embodiment unless contradictory, and the overlapping description will not be repeated.

Figure 49:
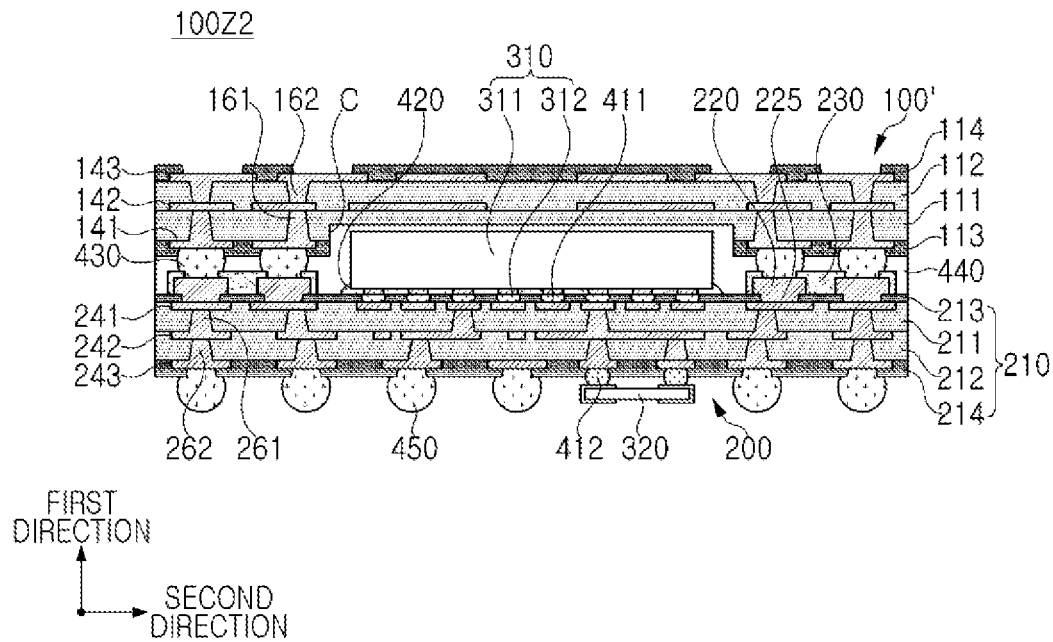
FIG. 49 is a schematic cross-sectional view illustrating a modified example of the printed circuit board of FIG. 46.

FIG. 49 is a schematic cross-sectional view illustrating a modified example of the printed circuit board of FIG. 46.

Figure 50:
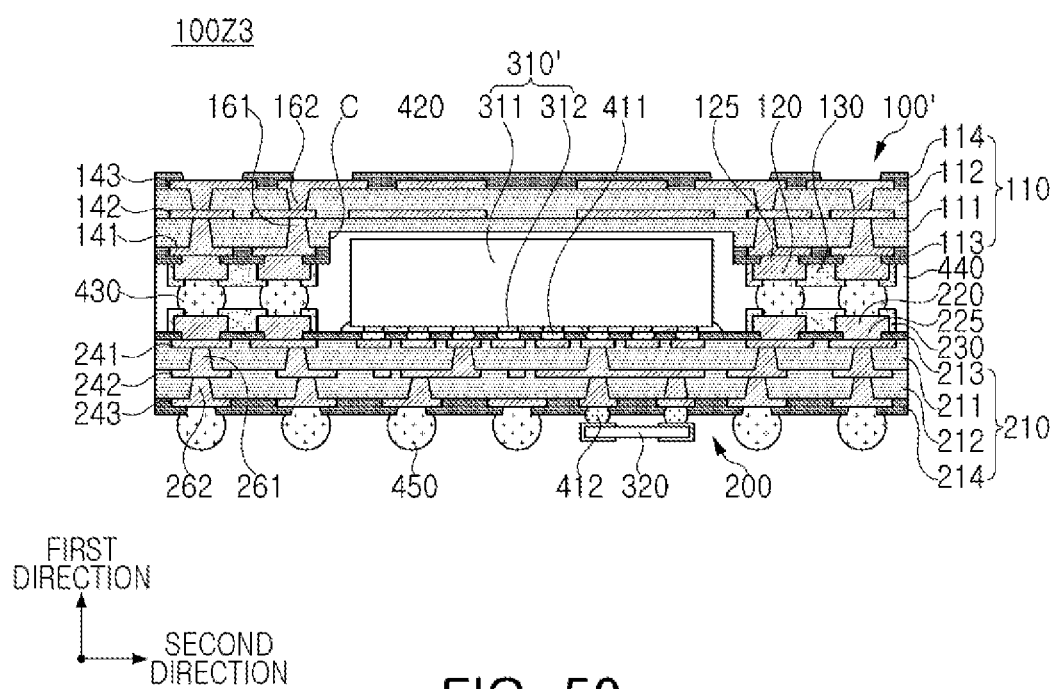
FIG. 50 is a schematic cross-sectional view illustrating another modified example of the printed circuit board of FIG. 46.

FIG. 50 is a schematic cross-sectional view illustrating another modified example of the printed circuit board of FIG. 46.

Referring to FIGS. 49 and 50, each of printed circuit boards 100Z2 and 100Z3 according to modified exemplary embodiments may have a package structure in which a wiring substrate 100' including a cavity C is disposed on the above-described printed circuit board 100Z1 in a substrate-on-substrate form. Here, the above-described printed circuit board 100Z1 may be used as a package substrate on which electronic components 310 or 310' and 320 are mounted. For example, each of the printed circuit boards 100Z2 and 100Z3 according to modified exemplary embodiments may further include a wiring substrate 100' including a plurality of insulating layers 111, 112, 113, and 114, a plurality of wiring layers 141, 142, and 143, and a plurality of via layers 161 and 162 and spaced apart from the insulating member 210 above the insulating member 210, a first electronic component 310 or 310' mounted on an upper side of the insulating member 210, a second electronic component 320 mounted on a lower side of the insulating member 210, a plurality of connection conductors 430 connecting the plurality of bumps 220 to the plurality of wiring layers 141, 142, and 143 or the plurality of bumps 120, a molding material 440 filling a space between the insulating member 210 and the wiring substrate 100' and embedding the first electronic component 310 or 310' and the plurality of connection conductors 430, and/or a plurality of electrical connection metals 450 disposed on the lower side of the insulating member 210 and connected to the first to third wiring layers 241 to 243.

Meanwhile, in addition, each of the printed circuit board 100Z3 according to another modified exemplary embodiment, each of the plurality of insulating walls 130 may surround at least two of the plurality of bumps 120. In the plan view, each space between the plurality of insulating walls 130 spaced apart from each other may have a trench shape in a direction toward the cavity C from an outer edge of the wiring substrate 110'. Therefore, it is possible to minimize obstruction when the molding material 440 flows. Each of the plurality of bumps 120 and the plurality of insulating walls 130 may be disposed in a side region of the wiring substrate 100', and in this case, a space between the plurality of insulating walls 130 spaced apart from each other may extend to a center region, in which the cavity C is formed, of the wiring substrate 100', and preferably further to the outer edge of the wiring substrate 100'.

Concerning the other details, the details described above for the printed circuit boards 100A, 100B, 100C, 100D, 100E, 100F, 100G, 100H, 100I, 100J, 100K, 100L, 100M, 100N, 100O, 100P, 100Q, 100R, 100S, 100T, 100U, 100V, 100W, 100X, 100Y, and 100Z1 may also be applicable to the printed circuit boards 100Z2 and 100Z3 according to modified exemplary embodiments unless contradictory, and the overlapping description will not be repeated.

As set forth above, as one effect of the present disclosure, it is possible to provide a printed circuit board for increasing a depth of a cavity to reduce a pitch of connection conductors between substrates.

As another effect of the present disclosure, it is possible to provide a printed circuit board for maintaining a pitch of connection conductors even when a thickness of a mounted electronic component increases.

As another effect of the present disclosure, it is possible to provide a printed circuit board for reducing a risk of warpage even though a depth of a cavity increases.

As another effect of the present disclosure, it is possible to provide a printed circuit board for improving flowability when a molding material is injected between substrates.

While exemplary embodiments have been shown and described above, it will be apparent to those skilled in the art that modifications and variations could be made without departing from the scope of the present invention as defined by the appended claims.

What is claimed is:

1. A printed circuit board comprising:
an insulating member including a cavity;
a first bump disposed on the insulating member;
a second bump disposed adjacently to but spaced apart from the first bump on the insulating member;
a first insulating wall covering at least a portion of the first bump; and
a second insulating wall covering at least a portion of the second bump and disposed adjacently to but spaced apart from the first insulating wall,
wherein the printed circuit board includes a center region in which the cavity of the insulating member is disposed and a side region surrounding the center region in plan view, and the first and second bumps and the first and second insulating walls are disposed in the side region.

2. The printed circuit board of claim 1, wherein the side region includes a space that extends continuously from an outer edge of the insulating member to a wall surface of the cavity, and the continuously extending space of the side region includes a space between the first and second insulating walls spaced apart from each other.

3. The printed circuit board of claim 1, wherein the first insulating wall surrounds only one first bump, and
the second insulating wall surrounds only one second bump.

4. The printed circuit board of claim 3, wherein each of the first and second insulating walls has a substantially circular ring shape in the plan view.

5. The printed circuit board of claim 1, wherein the first insulating wall surrounds a plurality of first bumps, and
the second insulating wall surrounds a plurality of second bumps.

6. The printed circuit board of claim 5, wherein each of the first and second insulating walls has a substantially rectangular block shape in the plan view.

7. The printed circuit board of claim 1, wherein the first insulating wall surrounds a side surface of the first bump, and covers at least a portion of one surface connected in a direction substantially perpendicular to the side surface of the first bump, and
the second insulating wall surrounds a side surface of the second bump, and covers at least a portion of one surface connected in a direction substantially perpendicular to the side surface of the second bump.

8. The printed circuit board of claim 7, wherein one surface of each of the first and second insulating walls is further spaced apart from one surface of the insulating member than the one surface of each of the first and second bumps in a cross-sectional view.

9. The printed circuit board of claim 1, wherein the insulating member includes a first insulating layer, a resist layer disposed on one surface of the first insulating layer, and a second insulating layer disposed on the other surface of the first insulating layer,
  each of the first and second bumps and the first and second insulating walls is disposed on one surface of the resist layer,
  the cavity penetrates through the resist layer, and
  the cavity further penetrates through at least a portion of the first insulating layer.

10. The printed circuit board of claim 9, further comprising:
  a first wiring layer disposed on the one surface of the first insulating layer and at least partially covered by the resist layer;
  a first bump via penetrating through the resist layer and connecting the first bump to one surface of the first wiring layer; and
  a second bump via penetrating through the resist layer and connecting the second bump to the one surface of the first wiring layer.

11. The printed circuit board of claim 10, further comprising:
  a second wiring layer disposed on the other surface of the first insulating layer and embedded in the second insulating layer so that one surface of the second wiring layer is exposed to one surface of the second insulating layer;
  a first via layer penetrating through the first insulating layer and connecting the first and second wiring layers to each other;
  a third wiring layer disposed on the other surface of the second insulating layer; and
  a second via layer penetrating through the second insulating layer and connecting the second and third wiring layers to each other.

12. The printed circuit board of claim 11, further comprising a conductive pattern layer embedded in the first insulating layer, with one surface of the conductive pattern layer contacting the other surface of the first wiring layer,
  wherein the first via layer connects the conductive pattern layer and the second wiring layer to each other, and
  the other surface of the conductive pattern layer is positioned on substantially the same level as a bottom surface of the cavity in a cross-sectional view.

13. The printed circuit board of claim 12, wherein the conductive pattern layer is thicker than each of the first to third wiring layers.

14. The printed circuit board of claim 9, further comprising:
  a first wiring layer embedded in the first insulating layer, with one surface of the first wiring layer exposed to the one surface of the first insulating layer;
  a first bump via penetrating through the resist layer and connecting the first bump to the one surface of the first wiring layer; and
  a second bump via penetrating through the resist layer and connecting the second bump to the one surface of the first wiring layer.

15. The printed circuit board of claim 14, wherein the other surface of the first wiring layer is positioned on substantially the same level as a bottom surface of the cavity in a cross-sectional view.

16. The printed circuit board of claim 14, further comprising:
  a second wiring layer disposed on the other surface of the first insulating layer and embedded in the second insulating layer so that one surface of the second wiring layer is exposed to one surface of the second insulating layer;
  a first via layer penetrating through the first insulating layer and connecting the first and second wiring layers to each other;
  a third wiring layer disposed on the other surface of the second insulating layer; and
  a second via layer penetrating through the second insulating layer and connecting the second and third wiring layers to each other.

17. The printed circuit board of claim 16, wherein the first wiring layer is thicker than each of the second and third wiring layers.

18. The printed circuit board of claim 1, further comprising:
  a wiring substrate spaced apart from the insulating member above the insulating member, and including a plurality of insulating layers, a plurality of wiring layers, and a plurality of via layers;
  a first electronic component mounted on one side of the wiring substrate adjacent to the insulating member;
  a first connection conductor connecting the first bump to the plurality of wiring layers;
  a second connection conductor connecting the second bump to the plurality of wiring layers; and
  a molding material disposed in a space between the insulating member and the wiring substrate and embedding the first electronic component and the first and second connection conductors,
  wherein at least a portion of the first electronic component is disposed in the cavity.

19. The printed circuit board of claim 18, further comprising:
  a plurality of electrical connection metals disposed on the other side of the wiring substrate and connected to the plurality of wiring layers; and
  a second electronic component mounted on the other side of the wiring substrate.

20. The printed circuit board of claim 19, wherein the first electronic component includes a semiconductor chip, and
  the second electronic component includes a passive component.

21. The printed circuit board of claim 1, further comprising:
  a wiring substrate spaced apart from the insulating member above the insulating member, and including a plurality of insulating layers, a plurality of wiring layers, a plurality of via layers, third and fourth bumps spaced apart from each other on the plurality of insulating layers and connected to each of the plurality of wiring layers, and third and fourth insulating walls spaced apart from each other on the plurality of insulating layers and at least partially covering the third and fourth bumps, respectively;
  an electronic component disposed on one side of the wiring substrate adjacent to the insulating member;
  a first connection conductor connecting the first bump to the third bump;
  a second connection conductor connecting the second bump to the fourth bump; and
  a molding material disposed in a space between the insulating member and the wiring substrate and embedding the electronic component and the first and second connection conductors,
  wherein at least a portion of the electronic component is disposed in the cavity, and a space between the third and fourth insulating walls spaced apart from each other extends to a region in which the electronic component is disposed on the wiring substrate.

22. The printed circuit board of claim 21, wherein the space between the third and fourth insulating walls spaced apart from each other further extends to an outer edge of the wiring substrate.

23. The printed circuit board of claim 22, wherein the wiring substrate includes a center region in which the electronic component is disposed and a side region surrounding the center region of the wiring substrate in the plan view, and
the third and fourth bumps and the third and fourth insulating walls are disposed in the side region of the wiring substrate.

24. A printed circuit board comprising:
an insulating member;
a plurality of bumps spaced apart from each other on the insulating member;
a plurality of insulating walls spaced apart from each other on the insulating member;
an electronic component disposed in a center region of the insulating member;
a wiring substrate including a plurality of insulating layers, a plurality of wiring layers, and a plurality of via layers, including a cavity, and being spaced apart from the insulating member above the insulating member;
a plurality of connection conductors connecting the plurality of bumps to the plurality of wiring layers, respectively; and
a molding material disposed in a space between the insulating member and the wiring substrate and embedding the electronic component and the plurality of connection conductors,
wherein each of the plurality of insulating walls surrounds each of the plurality of bumps in a one-to-one manner,
wherein the plurality of bumps and the plurality of insulating walls are disposed in a side region surrounding the center region of the insulating member in plan view, and
wherein at least a portion of the electronic component is disposed in the cavity.

25. A printed circuit board comprising:
an insulating member;
a plurality of bumps spaced apart from each other on the insulating member; and
a plurality of insulating walls spaced apart from each other on the insulating member,
wherein each of the plurality of insulating walls surrounds at least two of the plurality of bumps,
wherein the plurality of bumps and the plurality of insulating walls are disposed in a side region surrounding a center region of the insulating member in plan view, and
wherein each space between the plurality of insulating walls spaced apart from each other has a trench shape in a direction toward the center region from an outer edge of the insulating member in the plan view.

26. The printed circuit board of claim 25, further comprising:
an electronic component disposed on the center region of the insulating member;
a wiring substrate including a plurality of insulating layers, a plurality of wiring layers, and a plurality of via layers, including a cavity, and spaced apart from the insulating member above the insulating member;
a plurality of connection conductors connecting the plurality of bumps to the plurality of wiring layers; and
a molding material disposed in a space between the insulating member and the wiring substrate and embedding the electronic component and the plurality of connection conductors,
wherein at least a portion of the electronic component is disposed in the cavity.

27. A printed circuit board comprising:
an insulating member;
a plurality of first insulating wall protruding from the insulating member and spaced apart from each other, a space provided between adjacent two of the plurality of first insulating walls and extending from an outer edge of the insulating member towards an inner portion of the insulating member;
one or more first bumps disposed in one or more of the plurality of first insulating walls;
an electronic component disposed on the inner portion of the insulating member; and
a molding material covering at least a portion of the electronic component and disposed in the space provided between the adjacent two of the plurality of first insulating walls.

28. The printed circuit board of claim 27, further comprising:
a wiring substrate spaced apart from the insulating member above the insulating member, and including a plurality of insulating layers, a plurality of wiring layers, and a plurality of via layers,
wherein the electronic component is disposed between the insulating member and the wiring substrate,
the plurality of first insulating walls are disposed between the insulating member and the wiring substrate, and
the molding material is disposed between the insulating member and the wiring substrate.

29. The printed circuit board of claim 28, further comprising a connection conductor connecting the one or more first bumps to one of the plurality of wiring layers,
wherein the connection conductor is surrounded by the molding material.

30. The printed circuit board of claim 28, wherein at least one of the insulating member and the plurality of insulating layers includes a cavity, and
wherein the electronic component is disposed partially in the cavity.

31. The printed circuit board of claim 28, wherein the wiring substrate further includes:
a plurality of second insulating wall protruding from one of the plurality of insulating layers and spaced apart from each other, a space provided between adjacent two of the plurality of second insulating walls and extending from an outer edge of the one of the plurality of insulating layers towards an inner portion of the one of the plurality of insulating layers;
one or more second bumps disposed in one or more of the plurality of second insulating walls; and
a connection conductor connecting the one or more first bumps to the one or more second bumps.

32. The printed circuit board of claim 31, wherein the molding material is disposed in the space provided between the adjacent two of the plurality of second insulating walls, and surrounds the connection conductor.

33. A method for manufacturing a printed circuit board, the method comprising:
forming a plurality of bumps on an insulating member;

forming a plurality of insulating walls spaced apart from each other on the insulating member, one or more of the plurality of bumps being surrounded by a respective one of the plurality of insulating walls; and forming a cavity in an inner portion of the insulating member surrounded by the plurality of insulating walls.

34. The method of claim 33, further comprising:

mounting an electronic component in the cavity;

mounting a wiring substrate to cover the electronic component such that the electronic component is disposed between the wiring substrate and the insulating member and the plurality of insulating walls are disposed between the wiring substrate and the insulating member; and injecting a molding material between the wiring substrate and the insulating member.

35. The method of claim 34, wherein the molding material is configured to flow through the between the wiring substrate and the insulating member and through a space between adjacent two of the plurality of insulating walls.

* * * * *